US012738286B2

(12) United States Patent
Ghido et al.

(10) Patent No.: US 12,738,286 B2
(45) **Date of Patent: *Sep. 15, 2026**

(54) POST-PROCESSOR, PRE-PROCESSOR, AUDIO ENCODER, AUDIO DECODER AND RELATED METHODS FOR ENHANCING TRANSIENT PROCESSING

(71) Applicant: Fraunhofer-Gesellschaft zur Förderung der angewandten Forschung e.V., Munich (DE)

(72) Inventors: Florin Ghido, Nuremberg (DE); Sascha Disch, Fürth (DE); Jürgen Herre, Erlangen (DE); Alexander Adami, Gundelsheim (DE); Franz Reutelhuber, Erlangen (DE)

(73) Assignee: Fraunhofer-Gesellschaft zur Förderung der angewandten Forschung e.V. (DE)

(*) Notice: Subject to any disclaimer, the term of this patent is extended or adjusted under 35 U.S.C. 154(b) by 0 days.

This patent is subject to a terminal disclaimer.

(21) Appl. No.: 16/892,648

(22) Filed: Jun. 4, 2020

(65) Prior Publication Data

US 2020/0402520 A1 Dec. 24, 2020

Related U.S. Application Data

(60) Continuation of application No. 16/688,938, filed on Nov. 19, 2019, now Pat. No. 11,094,331, which is a (Continued)

(30) Foreign Application Priority Data

Feb. 17, 2016 (EP) .................................... 16156200

(51) Int. Cl.
*G10L 19/032* (2013.01)
*G10L 19/008* (2013.01)
(Continued)

(52) U.S. Cl.
CPC .......... *G10L 19/032* (2013.01); *G10L 19/008* (2013.01); *G10L 19/26* (2013.01); *H03G 5/005* (2013.01); *H03G 5/165* (2013.01)

(58) Field of Classification Search
CPC ........... H03G 5/005; H03G 5/165; H03G 3/00
See application file for complete search history.

(56) References Cited

U.S. PATENT DOCUMENTS 4,292,467 A 9/1981 Odlen et al.
5,222,189 A 6/1993 Fielder
(Continued)

FOREIGN PATENT DOCUMENTS

CN 1275234 A 11/2000
CN 1992533 A 7/2007
(Continued)

OTHER PUBLICATIONS

Office Action dated Sep. 23, 2021 issued in the parallel Chinese patent application No. 201780002163.5 (7 pages).
(Continued)

*Primary Examiner* — Jesse S Pullias
(74) *Attorney, Agent, or Firm* — Haynes and Boone, LLP

(57) ABSTRACT

An audio post-processor for post-processing an audio signal having a time-variable high frequency gain information as side information includes: a band extractor for extracting a high frequency band of the audio signal and a low frequency band of the audio signal; a high band processor for performing a time-variable modification of the high frequency band in accordance with the time-variable high frequency gain information to obtain a processed high frequency band; and a combiner for combining the processed high frequency band and the low frequency band. Furthermore, a pre-processor is illustrated.

9 Claims, 30 Drawing Sheets

Related U.S. Application Data division of application No. 15/884,190, filed on Jan. 30, 2018, now Pat. No. 10,720,170, which is a continuation of application No. PCT/EP2017/053068, filed on Feb. 10, 2017.

(51) Int. Cl.

| | |
|---|---|
| ***G10L 19/26*** | (2013.01) |
| ***H03G 5/00*** | (2006.01) |
| ***H03G 5/16*** | (2006.01) |

(56) References Cited

U.S. PATENT DOCUMENTS

| | | | | |
|---|---|---|---|---|
| 5,978,762 | A * | 11/1999 | Smyth | G10L 19/0208 704/229 |
| 6,014,621 | A | 1/2000 | Chen | |
| 7,072,477 | B1 * | 7/2006 | Kincaid | G06Q 99/00 381/104 |
| 7,272,556 | B1 * | 9/2007 | Aguilar | G10L 19/002 704/226 |
| 7,707,034 | B2 | 4/2010 | Sun et al. | |
| 7,720,230 | B2 | 5/2010 | Allamanche et al. | |
| 7,974,713 | B2 | 7/2011 | Disch et al. | |
| 7,983,424 | B2 | 7/2011 | Kjorling et al. | |
| 8,116,459 | B2 | 2/2012 | Disch et al. | |
| 8,140,331 | B2 | 3/2012 | Lou | |
| 8,204,261 | B2 | 6/2012 | Allamanche et al. | |
| 8,532,998 | B2 * | 9/2013 | Gao | G10L 21/038 704/502 |
| 8,942,988 | B2 * | 1/2015 | Gao | G10L 19/0204 704/500 |
| 9,026,452 | B2 * | 5/2015 | Koishida | G10L 19/03 704/500 |
| 9,812,136 | B2 * | 11/2017 | Kjoerling | G10L 19/04 |
| 10,720,170 | B2 * | 7/2020 | Ghido | G10L 19/26 |
| 2005/0254719 | A1 | 11/2005 | Sullivan | |
| 2007/0150267 | A1 | 6/2007 | Honma et al. | |
| 2007/0253563 | A1 | 11/2007 | Oxford et al. | |
| 2008/0147415 | A1 | 6/2008 | Schnell et al. | |
| 2008/0154615 | A1 | 6/2008 | Oomen et al. | |
| 2008/0300866 | A1 | 12/2008 | Mukhtar et al. | |
| 2009/0103752 | A1 * | 4/2009 | Chou | H04R 25/70 381/107 |
| 2009/0313029 | A1 * | 12/2009 | Luo | G10L 19/008 704/E21.001 |
| 2010/0262427 | A1 | 10/2010 | Chivukula et al. | |
| 2011/0202353 | A1 | 8/2011 | Neuendorf et al. | |
| 2011/0257979 | A1 | 10/2011 | Gao | |
| 2011/0257980 | A1 * | 10/2011 | Gao | G10L 19/0208 704/500 |
| 2011/0257984 | A1 | 10/2011 | Virette et al. | |
| 2011/0295598 | A1 | 12/2011 | Yang et al. | |
| 2012/0016667 | A1 | 1/2012 | Gao | |
| 2013/0275142 | A1 | 10/2013 | Hatanaka et al. | |
| 2014/0229170 | A1 | 8/2014 | Atti et al. | |
| 2015/0088527 | A1 | 3/2015 | Naslund et al. | |
| 2015/0215700 | A1 | 7/2015 | Sun et al. | |
| 2015/0279379 | A1 | 10/2015 | Truman et al. | |
| 2016/0019898 | A1 | 1/2016 | Schreiner et al. | |
| 2016/0019908 | A1 * | 1/2016 | Hedelin | H04B 1/66 704/500 |

FOREIGN PATENT DOCUMENTS

| | | | |
|---|---|---|---|
| CN | 101485094 | A | 7/2009 |
| CN | 102257728 | A | 11/2011 |
| CN | 102985970 | A | 3/2013 |
| CN | 103210443 | A | 7/2013 |
| CN | 103366751 | A | 10/2013 |
| CN | 104269173 | A | 1/2015 |
| CN | 104517610 | A | 4/2015 |
| CN | 105122358 | A | 12/2015 |
| EP | 2116997 | A1 | 11/2009 |
| EP | 2352225 | A1 | 8/2011 |
| GB | 2293733 | A | 4/1996 |
| JP | 2000-132193 | A | 5/2000 |
| JP | 2008-536169 | A | 9/2008 |
| JP | WO 2008-108082 | A1 | 6/2010 |
| JP | 2013512468 | A | 4/2013 |
| JP | 6603414 | B2 | 10/2019 |
| KR | 2007 0068270 | A | 6/2007 |
| WO | WO2009056027 | A1 | 5/2009 |
| WO | WO 2011-134415 | A1 | 3/2011 |
| WO | WO 2012/111767 | A1 | 8/2012 |
| WO | WO2014111290 | A1 | 7/2014 |
| WO | WO2014161996 | A2 | 10/2014 |
| WO | WO 2015/077665 | A1 | 5/2015 |
| WO | WO2015118260 | A1 | 8/2015 |

OTHER PUBLICATIONS

Yong-tao Sha et al., High Frequency Reconstruction of Audio Signal Based on Chaotic Prediction Theory, Acoustics, Speech, and Signal Processing, 1988. ICASSP-88., 1988 International Conference on Apr. 2010.

Office Action dated Nov. 6, 2020 issued in related U.S. Appl. No. 16/688,938 (20 pages).

Office Action in the parallel Korean patent application No. 10-2017-7036732 dated Feb. 12, 2019 (18 pages).

Office Action dated Sep. 2, 2020 issued in the parallel Chinese patent application No. 201780002163.5.

Office Action dated May 29, 2020 in the parallel Indian patent application No. 201747038260 (5 pages).

Office Action dated Feb. 2, 2021 issued in the parallel Japanese patent application No. 2019-186928 (8 pages).

M. Bosi, K. Brandenburg, S. Quackenbush, L. Fielder, K. Akagiri, H. Fuchs, M. Dietz, J. Herre, G. Davidson, Oikawa: "MPEG-2 Advanced Audio Coding", 101st AES Convention, Los Angeles 1996.

K. Brandenburg: "OCF—A New Coding Algorithm for High Quality Sound Signals", Proc. IEEE ICASSP, 1987.

J. D. Johnston, K. Brandenburg: "Wideband Coding Perceptual Considerations for Speech and Music", in S. Furui and M. M. Sondhi, editors: "Advances in Speech Signal Processing", Marcel Dekker, New York, 1992.

B. Edler: "Codierung von Audiosignalen mit überlappender Transformation und adaptiven Fensterfunktionen", Frequenz, vol. 43, pp. 252-256, 1989 (English abstract attached).

J. Herre, J. D. Johnston: "Enhancing the Performance of Perceptual Audio Coders by Using Temporal Noise Shaping (TNS)", 101st AES Convention, Los Angeles 1996, Preprint 4384.

Gerard Hotho, Steven van de Par, and Jeroen Breebaart: "Multichannel coding of applause signals", EURASIP Journal of Advances in Signal Processing, Hindawi, Jan. 2008, doi: 10.1155/2008/531693.

M. Link: "An Attack Processing of Audio Signals for Optimizing the Temporal Characteristics of a Low Bit-Rate Audio Coding System", 95th AES convention, New York 1993, Preprint 3696.

B. C. J. Moore: "An Introduction to the Psychology of Hearing", Academic Press, London, 1989.

ISO/IEC JTC1/SC29/WG11 MPEG, International Standard ISO 11172-3 "Coding of moving pictures and associated audio for digital storage media at up to about 1.5 Mbit/s", Part 3: Audio, 1993.

T. Vaupel: "Ein Beitrag zur Transformationscodierung von Audiosignalen unter Verwendung der Methode der 'Time Domain Aliasing Cancellation (TDAC)' und einer Signalkompandierung im Zeitbereich", PhD Thesis, Universität-Gesamthochschule Duisburg, Germany, 1991. (Three relevant pages of the reference are attached and an English translation thereof.).

ISO/IEC DIS 23008-3, 3D Audio—Information technology—High efficiency coding and media delivery in heterogeneous environments—Part 3: 3D audio, 2015.

ISO/IEC DIS 23003-3, USAC—Information technology—MPEG audio technologies—Part 3: Unified speech and audio coding, 2011.

ISO/IEC DIS 14496-3, AAC—Information technology—Coding of audio-visual objects—Part 3: Audio, 2009.

(56) References Cited

OTHER PUBLICATIONS

ETRI Crosscheck Results for Fraunhofer IIS CE, ISO/IEC JTC1/SC29/WG11 MPEG2016/M37833, San Diego, USA, Feb. 2016 (Seungkwon Beack, Tae-jin Lee, ETRI crosscheck report for CE on High Resolution Envelope Processing), Feb. 2016.
IDMT Crosscheck Results for Fraunhofer IIS CE, ISO/IEC JTC1/SC29/WG11 MPEG2016/M37715, San Diego, USA, Feb. 2016 (Judith Liebetrau, Thomas Sporer, Alexander Stojanow, Cross Check Report for CE on HREP (Test Site Fraunhofer IDMT)).
Office Action dated May 14, 2019 issued in the parallel Japanese patent application No. 2018-527783 (9 pages with English translation).
Office Action dated Nov. 13, 2024 in related Brazilian patent application No. BR122024012459-9 (13 pages).
Office Action dated Nov. 13, 2024 in related Brazilian patent application No. BR122024012461-0 (10 pages).
Office Action dated Nov. 13, 2024 in related Brazilian patent application No. BR122024012453-0 (13 pages).
Office Action dated Nov. 12, 2024 in related Brazilian patent application No. BR122024012456-4 (13 pages).
Office action dated Mar. 13, 2026 issued in related India patent appl. No. 202448021315 (9 pages).
Office action dated Mar. 13, 2026 issued in related India patent appl. No. 202448021313 (12 pages).
Office action dated Mar. 13, 2026 issued in related India patent appl. No. 202448021317 (11 pages).
Office action dated Mar. 13, 2026 issued in related India patent appl. No. 202448021311 (8 pages).
Office action dated Mar. 13, 2026 issued in related India patent appl. No. 202448021314 (8 pages).

* cited by examiner

| Fig. 5B | Fig. 5C |
|---|---|

| Fig. 5D | Fig. 5E |
|---|---|

| Methodology | MUSHRA ITU-R BS.1534 |
|---|---|
| Lab | Fraunhofer IIS |
| Test Conditions | "nohrep": Reference Quality Encoder (FD core using IGF)<br>"hrep": Proposed Configuration |
| Bit Rate / Channels | 128 kbps 5.1 channel |
| Number of listeners after post-screening | 14 |
| Test Signals | • 1: ARL_applause<br>• 2: Appl3D<br>• 3: StudioAppl<br>• 4: applse<br>• 5: chostakovitch<br>• 6: fountain_music<br>• 7: glock<br>• 8: indie2<br>• 9: jackson1<br>• 10: pops<br>• 11: poulenc<br>• 12: rock_concert<br>• 13: stomp |

Fig. 16A

| Fig. 16 | Fig. 16A |
|---|---|
| | Fig. 16B |

| | |
|---|---|
| Bit Rate / Channels | 48 kbps stereo |
| Number of listeners after post-screening | 15 |
| Test Signals | • 1: ARLapplause<br>• 2: Exercise<br>• 3: HeavyApplause<br>• 4: Intro<br>• 5: Klatschen<br>• 6: MediumApplause<br>• 7: SallyBrown<br>• 8: applse |
| Bit Rate / Channels | 128 kbps stereo |
| Number of listeners after post-screening | 14 |
| Test Signals | • 1: ARLapplause<br>• 2: Exercise<br>• 3: HeavyApplause<br>• 4: Intro<br>• 5: Klatschen<br>• 6: MediumApplause<br>• 7: SallyBrown<br>• 8: applse |

Fig. 16B

| Fig. 16 | Fig. 16A |
|---|---|
| | Fig. 16B |

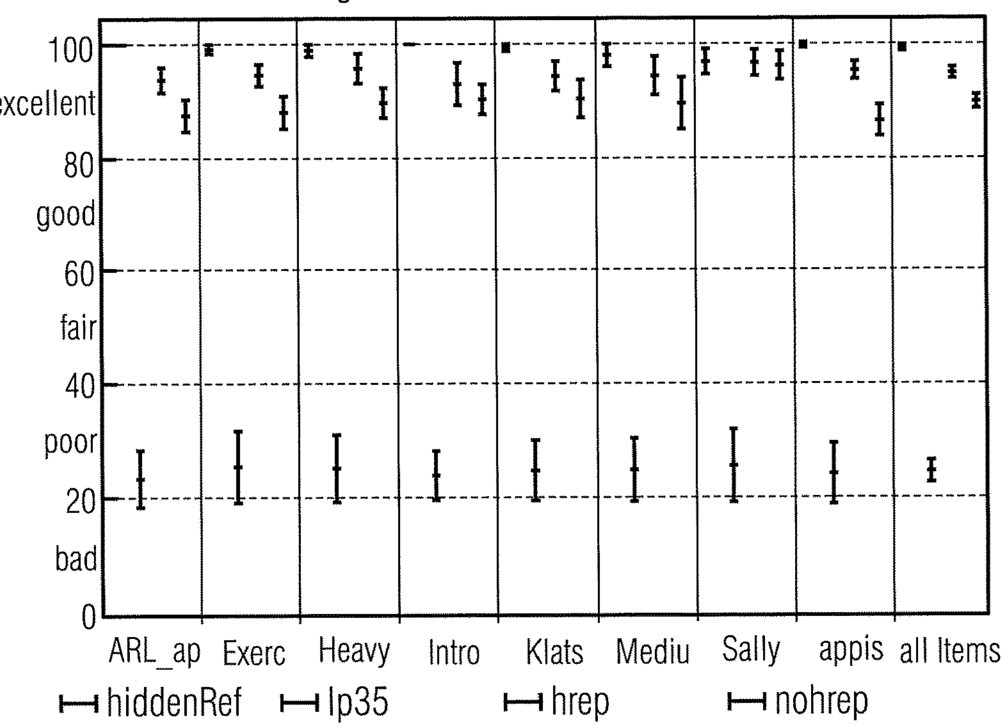
Fig. 17G
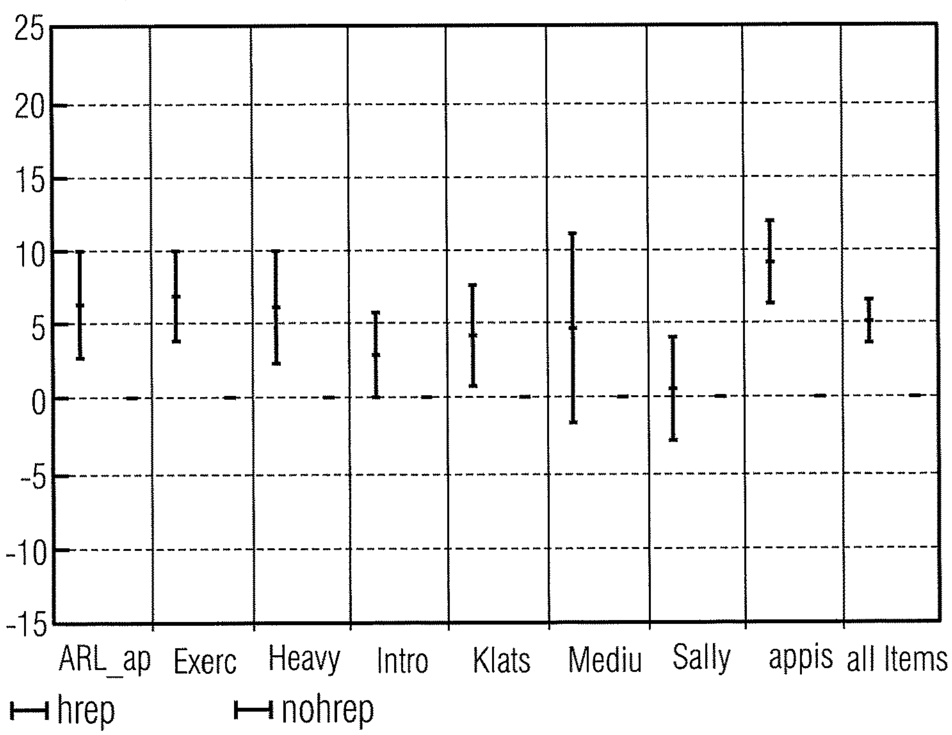
Fig. 17H

POST-PROCESSOR, PRE-PROCESSOR, AUDIO ENCODER, AUDIO DECODER AND RELATED METHODS FOR ENHANCING TRANSIENT PROCESSING

CROSS-REFERENCE TO RELATED APPLICATIONS

This application is a continuation of U.S. patent application Ser. No. 16/688,938 filed Nov. 19, 2019 which is a divisional of co-pending U.S. patent application Ser. No. 15/884,190 filed Jan. 30, 2018 which is a continuation of International Application No. PCT/EP2017/053068, filed Feb. 10, 2017, which is incorporated herein by reference in its entirety, and additionally claims priority from European Application No. EP 16156200.4, filed Feb. 17, 2016 which is incorporated herein by reference in its entirety.

BACKGROUND OF THE INVENTION

The present invention is related to audio processing and, particularly, to audio processing in the context of audio pre-processing and audio post-processing.

Pre-Echoes: The Temporal Masking Problem

Classic filterbank based perceptual coders like MP3 or AAC are primarily designed to exploit the perceptual effect of simultaneous masking, but also have to deal with the temporal aspect of the masking phenomenon: Noise is masked a short time prior to and after the presentation of a masking signal (pre-masking and post-masking phenomenon). Post-masking is observed for a much longer period of time than pre-masking (in the order of 10.0-50.0 ms instead of 0.5-2.0 ms, depending on the level and duration of the masker).

Thus, the temporal aspect of masking leads to an additional requirement for a perceptual coding scheme: In order to achieve perceptually transparent coding quality the quantization noise also must not exceed the time-dependent masked threshold.

In practice, this requirement is not easy to achieve for perceptual coders because using a spectral signal decomposition for quantization and coding implies that a quantization error introduced in this domain will be spread out in time after reconstruction by the synthesis filterbank (time/frequency uncertainty principle). For commonly used filterbank designs (e.g. a 1024 lines MDCT) this means that the quantization noise may be spread out over a period of more than 40 milliseconds at CD sampling rate. This will lead to problems when the signal to be coded contains strong signal components only in parts of the analysis filterbank window, i. e. for transient signals. In particular, quantization noise is spread out before the onsets of the signal and in extreme cases may even exceed the original signal components in level during certain time intervals. A well-known example of a critical percussive signal is a castanets recording where after decoding quantization noise components are spread out a certain time before the "attack" of the original signal. Such a constellation is traditionally known as a "pre-echo phenomenon" [Joh92b].

Due to the properties of the human auditory system, such "pre-echoes" are masked only if no significant amount of coding noise is present longer than ca. 2.0 ms before the onset of the signal. Otherwise, the coding noise will be perceived as a pre-echo artifact, i.e. a short noise-like event preceding the signal onset. In order to avoid such artifacts, care has to be taken to maintain appropriate temporal characteristics of the quantization noise such that it will still satisfy the conditions for temporal masking. This temporal noise shaping problem has traditionally made it difficult to achieve a good perceptual signal quality at low bit-rates for transient signals like castanets, glockenspiel, triangle etc.

Applause-Like Signals: An Extremely Critical Class of Signals

While the previously mentioned transient signals may trigger pre-echoes in perceptual audio codecs, they exhibit single isolated attacks, i.e. there is a certain minimum time until the next attack appears. Thus, a perceptual coder has some time to recover from processing the last attack and can, e.g., collect again spare bits to cope with the next attack (see 'bit reservoir' as described below). In contrast to this, the sound of an applauding audience consists of a steady stream of densely spaced claps, each of which is a transient event of its own. FIG. 11 shows an illustration of the high frequency temporal envelope of a stereo applause signal.

As can be seen, the average time between subsequent clap events is significantly below 10 ms.

For this reason, applause and applause-like signals (like rain drops or crackling fireworks) constitute a class of extremely difficult to code signals while being common to many live recordings. This is also true when employing parametric methods for joint coding of two or more channels [Hot08].

Traditional Approaches to Coding of Transient Signals

A set of techniques has been proposed in order to avoid pre-echo artifacts in the encoded/decoded signal:

Pre-Echo Control and Bit Reservoir

One way is to increase the coding precision for the spectral coefficients of the filterbank window that first covers the transient signal portion (so-called "pre-echo control", [MPEG1]). Since this considerably increases the amount of bits that may be used for the coding of such frames this method cannot be applied in a constant bit rate coder. To a certain degree, local variations in bit rate demand can be accounted for by using a bit reservoir ([Bra87], [MPEG1]). This technique permits to handle peak demands in bit rate using bits that have been set aside during the coding of earlier frames while the average bit rate still remains constant.

Adaptive Window Switching

A different strategy used in many perceptual audio coders is adaptive window switching as introduced by Edler [Edl89]. This technique adapts the size of the filterbank windows to the characteristics of the input signal. While stationary signal parts will be coded using a long window length, short windows are used to code the transient parts of the signal. In this way, the peak bit demand can be reduced considerably because the region for which a high coding precision is involved is constrained in time. Pre-echoes are limited in duration implicitly by the shorter transform size.

Temporal Noise Shaping (TNS)

Temporal Noise Shaping (TNS) was introduced in [Her96] and achieves a temporal shaping of the quantization noise by applying open-loop predictive coding along frequency direction on time blocks in the spectral domain.

Gain Modification (Gain Control)

Another way to avoid the temporal spread of quantization noise is to apply a dynamic gain modification (gain control process) to the signal prior to calculating its spectral decomposition and coding.

The principle of this approach is illustrated in FIG. 12. The dynamics of the input signal is reduced by a gain modification (multiplicative pre-processing) prior to its encoding. In this way, "peaks" in the signal are attenuated prior to encoding. The parameters of the gain modification are transmitted in the bitstream. Using this information the process is reversed on the decoder side, i.e. after decoding another gain modification restores the original signal dynamics.

[Lin93] proposed a gain control as an addition to a perceptual audio coder where the gain modification is performed on the time domain signal (and thus to the entire signal spectrum).

Frequency dependent gain modification/control has been used before in a number of instances:

Filter-based Gain Control: In his dissertation [Vau91], Vaupel notices that full band gain control does not work well. In order to achieve a frequency dependent gain control he proposes a compressor and expander filter pair which can be dynamically controlled in their gain characteristics. This scheme is shown in FIGS. 13*a* and 13*b*.

The variation of the filter's frequency response is shown in FIG. 13*b*.

Gain Control With Hybrid Filterbank (illustrated in FIG. 14): In the SSR profile of the MPEG-2 Advanced Audio Coding [Bos96] scheme, gain control is used within a hybrid filterbank structure. A first filterbank stage (PQF) splits the input signal into four bands of equal width. Then, a gain detector and a gain modifier perform the gain control encoder processing. Finally, as a second stage, four separate MDCT filterbanks with a reduced size (256 instead of 1024) split the resulting signal further and produce the spectral components that are used for subsequent coding.

Guided envelope shaping (GES) is a tool contained in MPEG Surround that transmits channel-individual temporal envelope parameters and restores temporal envelopes on the decoder side. Note that, contrary to HREP processing, there is no envelope flattening on the encoder side in order to maintain backward compatibility on the downmix. Another tool in MPEG Surround that functions to to perform envelope shaping is Subband Temporal Processing (STP). Here, low order LPC filters are applied within a QMF filterbank representation of the audio signals.

Related conventional technology is documented in Patent publications WO 2006/045373 A1, WO 2006/045371 A1, WO2007/042108 A1, WO 2006/108543 A1, or WO 2007/110101 A1.

A bit reservoir can help to handle peak demands on bitrate in a perceptual coder and thereby improve perceptual quality of transient signals. In practice, however, the size of the bit reservoir has to be unrealistically large in order to avoid artifacts when coding input signals of a very transient nature without further precautions.

Adaptive window switching limits the bit demand of transient parts of the signal and reduced pre-echoes through confining transients into short transform blocks. A limitation of adaptive window switching is given by its latency and repetition time: The fastest possible turn-around cycle between two short block sequences involves at least three blocks ("short"→"stop"→"start"→"short", ca. 30.0-60.0 ms for typical block sizes of 512-1024 samples) which is much too long for certain types of input signals including applause. Consequently, temporal spread of quantization noise for applause-like signals could only be avoided by permanently selecting the short window size, which usually leads to a decrease in the coder's source-coding efficiency.

TNS performs temporal flattening in the encoder and temporal shaping in the decoder. In principle, arbitrarily fine temporal resolution is possible. In practice, however, the performance is limited by the temporal aliasing of the coder filterbank (typically an MDCT, i.e. an overlapping block transform with 50% overlap). Thus, the shaped coding noise appears also in a mirrored fashion at the output of the synthesis filterbank.

Broadband gain control techniques suffer from a lack of spectral resolution. In order to perform well for many signals, however, it is important that the gain modification processing can be applied independently in different parts of the audio spectrum because transient events are often dominant only in parts of the spectrum (in practice the events that are difficult to code are present mostly in the high frequency part of the spectrum). Effectively, applying a dynamic multiplicative modification of the input signal prior to its spectral decomposition in an encoder is equivalent to a dynamic modification of the filterbank's analysis window. Depending on the shape of the gain modification function the frequency response of the analysis filters is altered according to the composite window function. However, it is undesirable to widen the frequency response of the filterbank's low frequency filter channels because this increases the mismatch to the critical bandwidth scale.

Gain Control using hybrid filterbank has the drawback of increased computational complexity since the filterbank of the first stage has to achieve a considerable selectivity in order to avoid aliasing distortions after the latter split by the second filterbank stage. Also, the cross-over frequencies between the gain control bands are fixed to one quarter of the Nyquist frequency, i.e. are 6, 12 and 18 kHz for a sampling rate of 48 kHz. For most signals, a first cross-over at 6 kHz is too high for good performance.

Envelope shaping techniques contained in semi-parametric multi-channel coding solutions like MPEG Surround (STP, GES) are known to improve perceptual quality of transients through a temporal re-shaping of the output signal or parts thereof in the decoder. However, these techniques do not perform temporal flatting prior to the encoder. Hence, the transient signal still enters the encoder with its original short time dynamics and imposes a high bitrate demand on the encoders bit budget.

SUMMARY

According to an embodiment, an audio post-processor for post-processing an audio signal having a time-variable high frequency gain information as side information may have: a band extractor for extracting a high frequency band of the audio signal and a low frequency band of the audio signal; a high band processor for performing a time-variable amplification of the high frequency band in accordance with the time-variable high frequency gain information to obtain a processed high frequency band; a combiner for combining the processed high frequency band and the low frequency band.

According to another embodiment, an audio pre-processor for pre-processing an audio signal may have: a signal analyzer for analyzing the audio signal to determine a time-variable high frequency gain information; a band extractor for extracting a high frequency band of the audio signal and a low frequency band of the audio signal; a high band processor for performing a time-variable modification of the high frequency band in accordance with the time-variable high frequency gain information to obtain a processed high frequency band; a combiner for combining the processed high frequency band and the low frequency band to obtain a pre-processed audio signal; and an output interface for generating an output signal having the pre-processed audio signal and the time-variable high frequency gain information as side information.

According to another embodiment, an audio encoding apparatus for encoding an audio signal may have: the audio pre-processor of any one of claims 32 to 52, configured to generate the output signal having the time-variable high frequency gain information as side information; a core encoder for generating a core encoded signal and core side information; and an output interface for generating an encoded signal having the core encoded signal, the core side information and the time-variable high frequency gain information as additional side information.

According to another embodiment, an audio decoding apparatus may have: an input interface for receiving an encoded audio signal having a core encoded signal, core side information and the time-variable high frequency gain information as additional side information; a core decoder for decoding the core encoded signal using the core side information to obtain a decoded core signal; and a post-processor for post-processing the decoded core signal using the time-variable high frequency gain information in accordance with the inventive audio post-processor for post-processing an audio signal having a time-variable high frequency gain information as side information.

According to another embodiment, a method of post-processing an audio signal having a time-variable high frequency gain information as side information may have the steps of: extracting a high frequency band of the audio signal and a low frequency band of the audio signal; performing a time-variable modification of the high band in accordance with the time-variable high frequency gain information to obtain a processed high frequency band; and combining the processed high frequency band and the low frequency band.

According to another embodiment, a method of pre-processing an audio signal may have the steps of: analyzing the audio signal to determine a time-variable high frequency gain information; extracting a high frequency band of the audio signal and a low frequency band of the audio signal; performing a time-variable modification of the high frequency band in accordance with the time-variable high frequency gain information to obtain a processed high frequency band; combining the processed high frequency band and the low frequency band to obtain a pre-processed audio signal; and generating an output signal having the pre-processed audio signal and the time-variable high frequency gain information as side information.

According to another embodiment, a method of encoding an audio signal may have: the method of pre-processing an audio signal having the steps of: analyzing the audio signal to determine a time-variable high frequency gain information; extracting a high frequency band of the audio signal and a low frequency band of the audio signal; performing a time-variable modification of the high frequency band in accordance with the time-variable high frequency gain information to obtain a processed high frequency band; combining the processed high frequency band and the low frequency band to obtain a pre-processed audio signal; and generating an output signal having the pre-processed audio signal and the time-variable high frequency gain information as side information, configured to generate the output signal having the time-variable high frequency gain information as side information; generating a core encoded signal and core side information; and generating an encoded signal having the core encoded signal, the core side information and the time-variable high frequency gain information as additional side information.

According to another embodiment, a method of audio decoding may have the steps of: receiving an encoded audio signal having a core encoded signal, core side information and the time-variable high frequency gain information as additional side information; decoding the core encoded signal using the core side information to obtain a decoded core signal; and post-processing the decoded sore signal using the time-variable high frequency gain information in accordance with the method of post-processing an audio signal having a time-variable high frequency gain information as side information, having the steps of: extracting a high frequency band of the audio signal and a low frequency band of the audio signal; performing a time-variable modification of the high band in accordance with the time-variable high frequency gain information to obtain a processed high frequency band; and combining the processed high frequency band and the low frequency band.

According to another embodiment, a non-transitory digital storage medium having a computer program stored thereon to perform the method of post-processing an audio signal having a time-variable high frequency gain information as side information having the steps of: extracting a high frequency band of the audio signal and a low frequency band of the audio signal; performing a time-variable modification of the high band in accordance with the time-variable high frequency gain information to obtain a processed high frequency band; and combining the processed high frequency band and the low frequency band, when said computer program is run by a computer.

According to another embodiment, a non-transitory digital storage medium having a computer program stored thereon to perform the method of pre-processing an audio signal having the steps of: analyzing the audio signal to determine a time-variable high frequency gain information; extracting a high frequency band of the audio signal and a low frequency band of the audio signal; performing a time-variable modification of the high frequency band in accordance with the time-variable high frequency gain information to obtain a processed high frequency band; combining the processed high frequency band and the low frequency band to obtain a pre-processed audio signal; and generating an output signal having the pre-processed audio signal and the time-variable high frequency gain information as side information, when said computer program is run by a computer.

According to another embodiment, a non-transitory digital storage medium having a computer program stored thereon to perform the method of encoding an audio signal having: the method of pre-processing an audio signal having the steps of: analyzing the audio signal to determine a time-variable high frequency gain information; extracting a high frequency band of the audio signal and a low frequency band of the audio signal; performing a time-variable modification of the high frequency band in accordance with the time-variable high frequency gain information to obtain a processed high frequency band; combining the processed high frequency band and the low frequency band to obtain a pre-processed audio signal; and generating an output signal having the pre-processed audio signal and the time-variable high frequency gain information as side information, configured to generate the output signal having the time-variable high frequency gain information as side information; generating a core encoded signal and core side information; and generating an encoded signal having the core encoded signal, the core side information and the time-variable high frequency gain information as additional side information, when said computer program is run by a computer.

According to another embodiment, a non-transitory digital storage medium having a computer program stored thereon to perform the method of audio decoding having the steps of: receiving an encoded audio signal having a core encoded signal, core side information and the time-variable high frequency gain information as additional side information; decoding the core encoded signal using the core side information to obtain a decoded core signal; and post-processing the decoded sore signal using the time-variable high frequency gain information in accordance with method of post-processing an audio signal having a time-variable high frequency gain information as side information having the steps of: extracting a high frequency band of the audio signal and a low frequency band of the audio signal; performing a time-variable modification of the high band in accordance with the time-variable high frequency gain information to obtain a processed high frequency band; and combining the processed high frequency band and the low frequency band, when said computer program is run by a computer.

A first aspect of the present invention is an audio post-processor for post-processing an audio signal having a time-variable high frequency gain information as side information, comprising a band extractor for extracting a high frequency band of the audio signal and a low frequency band of the audio signal; a high band processor for performing a time-variable modification of the high band in accordance with the time-variable high frequency gain information to obtain a processed high frequency band; and a combiner for combining the processed high frequency band and the low frequency band.

A second aspect of the present invention is an audio pre-processor for pre-processing an audio signal, comprising a signal analyzer for analyzing the audio signal to determine a time-variable high frequency gain information; a band extractor for extracting a high frequency band of the audio signal and a low frequency band of the audio signal; a high band processor for performing a time-variable modification of the high band in accordance with the time-variable high frequency gain information to obtain a processed high frequency band; a combiner for combining the processed high frequency band and the low frequency band to obtain a pre-processed audio signal; and an output interface for generating an output signal comprising the pre-processed audio signal and the time-variable high frequency gain information as side information.

A third aspect of the present invention is an audio encoding apparatus for encoding an audio signal, comprising the audio pre-processor of the first aspect, configured to generate the output signal having the time-variable high frequency gain information as side information; a core encoder for generating a core encoded signal and core side information; and an output interface for generating an encoded signal comprising the core encoded signal, the core side information and the time-variable high frequency gain information as additional side information.

A fourth aspect of the present invention is an audio decoding apparatus, comprising an input interface for receiving an encoded audio signal comprising the core encoded signal, the core side information and the time-variable high frequency gain information as additional side information; a core decoder for decoding the core encoded signal using the core side information to obtain a decoded core signal; and a post-processor for post-processing the decoded core signal using the time-variable high frequency gain information in accordance with the second aspect above.

A fifth aspect of the present invention is a method of post-processing an audio signal having a time-variable high frequency gain information as side information, comprising extracting a high frequency band of the audio signal and a low frequency band of the audio signal; performing a time-variable modification of the high band in accordance with the time-variable high frequency gain information to obtain a processed high frequency band; and combining the processed high frequency band and the low frequency band.

A sixth aspect of the present invention is a method of pre-processing an audio signal, comprising analyzing the audio signal to determine a time-variable high frequency gain information; extracting a high frequency band of the audio signal and a low frequency band of the audio signal; performing a time-variable modification of the high band in accordance with the time-variable high frequency gain information to obtain a processed high frequency band; combining the processed high frequency band and the low frequency band to obtain a pre-processed audio signal; and generating an output signal comprising the pre-processed audio signal and the time-variable high frequency gain information as side information.

A seventh aspect of the present invention is a method of encoding an audio signal, comprising the method of audio pre-processing of the sixth aspect, configured to generate the output signal have the time-variable high frequency gain information as side information; generating a core encoded signal and core side information; and generating an encoded signal comprising the core encoded signal, the core side information, and the time-variable high frequency gain information as additional side information.

An eighth aspect of the present invention is a method of audio decoding, comprising receiving an encoded audio signal comprising a core encoded signal, core side information and the time-variable high frequency gain information as additional side information; decoding the core encoded signal using the core side information to obtain a decoded core signal; and post-processing the decoded core signal using the time-variable high frequency gain information in accordance with the fifth aspect.

A ninth aspect of the present invention is related to a computer program or a non-transitory storage medium having stored thereon the computer program for performing, when running on a computer or a processor, any one of the methods in accordance with the fifth, sixth, seventh or the eighth aspect above.

The present invention provides a band-selective high frequency processing such as a selective attenuation in a pre-processor or a selective amplification in a post-processor in order to selectively encode a certain class of signals such as transient signals with a time-variable high frequency gain information for the high band. Thus, the pre-processed signal is a signal having the additional side information in the form of straightforward time-variable high frequency gain information and the signal itself, so that a certain class of signals, such as transient signals, does not occur anymore in the pre-processed signal or only occur to a lesser degree. In the audio post-processing, the original signal shape is recovered by performing the time-variable multiplication of the high frequency band in accordance with the time-variable high frequency gain information associated with the audio signal as side information so that, in the end, i.e., subsequent to a chain consisting of pre-processing, coding, decoding and post-processing, the listener does not perceive substantial differences to the original signal and, particularly, does not perceive a signal having a reduced transient nature, although the inner core encoder/core decoder blocks wherein the position to process a less-transient signal which has resulted, for the encoder processing, in a reduced amount of bits that may be used on the one hand and an increased audio quality on the other hand, since the hard-to-encode class of signals has been removed from the signal before the encoder actually started its task. However, this removal of the hard-to-encode signal portions does not result in a reduced audio quality, since these signal portions are reconstructed by the audio post-processing subsequent to the decoder operation.

In embodiments, the pre-processor also amplifies parts slightly quieter than the average background level and the post-processor attenuates them. This additional processing is potentially useful both for individual strong attacks and for parts between consecutive transient events.

Subsequently, particular advantages of embodiments are outlined.

HREP (High Resolution Envelope Processing) is a tool for improved coding of signals that predominantly consist of many dense transient events, such as applause, rain drop sounds, etc. At the encoder side, the tool works as a pre-processor with high temporal resolution before the actual perceptual audio codec by analyzing the input signal, attenuating and thus temporally flattening the high frequency part of transient events, and generating a small amount of side information (1-4 kbps for stereo signals). At the decoder side, the tool works as a post-processor after the audio codec by boosting and thus temporally shaping the high frequency part of transient events, making use of the side information that was generated during encoding. The benefits of applying HREP are two-fold: HREP relaxes the bitrate demand imposed on the encoder by reducing short time dynamics of the input signal; additionally, HREP ensures proper envelope restoration in the decoder's (up-) mixing stage, which is all the more important if parametric multi-channel coding techniques have been applied within the codec.

Furthermore, the present invention is advantageous in that it enhances the coding performance for applause-like signals by using appropriate signal processing methods, for example, in the pre-processing on the one hand or the post-processing on the other hand.

A further advantage of the present invention is that the inventive high resolution envelope processing (HREP), i.e., the audio pre-processing or the audio post-processing solves problems of the conventional technology by performing a pre-flattening prior to the encoder or a corresponding inverse flattening subsequent to a decoder.

Subsequently, characteristic and novel features of embodiments of the present invention directed to an HREP signal processing is summarized and unique advantages are described.

HREP processes audio signals in just two frequency bands which are split by filters. This makes the processing simple and of low computational and structural complexity. Only the high band is processed, the low band passes through in an unmodified way.

These frequency bands are derived by low pass filtering of the input signal to compute the first band. The high pass (second) band is simply derived by subtracting the low pass component from the input signal. In this way, only one filter has to be calculated explicitly rather than two which reduces complexity. Alternatively, the high pass filtered signal can be computed explicitly and the low pass component can be derived as the difference between the input signal and the high pass signal.

For supporting low complexity post-processor implementations, the following restrictions are possible

- Limitation of active HREP channels/objects
- Limitation to the maximum transmitted gain factors g(k) that are non-trivial (trivial gain factors of 0 dB alleviate the need for an associated DFT/iDFT pair)
- Calculation of the DFT/iDFT in an efficient split-radix 2 sparse topology.

In an embodiment the encoder or the audio pre-processor associated with the core encoder is configured to limit the maximum number of channels or objects where HREP is active at the same time, or the decoder or the audio post-processor associated with the core decoder is configured to only perform a postprocessing with the maximum number of channels or objects where HREP is active at the same time. An advantageous number for the limitation of active channels or objects is 16 and an even more advantageous is 8.

In a further embodiment the HREP encoder or the audio pre-processor associated with the core encoder is configured to limit the output to a maximum of non-trivial gain factors or the decoder or the audio post-processor associated with the core decoder is configured such that trivial gain factors of value "1" do not compute a DFT/iDFT pair, but pass through the unchanged (windowed) time domain signal. An advantageous number for the limitation of non-trivial gain factors is 24 and an even more advantageous is 16 per frame and channel or object.

In a further embodiment the HREP encoder or the audio pre-processor associated with the core encoder is configured to calculate the DFT/iDFT in an efficient split-radix 2 sparse topology or the decoder or the audio post-processor associated with the core decoder is configured to also calculate the DFT/iDFT in an efficient split-radix 2 sparse topology.

The HREP low pass filter can be implemented efficiently by using a sparse FFT algorithm. Here, an example is given starting from a N=8 point decimation-in-time radix-2 FFT topology, where only X(0) and X(1) are needed for further processing; consequently, E(2) and E(3) and O(2) and O(3) are not needed; next, imagine both N/2-point DFTs being further subdivided into two N/4-point DFTs+subsequent butterflies each. Now one can repeat the above described omissions in an analogous way, etc., as illustrated in FIG. 15.

In contrast to a gain control scheme based on hybrid filterbanks (where the processing band cross-over frequencies are dictated by the first filterbank stage, and are practically tied to power-of-two fractions of the Nyquist frequency), the split-frequency of HREP can/could be adjusted freely by adapting the filter. This enables optimal adaptation to the signal characteristics and psychoacoustic requirements.

In contrast to a gain control scheme based on hybrid filterbanks there is no need for long filters to separate processing bands in order to avoid aliasing problems after the second filterbank stage. This is possible because HREP is a stand-alone pre-/post-processor which does not have to operate with a critically-sampled filterbank.

In contrast to other gain control schemes, HREP adapts dynamically to the local statistics of the signal (computing a two-sided sliding mean of the input high frequency background energy envelope). It reduces the dynamics of the input signal to a certain fraction of its original size (so-called alpha factor). This enables a 'gentle' operation of the scheme without introducing artifacts by undesirable interaction with the audio codec.

In contrast to other gain control schemes, HREP is able to compensate for the additional loss in dynamics by a low bitrate audio codec by modeling this as "losing a certain fraction of energy dynamics" (so-called beta factor) and reverting this loss.

The HREP pre-/post-processor pair is (near) perfectly reconstructing in the absence of quantization (i.e. without a codec).

To achieve this, the post-processor uses an adaptive slope for the splitting filter depending on the high frequency amplitude weighting factor, and corrects the interpolation error that occurs in reverting the time-variant spectral weights applied to overlapping T/F transforms by applying a correction factor in time domain.

HREP implementations may contain a so-called Meta Gain Control (MGC) that gracefully controls the strength of the perceptual effect provided by HREP processing and can avoid artifacts when processing non-applause signals. Thus, it alleviates the accuracy requirements of an external input signal classification to control the application of HREP.

Mapping of applause classification result onto MGC and HREP settings.

HREP is a stand-alone pre-/post-processor which embraces all other coder components including bandwidth extension and parametric spatial coding tools.

HREP relaxes the requirements on the low bitrate audio coder through pre-flattening of the high frequency temporal envelope. Effectively, fewer short blocks will be triggered in the coder and fewer active TNS filters will be involved.

HREP improves also on parametric multi-channel coding by reducing cross talk between the processed channels that normally happens due to limited temporal spatial cue resolution.

Codec topology: interaction with TNS/TTS, IGF and stereo filling

Bitstream format: HREP signaling

BRIEF DESCRIPTION OF THE DRAWINGS

Embodiments of the present invention will be detailed subsequently referring to the appended drawings, in which:

FIG. 16 (comprised of FIG. 16A and FIG. 16B) illustrates a listening test overview;

FIG. 17G illustrates absolute MUSHRA scores for 128 kbps stereo test; and

FIG. 17H illustrates different MUSHRA scores for 128 kbps stereo test.

DETAILED DESCRIPTION OF THE INVENTION

Figure 1:
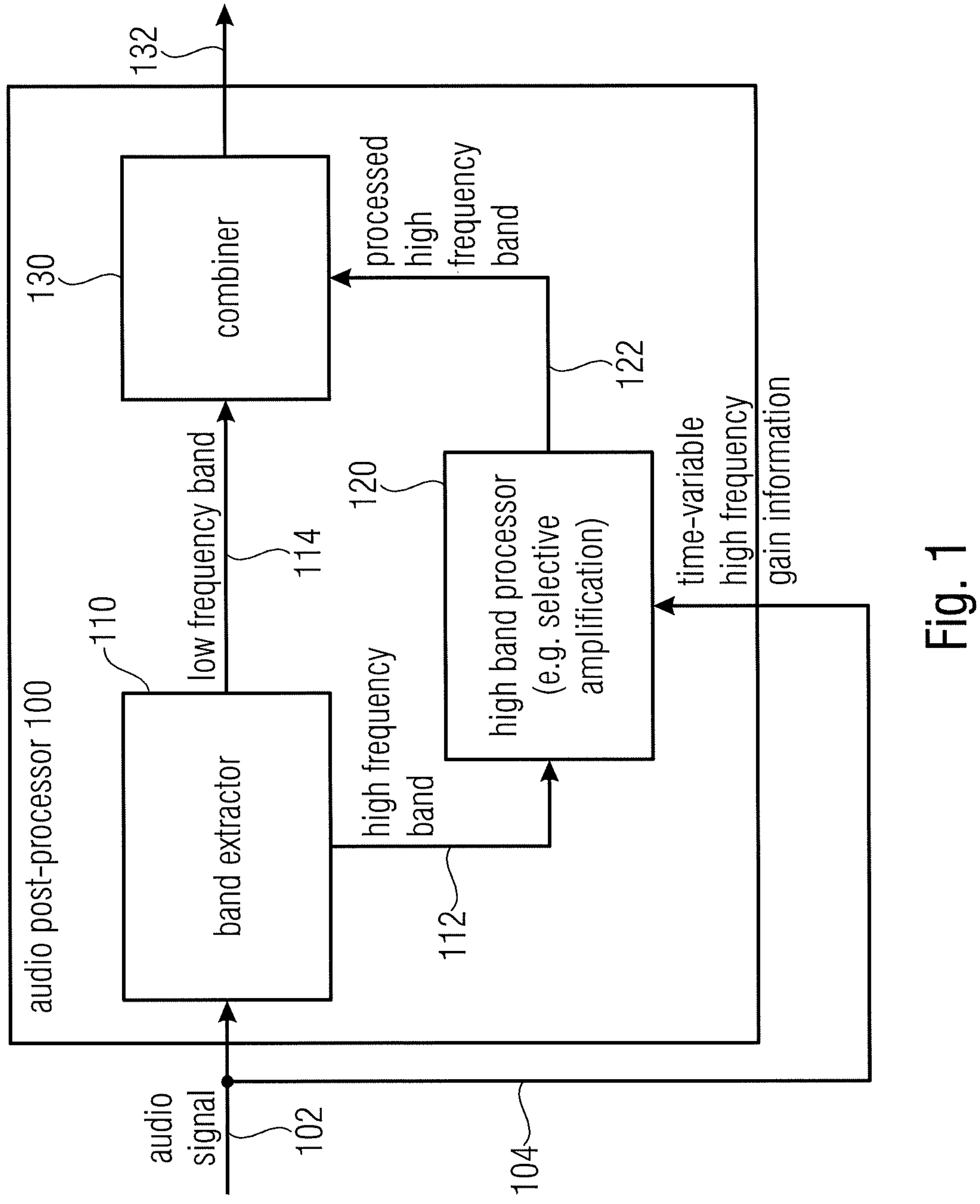
FIG. 1 illustrates an audio post-processor in accordance with an embodiment.
Figure 3A:
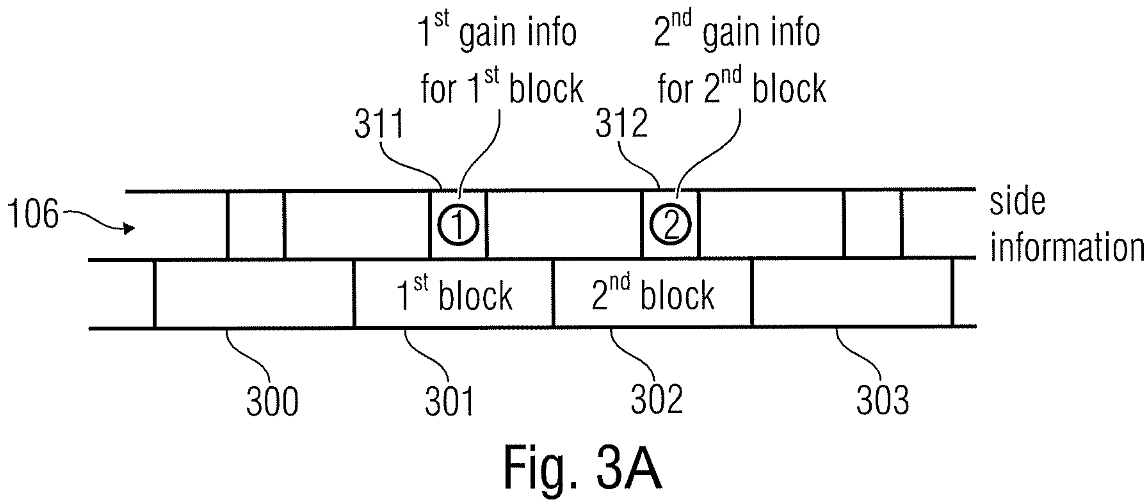
FIG. 3A is a schematic representation of the audio signal having a time-variable high frequency gain information as side information.

FIG. 1 illustrates an embodiment of an audio post-processor 100 for post-processing an audio signal 102 having a time-variable high frequency gain information 104 as side information 106 illustrated in FIG. 3A. The audio post-processor comprises a band extractor 110 for extracting a high frequency band 112 of the audio signal 102 and a low frequency band 114 of the audio signal 102. Furthermore, the audio post-processor in accordance with this embodiment comprises a high band processor 120 for performing a time-variable modification of the high frequency band 112 in accordance with the time-variable high frequency gain information 104 to obtain a processed high frequency band 122. Furthermore, the audio post-processor comprises a combiner 130 for combining the processed high frequency band 122 and the low frequency band 114.

Advantageously the high band processor 120 performs a selective amplification of a high frequency band in accordance with the time-variable high frequency gain information for this specific band. This is to undo or reconstruct the original high frequency band, since the corresponding high frequency band has been attenuated before in an audio pre-processor such as the audio pre-processor of FIG. 7 that will be described later on.

Particularly, in the embodiment, the band extractor 110 is provided, at an input thereof, with the audio signal 102 as extracted from the audio signal having associated side information. Further, an output of the band extractor is connected to an input of the combiner. Furthermore, a second input of the combiner is connected to an output of the high band processor 120 to feed the processed high frequency band 122 into the combiner 130. Furthermore, further output of the band extractor 110 is connected to an input of the high band processor 120. Furthermore, the high band processor additionally has a control input for receiving the time-variable high frequency gain information as illustrated in FIG. 1.

Figure 2:
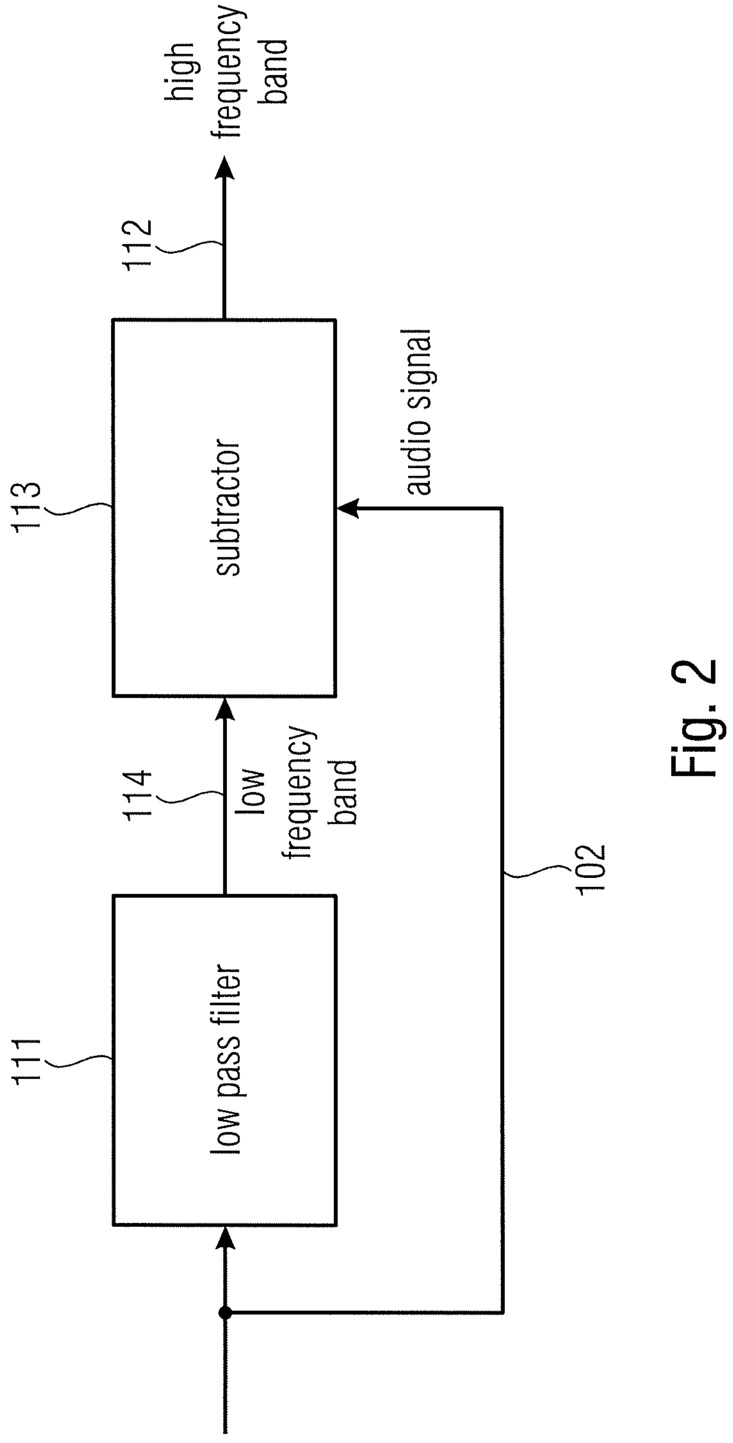
FIG. 2 illustrates an implementation of the band extractor of FIG. 1.

FIG. 2 illustrates an implementation of the band extractor 110. Particularly, the band extractor 110 comprises a low pass filter 111 that, at its output, delivers the low frequency band 114. Furthermore, the high frequency band 112 is generated by subtracting the low frequency band 114 from the audio signal 102, i.e., the audio signal that has been input into the low pass filter 111. However, the subtractor 113 can perform some kind of pre-processing before the actual typically sample-wise subtraction as will be shown with respect to the audio signal windower 121 in FIG. 4 or the corresponding block 121 in FIG. 5A. Thus, the band extractor 110 may comprise, as illustrated in FIG. 2, a low pass filter 111 and the subsequently connected subtractor 113, i.e., subtractor 113 having an input being connected to an output of the low pass filter 111 and having a further input being connected to the input of the low pass filter 111.

Alternatively, however, the band extractor 110 can also be implemented by actually using a high pass filter and by subtracting the high pass output signal or high frequency band from the audio signal to get the low frequency band. Or, alternatively, the band extractor can be implemented without any subtractor, i.e., by a combination of a low pass filter and a high pass filter in the way of a two-channel filterbank, for example. Advantageously, the band extractor 110 of FIG. 1 (or FIG. 2) is implemented to extract only two bands, i.e., a single low frequency band and a single high frequency band while these bands together span the full frequency range of the audio signal.

Advantageously, a cutoff or corner frequency of the low frequency band extracted by the band extractor 110 is between ⅛ and ⅓ of a maximum frequency of the audio signal and advantageously equal to ⅙ of the maximum frequency of the audio signal.

FIG. 3A illustrates a schematic representation of the audio signal 102 having useful information in the sequence of blocks 300, 301, 302, 303 where, for illustration reasons, block 301 is considered as a first block of sampling values, and block 302 is considered to be a second later block of sampling values of the audio signal. Block 300 precedes the first block 301 in time and block 303 follows the block 302 in time and the first block 301 and the second block 302 are adjacent in time to each other. Furthermore, as illustrated at 106 in FIG. 3A, each block has associated therewith side information 106 comprising, for the first block 301, the first gain information 311 and comprising, for the second block, second gain information 312.

Figure 3B:
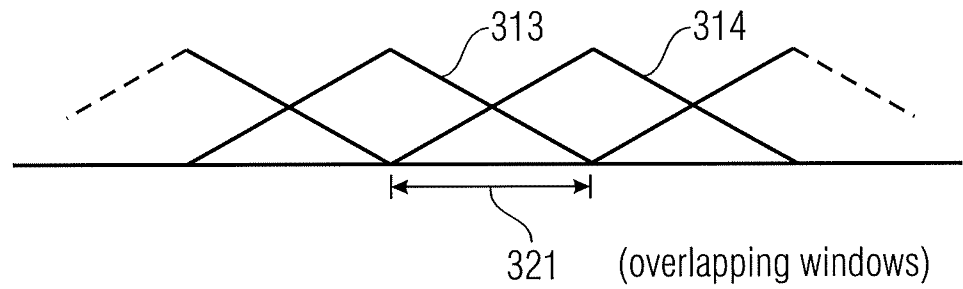
FIG. 3B is a schematic representation of a processing by the band extractor, the high band processor or the combiner with overlapping blocks having an overlapping region.

FIG. 3B illustrates a processing of the band extractor 110 (and the high band processor 120 and the combiner 130) in overlapping blocks. Thus, the window 313 used for calculating the first block 301 overlaps with window 314 used for extracting the second block 302 and both windows 313 and 314 overlap within an overlap range 321.

Although the scale in FIGS. 3A and 3B outline that the length of each block is half the size of the length of a window, the situation can also be different, i.e., that the length of each block is the same size as a window used for windowing the corresponding block. Actually, this is the implementation for these subsequent embodiments illustrated in FIG. 4 or, particularly, FIG. 5A for the post-processor or FIG. 9C for the pre-processor.

Then, the length of the overlapping range 321 is half the size of a window corresponding to half the size or length of a block of sampling values.

Particularly, the time-variable high frequency gain information is provided for a sequence 300 to 303 of blocks of sampling values of the audio signal 102 so that the first block 301 of sampling values has associated therewith the first gain information 311 and the second later block 302 of sampling values of the audio signal has a different second gain information 312, wherein the band extractor 110 is configured to extract, from the first block 301 of sampling values, a first low frequency band and a first high frequency band and to extract, from the second block 302 of sampling values, a second low frequency band and a second high frequency band. Furthermore, the high band processor 120 is configured to modify the first high frequency band using the first gain information 311 to obtain the first processed high frequency band and to modify the second high frequency band using the second gain information 312 to obtain a second processed high frequency band. Furthermore, the combiner 130 is then configured to combine the first low frequency band and the first processed high frequency band to obtain a first combined block and to combine the second low frequency band and the second processed high frequency band to obtain a second combined block.

Figure 3C:
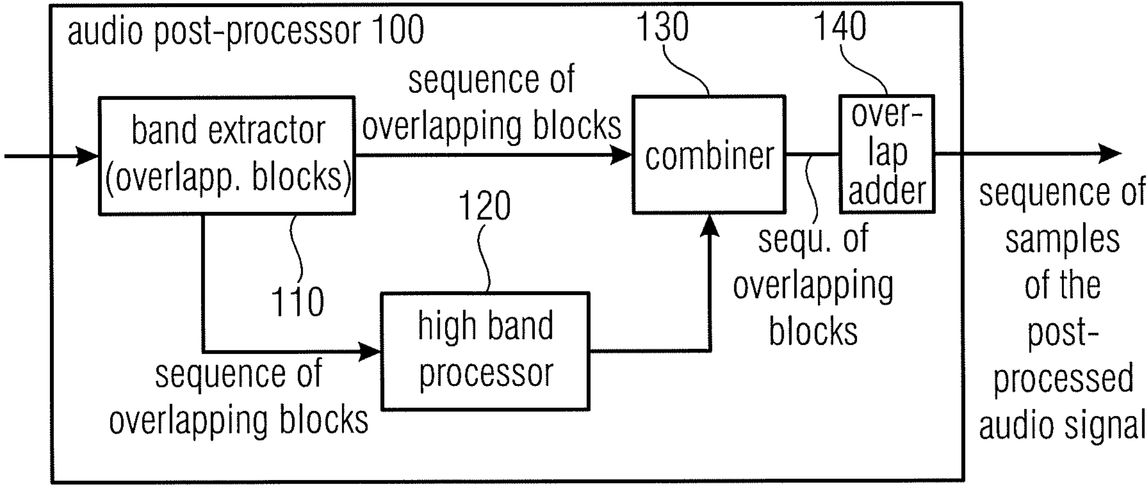
FIG. 3C illustrates an audio post-processor having an overlap adder.

As illustrated in FIG. 3C, the band extractor 110, the high band processor 120 and the combiner 130 are configured to operate with the overlapping blocks illustrated in FIG. 3B. Furthermore, the audio post-processor 100 furthermore comprises an overlap-adder 140 for calculating a post-processed portion by adding audio samples of a first block 301 and audio samples of a second block 302 in the block overlap range 321. Advantageously, the overlap adder 140 is configured for weighting audio samples of a second half of a first block using a decreasing or fade-out function and for weighting a first half of a second block subsequent to the first block using a fade-in or increasing function. The fade-out function and the fade-in function can be linear or non-linear functions that are monotonically increasing for the fade-in function and monotonically decreasing for the fade-out function.

At the output of the overlap-adder 140, there exists a sequence of samples of the post-processed audio signal as, for example, illustrated in FIG. 3A, but now without any side information, since the side information has been "consumed" by the audio post-processor 100.

Figure 4:
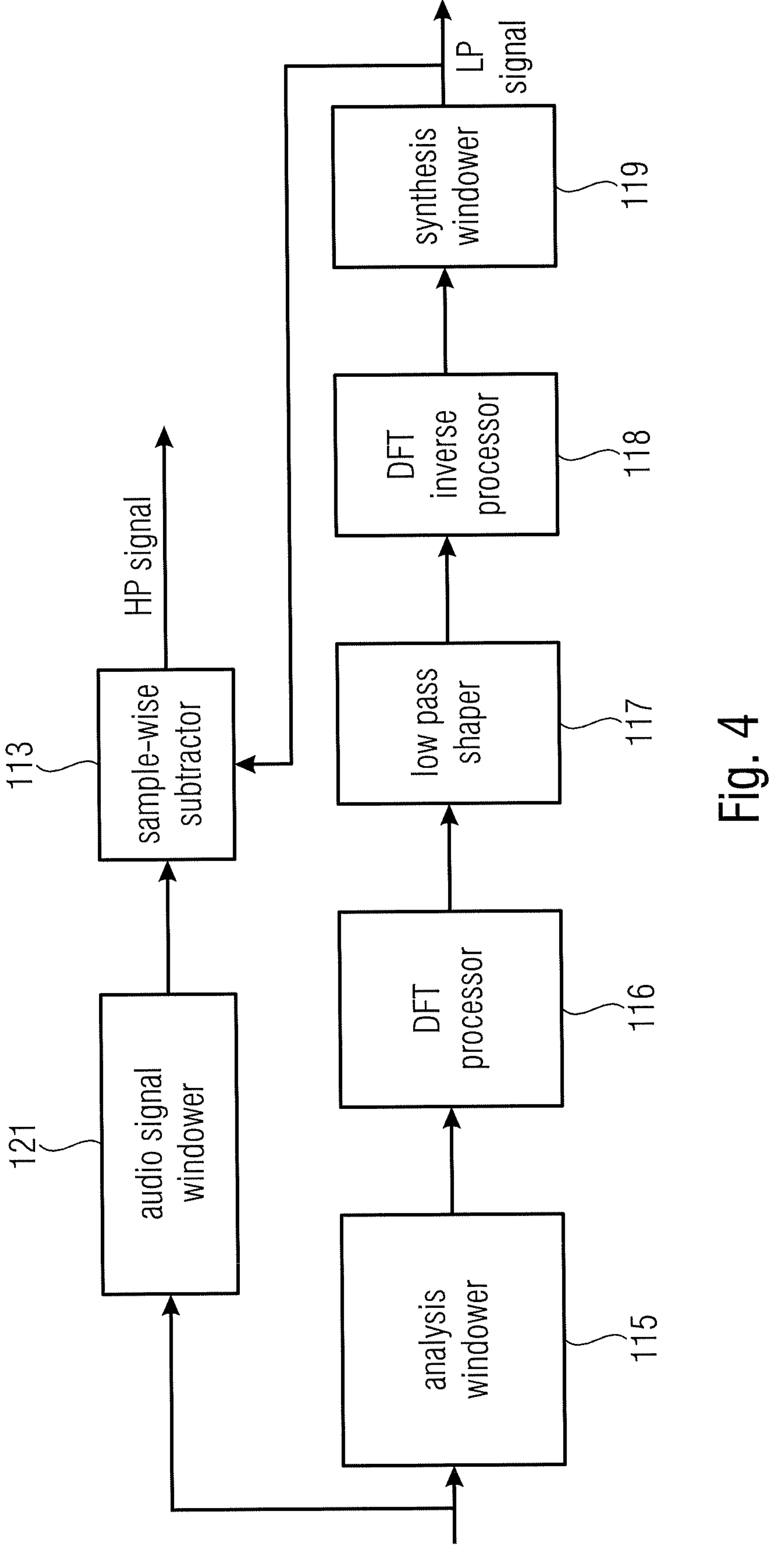
FIG. 4 illustrates an implementation of the band extractor of FIG. 1.
Figure 5A:
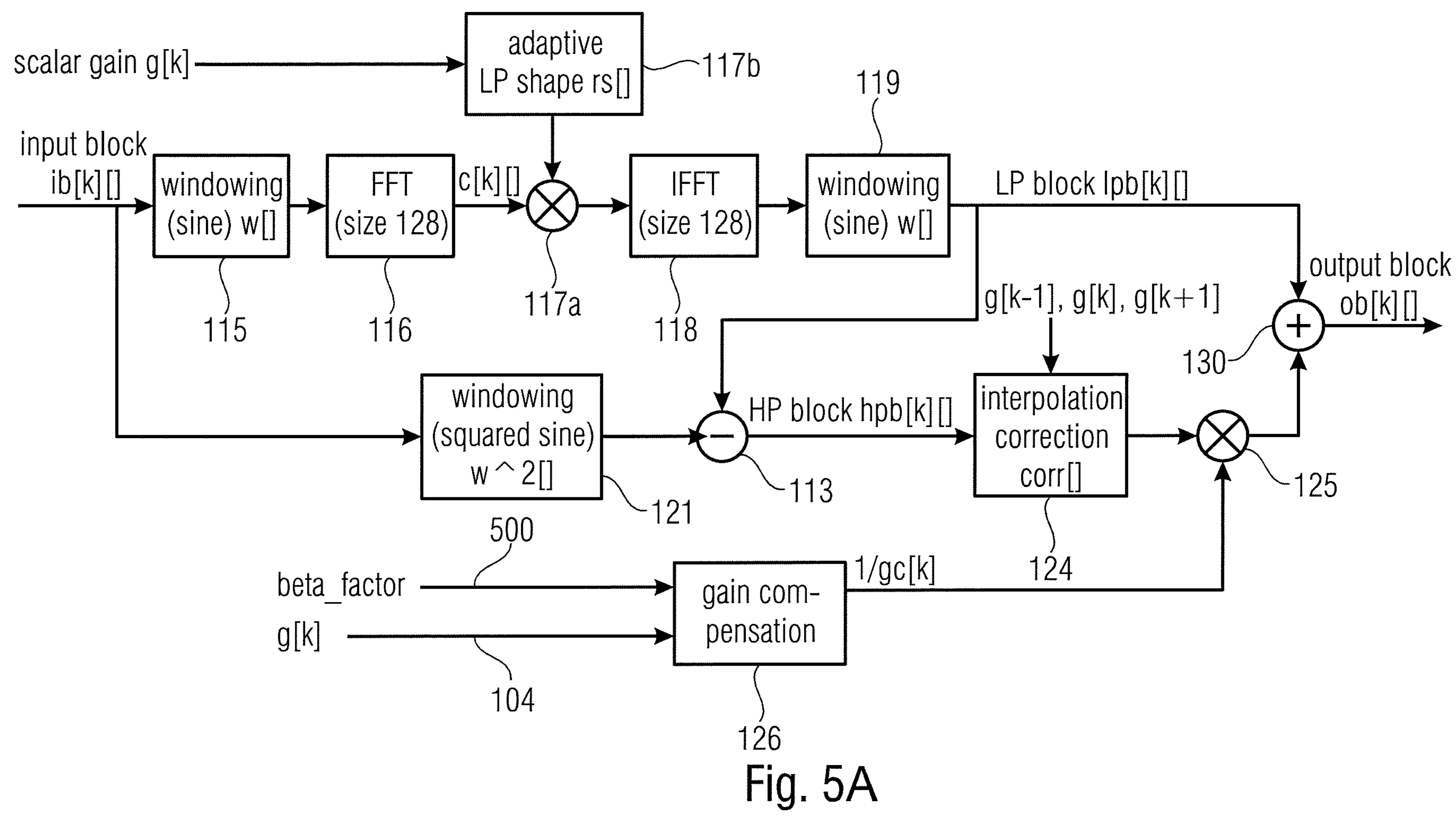
FIG. 5A illustrates a further implementation of the audio post-processor.
Figure 7:
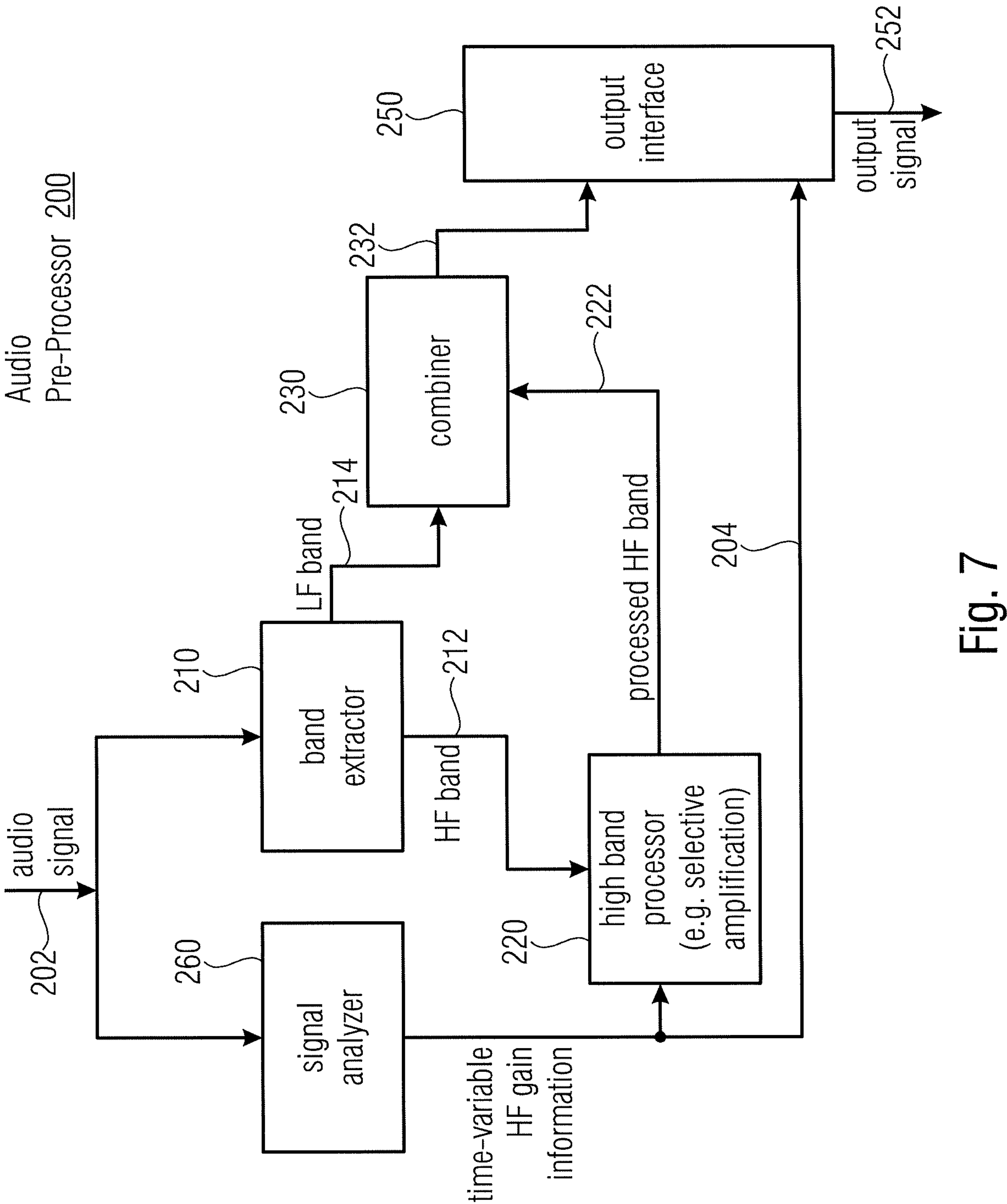
FIG. 7 illustrates an audio pre-processor in accordance with an embodiment.

FIG. 4 illustrates an implementation of the band extractor 110 of the audio post-processor illustrated in FIG. 1 or, alternatively, of the band extractor 210 of audio pre-processor 200 of FIG. 7. Both, the band extractor 110 of FIG. 1 or the band extractor 210 of FIG. 7 can be implemented in the same way as illustrated in FIG. 4 or as illustrated in FIG. 5A for the post-processor or FIG. 9C for the pre-processor. In an embodiment, the audio post-processor comprises the band extractor that has, as certain features, an analysis windower 115 for generating a sequence of blocks of sampling values of the audio signal using an analysis window, where the blocks are time-overlapping as illustrated in FIG. 3B by an overlapping range 321. Furthermore, the band extractor 110 comprises a DFT processor 116 for performing a discrete Fourier transform for generating a sequence of blocks of spectral values. Thus, each individual block of sampling values is converted into a spectral representation that is a block of spectral values. Therefore, the same number of blocks of spectral values is generated as if they were blocks of sampling values.

The DFT processor 116 has an output connected to an input of a low pass shaper 117. The low pass shaper 117 actually performs the low pass filtering action, and the output of the low pass shaper 117 is connected to a DFT inverse processor 118 for generating a sequence of blocks of low pass time domain sampling values. Finally, a synthesis windower 119 is provided at an output of the DFT inverse processor for windowing the sequence of blocks of low pass time domain sampling values using a synthesis window. The output of the synthesis windower 119 is a time domain low pass signal. Thus, blocks 115 to 119 correspond to the "low pass filter" block 111 of FIG. 2, and blocks 121 and 113 correspond to the "subtractor" 113 of FIG. 2. Thus, in the embodiment illustrated in FIG. 4, the band extractor further comprises the audio signal windower 121 for windowing the audio signal 102 using the analysis window and the synthesis window to obtain a sequence of windowed blocks of audio signal values. Particularly, the audio signal windower 121 is synchronized with the analysis windower 115 and/or the synthesis windower 119 so that the sequence of blocks of low pass time domain sampling values output by the synthesis windower 119 is time synchronous with the sequence of windowed blocks of audio signal values output by block 121, which is the full band signal.

However, the full band signal is now windowed using the audio signal windower 121 and, therefore, a sample-wise subtraction is performed by the sample-wise subtractor 113 in FIG. 4 to finally obtain the high pass signal. Thus, the high pass signal is available, additionally, in a sequence of blocks, since the sample-wise subtraction 113 has been performed for each block.

Furthermore, the high band processor 120 is configured to apply the modification to each sample of each block of the sequence of blocks of high pass time domain sampling values as generated by block 110 in FIG. 3C. Advantageously, the modification for a sample of a block depends on, again, information of a previous block and, again, information of the current block, or, alternatively or additionally, again, information of the current block and, again, information of the next block. Particularly, and advantageously, the modification is done by a multiplier 125 of FIG. 5A and the modification is preceded by an interpolation correction block 124. As illustrated in FIG. 5A, the interpolation correction is done between the preceding gain values g[k−1], g[k] and again factor g[k+1] of the next block following the current block.

Furthermore, as stated, the multiplier 125 is controlled by a gain compensation block 126 being controlled, on the one hand, by beta_factor 500 and, on the other hand, by the gain factor g[k] 104 for the current block. Particularly, the beta_factor is used to calculate the actual modification applied by multiplier 125 indicated as 1/gc[k] from the gain factor g[k] associated with the current block.

Thus, the beta_factor accounts for an additional attenuation of transients which is approximately modeled by this beta_factor, where this additional attenuation of transient events is a side effect of either an encoder or a decoder that operates before the post-processor illustrated in FIG. 5A.

The pre-processing and post-processing are applied by splitting the input signal into a low-pass (LP) part and a high-pass (HP) part. This can be accomplished: a) by using FFT to compute the LP part or the HP part, b) by using a zero-phase FIR filter to compute the LP part or the HP part, or c) by using an IIR filter applied in both directions, achieving zero-phase, to compute the LP part or the HP part. Given the LP part or the HP part, the other part can be obtained by simple subtraction in time domain. A time-dependent scalar gain is applied to the HP part, which is added back to the LP part to create the pre-processed or post-processed output.

Figure 9A:
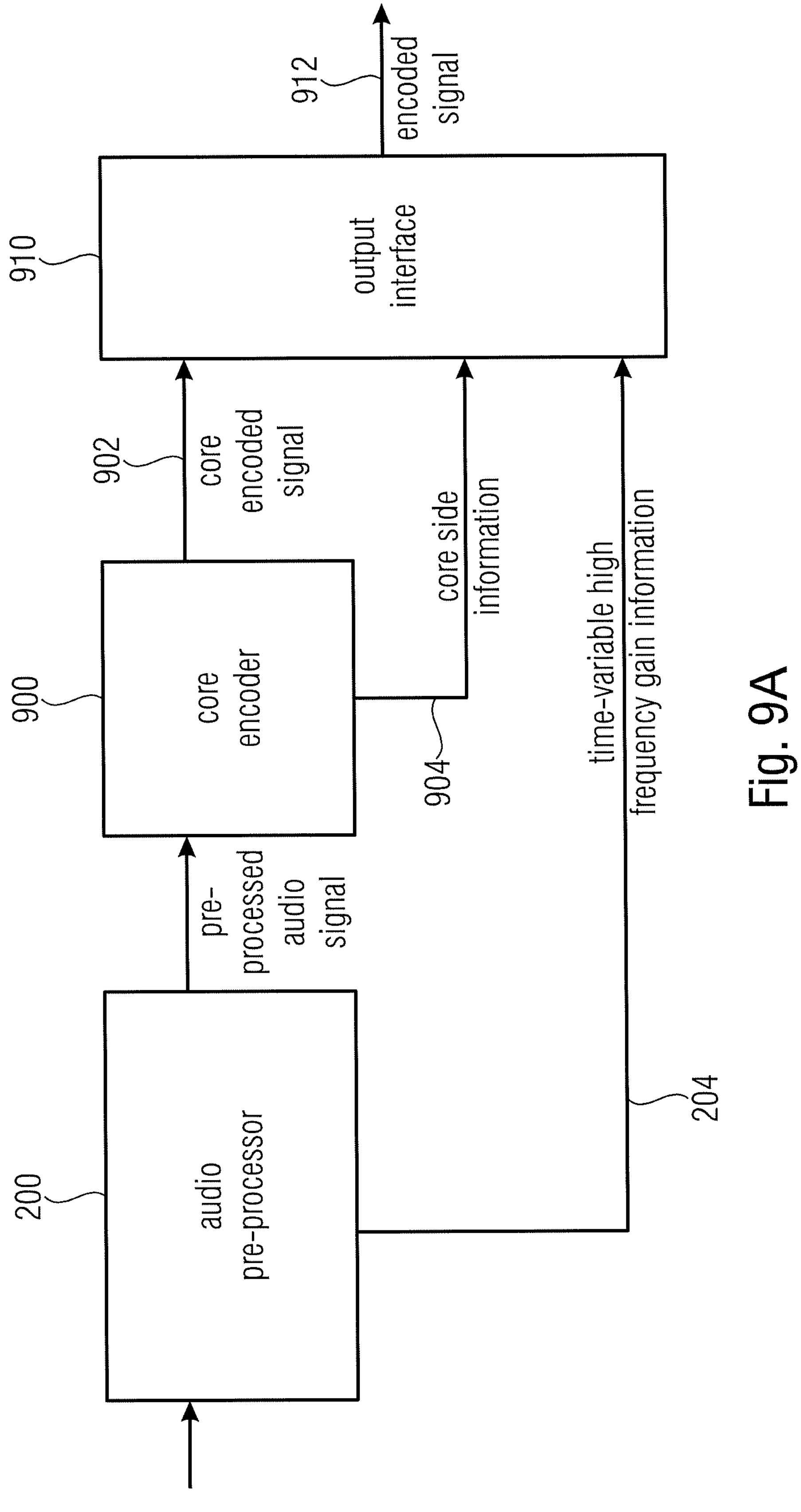
FIG. 9A illustrates an audio encoding apparatus with an audio pre-processor in accordance with an embodiment.
Figure 9B:
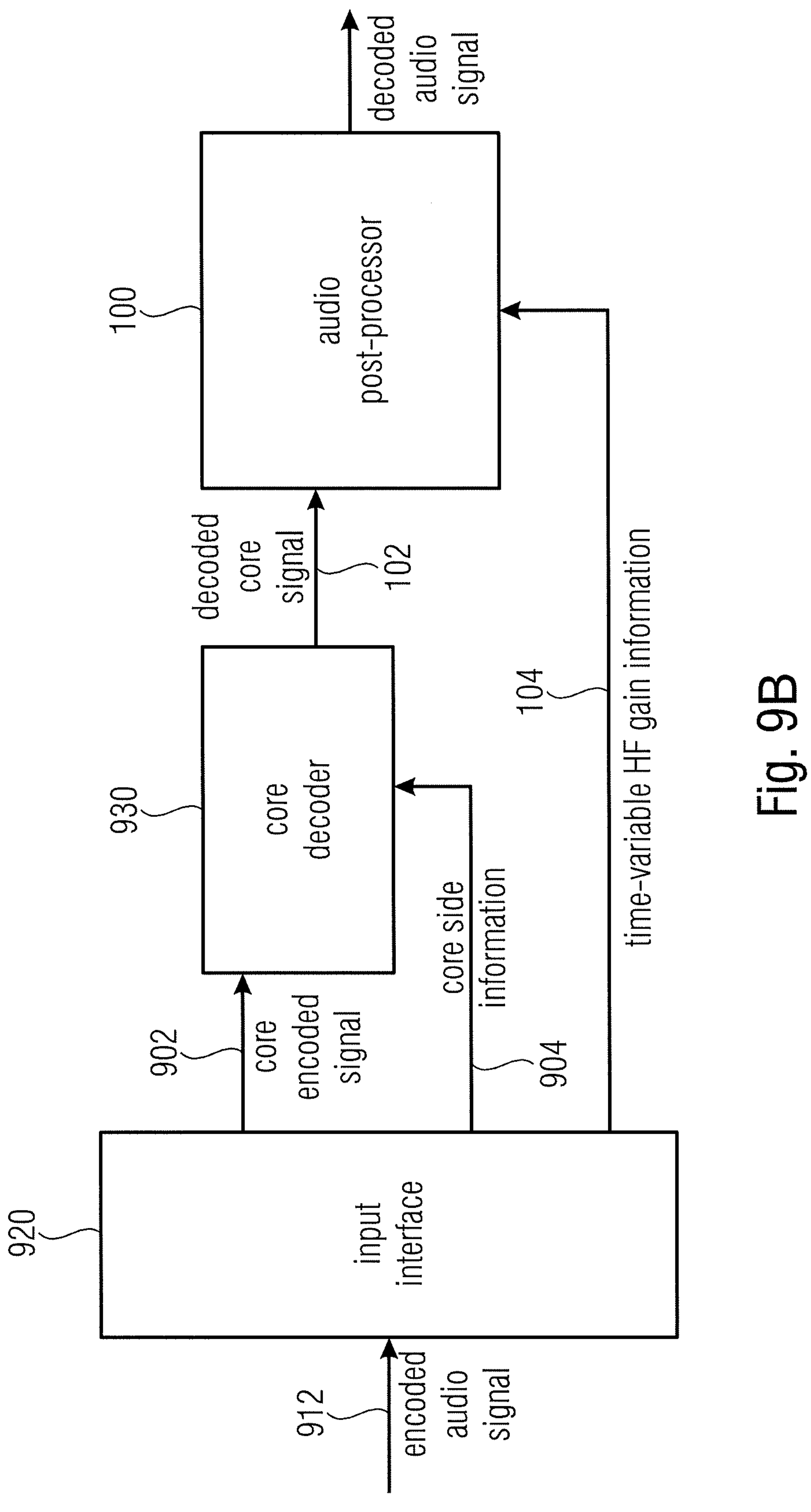
FIG. 9B illustrates an audio decoding apparatus comprising an audio post-processor.
Figure 9C:
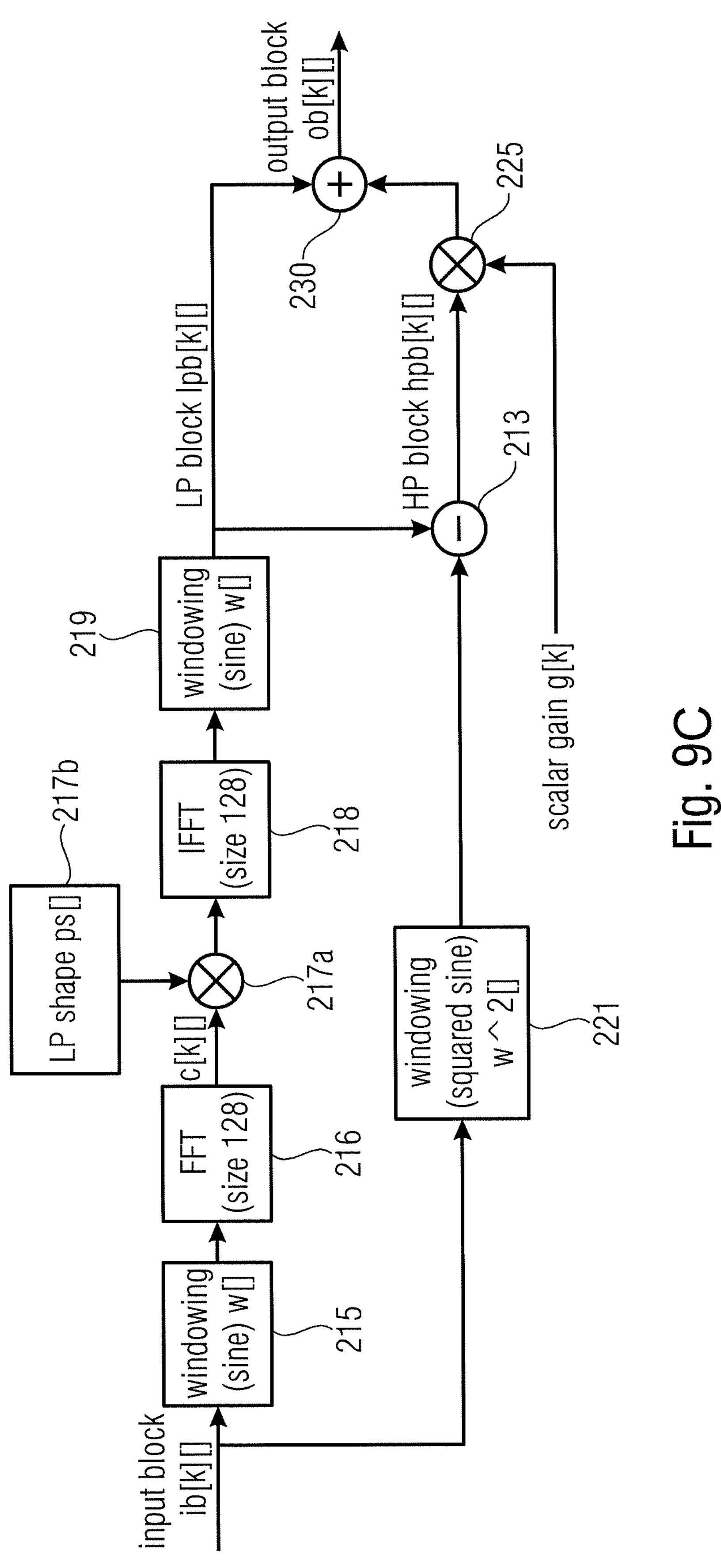
FIG. 9C illustrates an implementation of an audio pre-processor.

Splitting the Signal Into a LP Part and a HP Part Using FFT (FIGS. 5A, 9C)

In the proposed implementation, the FFT is used to compute the LP part. Let the FFT transform size be N, in particular N=128. The input signal s is split into blocks of size N, which are half-overlapping, producing input blocks $$ib[k][i] = s\left[k \times \frac{N}{2} + i\right],$$

where k is the block index and i is the sample position in the block k. A window w[i] is applied (115, 215) to ib[k], in particular the sine window, defined as $$w[i] = \sin\frac{\pi(i+0.5)}{N}, \text{ for } 0 \le i < N,$$

and after also applying FFT (116, 216), the complex coefficients c[k][f] are obtained as $$c[k][f] = FFT(w[i] \times ib[k][i]), \text{ for } 0 \le f \le \frac{N}{2}.$$

On the encoder side (FIG. 9C) (217*a*), in order to obtain the LP part, an element-wise multiplication (217*a*) of c[k][f] with the processing shape ps[f] is applied, which consists of the following:

$$ps[f] = \begin{cases} 1, \text{ for } 0 \le f < \text{lp\_size} \\ 1 - \dfrac{f - \text{lp\_size} + 1}{\text{tr\_size} + 1}, \text{ for lp\_size} \le f < \text{lp\_size} + \text{tr\_size} \\ 0, \text{ for lp\_size} + \text{tr\_size} \le f \le \dfrac{N}{2} \end{cases}$$

The lp_size=lastFFTLine[sig]+1−transitionWidthLines[sig] parameter represents the width in FFT lines of the low-pass region, and the tr_size=transitionWidthLines[sig] parameter represents the width in FFT lines of the transition region. The shape of the proposed processing shape is linear, however any arbitrary shape can be used.

The LP block lpb[k] is obtained by applying IFFT (218) and windowing (219) again as $$lpb[k][i]=w[i]\times IFFT(ps[f]\times c[k][f]), \text{ for } 0\le i<N.$$

The above equation is valid for the encoder/pre-processor of FIG. 9C. For the decoder or post-processor, the adaptive processing shape rs[f] is used instead of ps[f].

The HP block hpb[k] is then obtained by simple subtraction (113, 213) in time domain as $$hpb[k][i]=in[k][i]\times w^2[i]-lpb[k][i], \text{ for } 0\le i<N.$$

The output block ob[k] is obtained by applying the scalar gain g[k] to the HP block as
(225) (230)

$$ob[k][i]=lpb[k][i]+g[k]\times hpb[k][i]$$

The output block ob[k] is finally combined using overlap-add with the previous output block ob[k−1] to create $$\frac{N}{2}$$

additional Tina' samples Tor the pre-processed output signal o as $$o\left[k\times\frac{N}{2}+j\right]=ob[k-1]\left[j+\frac{N}{2}\right]+ob[k][j], \text{ with } j=\left\{0, \cdots, \frac{N}{2}-1\right\}.$$

All processing is done separately for each input channel, which is indexed by sig.

Adaptive Reconstruction Shape on the Post-Processing Side (FIG. 5A)

On the decoder side, in order to get perfect reconstruction in the transition region, an adaptive reconstruction shape rs[f] (117*b*) in the transition region has to be used, instead of the processing shape ps[f] (217*b*) used at the encoder side, depending on the processing shape ps[f] and g[k] as $$rs[f]=1-(1-ps[f])\times\frac{g[k]}{1+(g[k]-1)\times(1-ps[f])}$$

In the LP region, both ps[f] and rs[f] are one, in the HP region both ps[f] and rs[f] are zero, they only differ in the transition region. Moreover, when g[k]=1, then one has rs[f]=ps[f].

The adaptive reconstruction shape can be deducted by ensuring that the magnitude of a FFT line in the transition region is restored after post-processing, which gives the relation $$(ps[f]+(1-ps[f])\times g[k])\times\left(rs[f]+(1-rs[f])\times\frac{1}{g[k]}\right)=1.$$

The processing is similar to the pre-processing side, except rs[f] is used instead of ps[f] as $$lpb[k][i]=w[i]\times IFFT(rs[f]\times c[k][f]), \text{ with } i=\{0, \ldots, N-1\}$$

and the output block ob[k][i] is computed using the inverse of the scalar gain g[k] as (125)

$$ob[k][i]=lpb[k][i]+\frac{1}{g[k]}\times hpb[k][i].$$

Interpolation Correction (124) on the Post-Processing Side (FIG. 5A)

The first half of the output block k contribution to the final pre-processed output is given by $$o\left[k\times\frac{N}{2}+j\right]=ob[k-1]\left[j+\frac{N}{2}\right]+ob[k][j], \text{ with } j=\left\{0, \cdots, \frac{N}{2}\right\}.$$

Therefore, the gains g[k−1] and g[k] applied on the pre-processing side are implicitly interpolated due to the windowing and overlap-add operations. The magnitude of each FFT line in the HP region is effectively multiplied in the time domain by the scalar factor $$g[k-1]\times w^2\left[j+\frac{N}{2}\right]+g[k]\times w^2[j].$$

Similarly, on the post-processing side, the magnitude of each FFT line in the HP region is effectively multiplied in the time domain by the factor $$\frac{1}{g[k-1]}\times w^2\left[j+\frac{N}{2}\right]+\frac{1}{g[k]}\times w^2[j].$$

In order to achieve perfect reconstruction, the product of the two previous terms, $$corr[j]=\left(g[k-1]\times w^2\left[j+\frac{N}{2}\right]+g[k]\times w^2[j]\right)\times\left(\frac{1}{g[k-1]}\times w^2\left[j+\frac{N}{2}\right]+\frac{1}{g[k]}\times w^2[j]\right),$$

which represents the overall time domain gain at position j for each FFT line in the HP region, should be normalized in the first half of the output block k as $$ob[k][j]=lpb[k][j]+\frac{1}{g[k]}\times hpb[k][j]\times\frac{1}{corr[j]}.$$

The value of corr[j] can be simplified and rewritten as $$corr[j] = 1 + \left(\frac{g[k-1]}{g[k]} + \frac{g[k]}{g[k-1]} - 2\right) \times w^2[j] \times (1 - w^2[j]), \quad \text{for } 0 \le j < \frac{N}{2}.$$

The second half of the output block k contribution to the final pre-processed output is given by $$o\left[(k+1) \times \frac{N}{2} + j\right] = ob[k]\left[j + \frac{N}{2}\right] + ob[k+1][j],$$

and the interpolation correction can be written based on the gains g[k] and g[k+1] as $$corr\left[j + \frac{N}{2}\right] = 1 + \left(\frac{g[k]}{g[k+1]} + \frac{g[k+1]}{g[k]} - 2\right) \times w^2[j] \times (1 - w^2[j]), \quad \text{for } 0 \le j < \frac{N}{2}.$$

The updated value for the second half of the output block k is given by $$ob[k]\left[j + \frac{N}{2}\right] = lpb[k]\left[j + \frac{N}{2}\right] + \frac{1}{g[k]} \times hpb[k]\left[j + \frac{N}{2}\right] \times \frac{1}{corr\left[j + \frac{N}{2}\right]}.$$

Gain Computation on the Pre-Processing Side (FIG. 9C)

At the pre-processing side, the HP part of block k, assumed to contain a transient event, is adjusted using the scalar gain g[k] in order to make it more similar to the background in its neighborhood. The energy of the HP part of block k will be denoted by hp_e[k] and the average energy of the HP background in the neighborhood of block k will be denoted by hp_bg_e[k].

The parameter $\alpha \in [0,1]$, which controls the amount of adjustment is defined as $$g_{float}[k] = \begin{cases} \frac{\alpha \times \text{hp\_bg\_e}[k] + (1-\alpha) \times \text{hp\_e}[k]}{\text{hp\_e}[k]}, & \text{when hp\_e}[k] \ge T_{quiet} \\ 1, & \text{otherwise} \end{cases},$$

The value of $g_{float}$[k] is quantized and clipped to the range allowed by the chosen value of the extendedGainRange configuration option to produce the gain index gainIdx[k][sig] as $$g_{idx} = [\log_2 (4 \times g_{float}[k]) + 0.5] + \text{GAIN\_INDEX\_0 dB},$$

$$\text{gain/Idx}[k][\text{sig}] = \min(\max(0, g_{idx}), 2 \times \text{GAIN\_INDEX\_0 dB} - 1).$$

The value g[k] used for the processing is the quantized value, defined at the decoder side as $$g[k] = 2^{\frac{gainIdx[k][sig] - GAIN\_INDEX\_0dB}{4}}.$$

When $\alpha$ is 0, the gain has value $g_{float}$[k]=1, therefore no adjustment is made, and when $\alpha$ is 1, the gain has value $g_{float}$[k]=hp_bg_e[k]/hp_e[k], therefore the adjusted energy is made to coincide with the average energy of the background. The above relation can be rewritten as $$g_{float}[k] \times \text{hp\_}e[k] = \text{hp\_bg\_}e[k] + (1-\alpha) \times (\text{hp\_}e[k] - \text{hp\_bg\_}e[k]),$$

indicating that the variation of the adjusted energy $g_{float}$[k]×hp_e[k] around the corresponding average energy of the background hp_bg_e[k] is reduced with a factor of $(1-\alpha)$. In the proposed system, $\alpha$=0.75 is used, thus the variation of the HP energy of each block around the corresponding average energy of the background is reduced to 25% of the original.

Gain Compensation (126) on the Post-Processing Side (FIG. 5A)

The core encoder and decoder introduce additional attenuation of transient events, which is approximately modeled by introducing an extra attenuation step, using the parameter $\beta \in [0, 1]$ depending on the core encoder configuration and the signal characteristics of the frame, as $$gc_{float}[k] = \frac{\beta \times \text{hp\_bg\_e}[k] + (1-\beta) \times [g_{float}[k] \times \text{hp\_e}[k]]}{\text{hp\_e}[k]}$$

indicating that, after passing through the core encoder and decoder, the variation of the decoded energy $gc_{float}$[k]×hp_e[k] around the corresponding average energy of the background hp_bg_e[k] is further reduced with an additional factor of $(1-\beta)$.

Using just g[k], $\alpha$, and $\beta$, it is possible to compute an estimate of gc[k] at the decoder side as $$gc[k] = \left(1 + \frac{\beta \times (1-\alpha)}{\alpha}\right) \times g[k] - \frac{\beta \times (1-\alpha)}{\alpha}$$

The parameter $$\text{beta\_factor} = \frac{\beta \times (1-\alpha)}{\alpha}$$

is quantized to betaFactorldx[sig] and transmitted as side information for each frame. The compensated gain gc[k] can be computed using beta_factor as $$gc[k] = (1 + \text{beta\_factor}) \times g[k] - \text{beta\_factor}$$

Meta Gain Control (MGC)

Applause signals of live concerts etc. usually do not only contain the sound of hand claps, but also crowd shouting, pronounced whistles and stomping of the audiences' feet. Often, the artist gives an announcement during applause or instrument (handling) sounds overlap with sustained applause. Here, existing methods of temporal envelope shaping like STP or GES might impair these non-applause components if activated at the very instant of the interfering sounds. Therefore, a signal classifier assures deactivation during such signals. HREP offers the feature of so-called Meta Gain Control (MGC). MGC is used to gracefully relax the perceptual effect of HREP processing, avoiding the necessity of very accurate input signal classification. With MGC, applauses mixed with ambience and interfering sounds of all kind can be handled without introducing unwanted artifacts.

As discussed before, an embodiment additionally has a control parameter 807 or, alternatively, the control parameter beta_factor indicated at 500 in FIG. 5A. Alternatively, or additionally, the individual factors alpha or beta as discussed before can be transmitted as additional side information, but it is advantageous to have the single control parameter beta_factor that consists of beta on the one hand and alpha on the other hand, where beta is the parameter between 0 and 1 and depends on the core encoder configuration and also optionally on the signal characteristics, and additionally, the factor alpha determines the variation of a high frequency part energy of each block around the corresponding average energy of the background, and alpha is also a parameter between 0 and 1. If the number of transients in one frame is very small, like 1-2, then TNS can potentially preserve them better, and as a result the additional attenuation through the encoder and decoder for the frame may be reduced. Therefore, an advanced encoder can correspondingly reduce beta_factor slightly to prevent over-amplification.

In other words, MGC currently modifies the computed gains g (denoted here by g_float[k]) using a probability-like parameter p, like g'=g^p, which squeezes the gains toward 1 before they are quantized. The beta_factor parameter is an additional mechanism to control the expansion of the quantized gains, however the current implementation uses a fixed value based on the core encoder configuration, such as the bitrate.

Beta_factor is determined by $\beta\times(1-\alpha)/\alpha$ and is advantageously calculated on the encoder-side and quantized, and the quantized beta_factor index betaFactorIdx is transmitted as side information once per frame in addition to the time-variable high frequency gain information g[k].

Particularly, the additional control parameter 807 such as beta or beta_factor 500 has a time resolution that is lower than the time resolution of the time-varying high frequency gain information or the additional control parameter is even stationary for a specific core encoder configuration or audio piece.

Advantageously, the high band processor, the band extractor and the combiner operate in overlapping blocks, wherein an overlap ranges between 40% and 60% of the block length and advantageously a 50% overlap range 321 is used.

In other embodiments or in the same embodiments, the block length is between 0.8 ms and 5.0 ms.

Furthermore, advantageously or additionally, the modification performed by the high band processor 120 is an time-dependent multiplicative factor applied to each sample of a block in time domain in accordance with g[k], additionally in accordance with the control parameter 500 and additionally in line with the interpolation correction as discussed in the context of block 124 of FIG. 5A.

Furthermore, a cutoff or corner frequency of the low frequency band is between ⅛ and ⅓ of a maximum frequency of the audio signal and advantageouslyequal to ⅙ of the maximum frequency of the audio signal.

Furthermore, the low pass shaper consisting of 117*b* and 117*a* of FIG. 5A in the embodiment is configured to apply the shaping function rs[f] that depends on the time-variable high frequency gain information for the corresponding block. An implementation of the shaping function rs[f] has been discussed before, but alternative functions can be used as well.

Furthermore, advantageously, the shaping function rs[f] additionally depends on a shaping function ps[f] used in an audio pre-processor 200 for modifying or attenuating a high frequency band of the audio signal using the time-variable high frequency gain information for the corresponding block. A specific dependency of rs[f] from ps[f] has been discussed before, with respect to FIG. 5A, but other dependencies can be used as well.

Furthermore, as discussed before with respect to block 124 of FIG. 5A, the modification for a sample of a block additionally depends on a windowing factor applied for a certain sample as defined by the analysis window function or the synthesis window function as discussed before, for example, with respect to the correction factor that depends on a window function w[j] and even more advantageously-from a square of a window factor w[j].

As stated before, particularly with respect to FIG. 3B, the processing performed by the band extractor, the combiner and the high band processor is performed in overlapping blocks so that a latter portion of an earlier block is derived from the same audio samples of the audio signal as an earlier portion of a later block being adjacent in time to the earlier block, i.e., the processing is performed within and using the overlapping range 321. This overlapping range 321 of the overlapping blocks 313 and 314 is equal to one half of the earlier block and the later block has the same length as the earlier block with respect to a number of sample values and the post-processor additionally comprises the overlap adder 140 for performing the overlap add operation as illustrated in FIG. 3C.

Particularly, the band extractor 110 is configured to apply the slope of splitting filter 111 between a stop range and a pass range of the splitting filter to a block of audio samples, wherein this slope depends on the time-variable high frequency gain information for the block of samples. A slope is given with respect to the slope rs[f] that depends on the gain information g[k] as defined before and as discussed in the context of FIG. 5A, but other dependencies can be useful as well.

Generally, the high frequency gain information advantageously has the gain values g[k] for a current block k, where the slope is increased stronger for a higher gain value compared to an increase of the slope for a lower gain value.

Figure 6A:
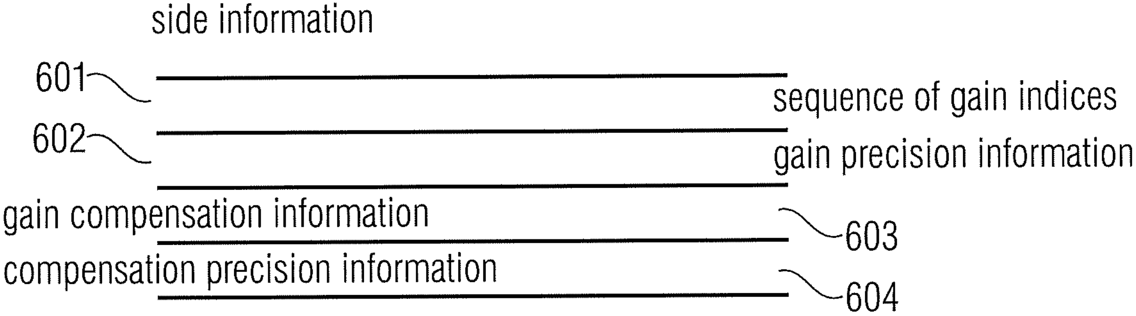
FIG. 6A illustrates an embodiment of the side information containing corresponding position information.
Figure 6B:
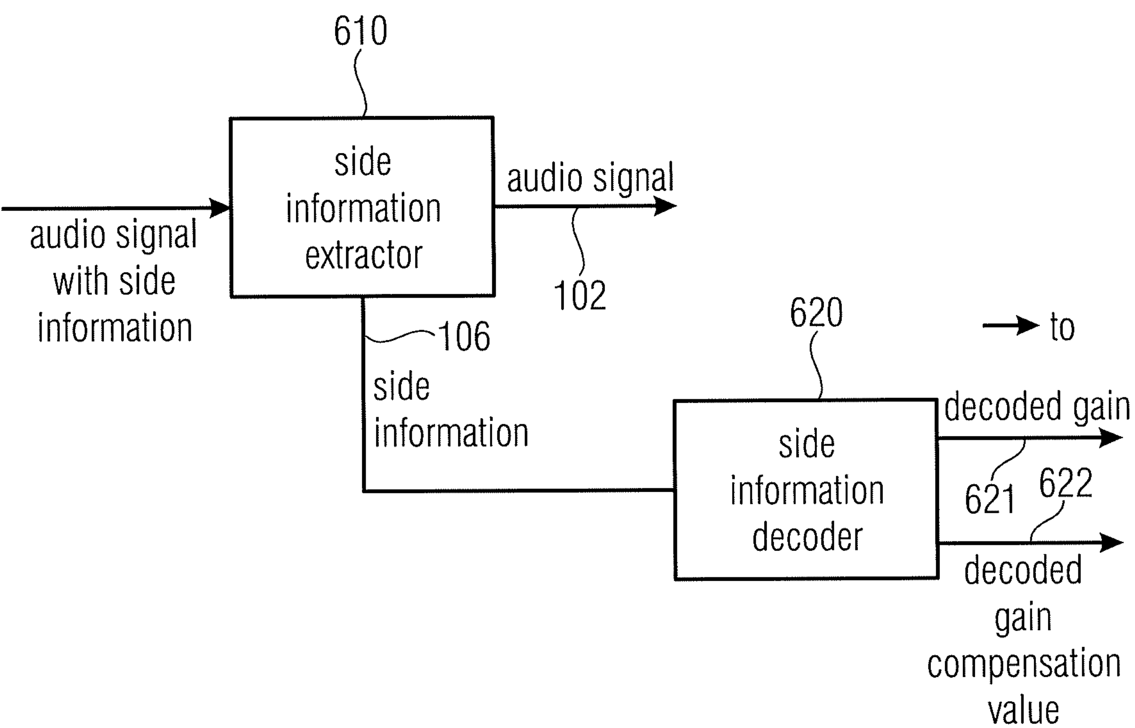
FIG. 6B illustrates a side information extractor combined with a side information decoder for an audio post-processor.

FIG. 6*a* illustrates a more detailed representation of the side information 106 of FIG. 3. Particularly, the side information comprises a sequence of gain indices 601, gain precision information 602, a gain compensation information 603 and a compensation precision information 604.

Advantageously, the audio post-processor comprises a side information extractor 610 for extracting the audio signal 102 and the side information 106 from an audio signal with side information and the side information is forwarded to a side information decoder 620 that generates and calculates a decoded gain 621 and/or a decoded gain compensation value 622 based on the corresponding gain precision information and the corresponding compensation precision information.

Particularly, the precision information determines a number of different values, where a high gain precision information defines a greater number of values that the gain index can have compared to a lower gain precision information indicating a lower number of values that a gain value can have.

Thus, a high precision gain information may indicate a higher number of bits used for transmitting a gain index compared to a lower gain precision information indicating a lower number of bits used for transmitting the gain information. The high precision information can indicate 4 bits (16 values for the gain information) and the lower gain information can be only 3 bits (8 values) for the gain quantization. Therefore, the gain precision information can, for example, be a simple flag indicated as "extendedGainRange". In the latter case. the configuration flag extendedGainRange does not indicate accuracy or precision information but whether the gains have a normal range or an extended range. The extended range contains all the values in the normal range and, in addition, smaller and larger values than are possible using the normal range. The extended range that can be used in certain embodiments potentially allows to apply a more intense pre-processing effect for strong transient events, which would be otherwise clipped to the normal range.

Similarly, for the beta factor precision, i.e., for the gain compensation precision information, a flag can be used as well, which outlines whether the beta_factor indices use 3 bits or 4 bits, and this flag may be termed extendedBetaFactorPrecision.

Advantageously, the FFT processor 116 is configured to perform a block-wise discrete Fourier transform with a block length of N sampling values to obtain a number of spectral values being lower than a number of N/2 complex spectral values by performing a sparse discrete Fourier transform algorithm, in which calculations of branches for spectral values above a maximum frequency are skipped, and the band extractor is configured to calculate the low frequency band signal by using the spectral values up to a transition start frequency range and by weighting the spectral values within the transition frequency range, wherein the transition frequency range only extends until the maximum frequency or a frequency being smaller than the maximum frequency.

Figure 15:
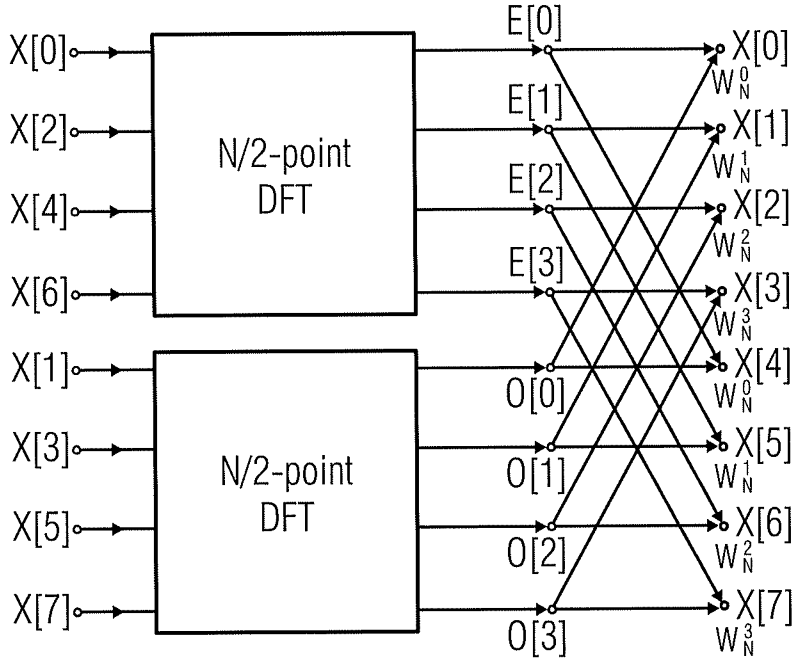
FIG. 15 illustrates an implementation of a sparse digital Fourier transform implementation.

This procedure is illustrated in FIG. 15, for example, where certain butterfly operations are illustrated. An example is given starting from N=8 point decimation-in-time radix-2 FFT topology, where only X(0) and X(1) are needed for further processing; consequently, E(2) and E(3) and O(2) and O(3) are not needed. Next, imagine both N/2 point DFTs being further subdivided into two N/4 point DFT and subsequent butterflies each. Now one can repeat the above described omission in an analogous way as illustrated in FIG. 15.

Subsequently, the audio pre-processor 200 is discussed in more detail with respect to FIG. 7.

The audio pre-processor 200 comprises a signal analyzer 260 for analyzing the audio signal 202 to determine a time-variable high frequency gain information 204.

Additionally, the audio pre-processor 200 comprises a band extractor 210 for extracting a high frequency band 212 of the audio signal 202 and a low frequency band 214 of the audio signal 202. Furthermore, a high band processor 220 is provided for performing a time-variable modification of the high frequency band 212 in accordance with the time-variable high frequency gain information 204 to obtain a processed high frequency band 222.

The audio pre-processor 200 additionally comprises a combiner 230 for combining the processed high frequency band 222 and the low frequency band 214 to obtain a pre-processed audio signal 232. Additionally, an output interface 250 is provided for generating an output signal 252 comprising the pre-processed audio signal 232 and the time-variable high frequency gain information 204 as side information 206 corresponding to the side information 106 discussed in the context of FIG. 3.

Figure 8A:
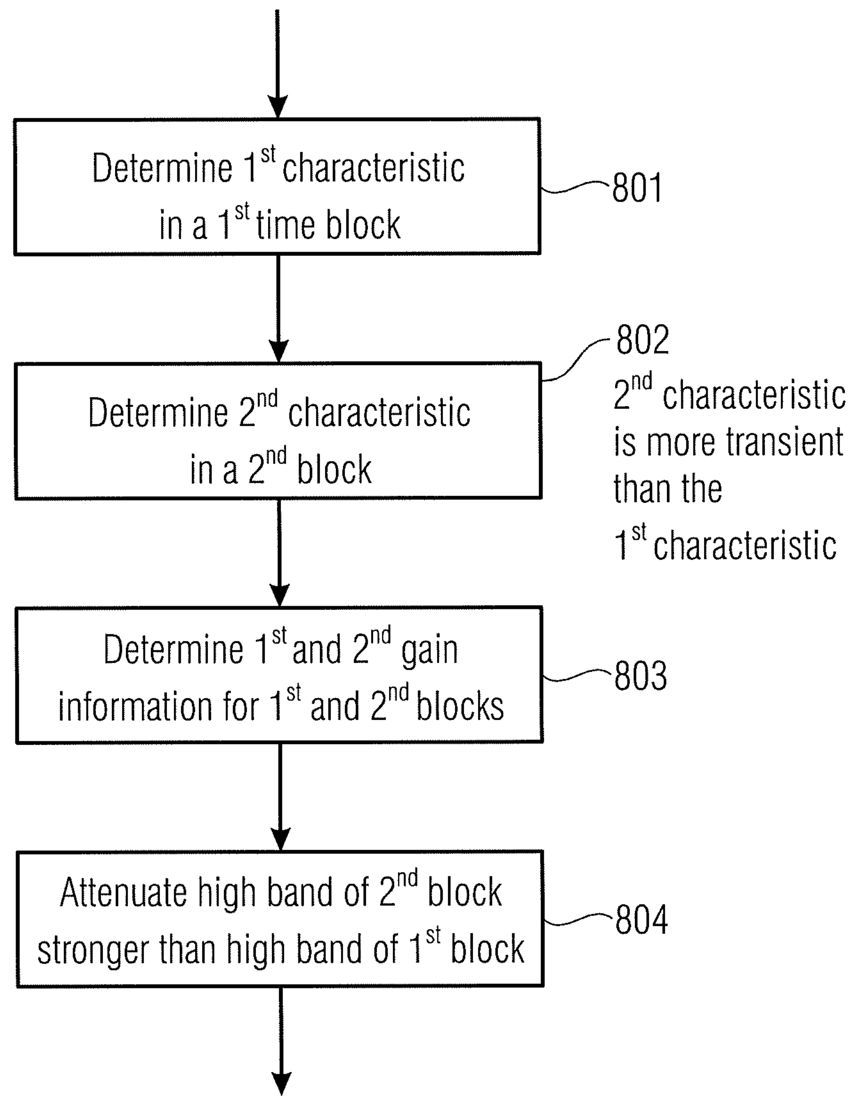
FIG. 8A illustrates a flow chart of steps performed by the audio pre-processor.

Advantageously, the signal analyzer 260 is configured to analyze the audio signal to determine a first characteristic in a first time block 301 as illustrated by block 801 of FIG. 8A and a second characteristic in a second time block 302 of the audio signal, the second characteristic being more transient than the first characteristic as illustrated in block 802 of FIG. 8A.

Furthermore, analyzer 260 is configured to determine a first gain information 311 for the first characteristic and a second gain information 312 for the second characteristic as illustrated at block 803 in FIG. 8A. Then, the high band processor 220 is configured to attenuate the high band portion of the second time block 302 in accordance with the second gain information stronger than the high band portion of the first time block 301 in accordance with the first gain information as illustrated in block 804 of FIG. 8A.

Figure 8B:
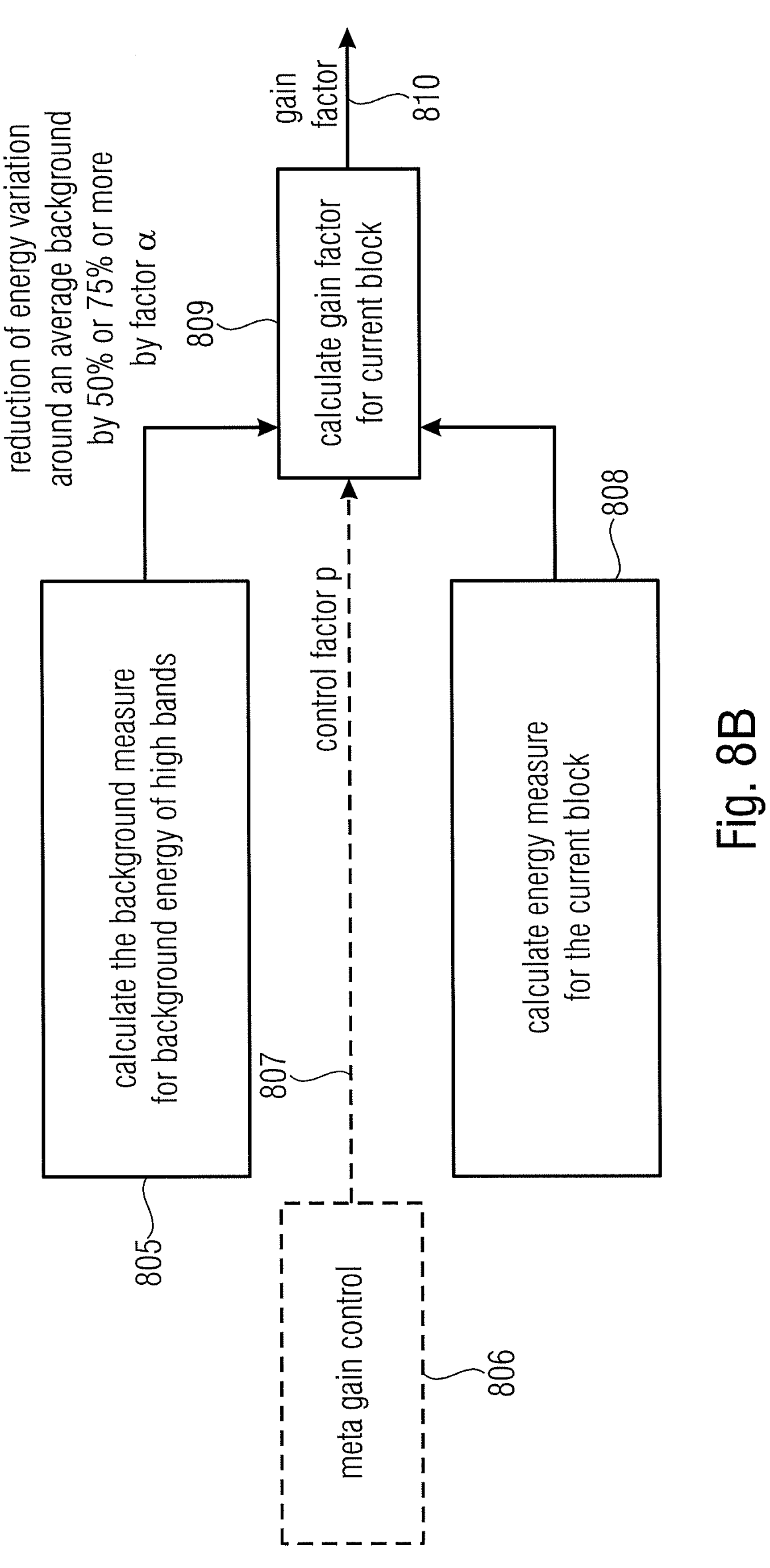
FIG. 8B illustrates a flow chart of steps performed by the signal analyzer of the audio pre-processor.

Furthermore, the signal analyzer 260 is configured to calculate the background measure for a background energy of the high band for one or more time blocks neighboring in time placed before the current time block or placed subsequent to the current time block or placed before and subsequent to the current time block or including the current time block or excluding the current time block as illustrated in block 805 of FIG. 8B. Furthermore, as illustrated in block 808, an energy measure for a high band of the current block is calculated and, as outlined in block 809, a gain factor is calculated using the background measure on the one hand, and the energy measure on the other hand. Thus, the result of block 809 is the gain factor illustrated at 810 in FIG. 8B.

Advantageously, the signal analyzer 260 is configured to calculate the gain factor 810 based on the equation illustrated before g_float, but other ways of calculation can be performed as well.

Furthermore, the parameter alpha influences the gain factor so that a variation of an energy of each block around a corresponding average energy of a background is reduced by at least 50% and advantageously by 75%. Thus, the variation of the high pass energy of each block around the corresponding average energy of the background is advantageously reduced to 25% of the original by means of the factor alpha.

Furthermore, the meta gain control block/functionality 806 is configured to generate a control factor p. In an embodiment, the MGC block 806 uses a statistical detection method for identifying potential transients. For each block (of e.g. 128 samples), it produces a probability-like "confidence" factor p between 0 and 1. The final gain to be applied to the block is g'=g^p, where g is the original gain. When p is zero, g'=1, therefore no processing is applied, and when p is one, g'=g, the full processing strength is applied.

MGC 806 is used to squeeze the gains towards 1 before quantization during pre-processing, to control the strength of the processing between no change and full effect. The parameter beta_factor (which is an improved parameterization of parameter beta) is used to expand the gains after dequantization during post-processing, and one possibility is to use a fixed value for each encoder configuration, defined by the bitrate.

In an embodiment, the parameter alpha is fixed at 0.75. Hence, factor □ is the reduction of energy variation around an average background, and it is fixed in the MPEG-H implementation to 75%. The control factor p in FIG. 8B serves as the probability-like "confidence" factor p.

Figure 8C:
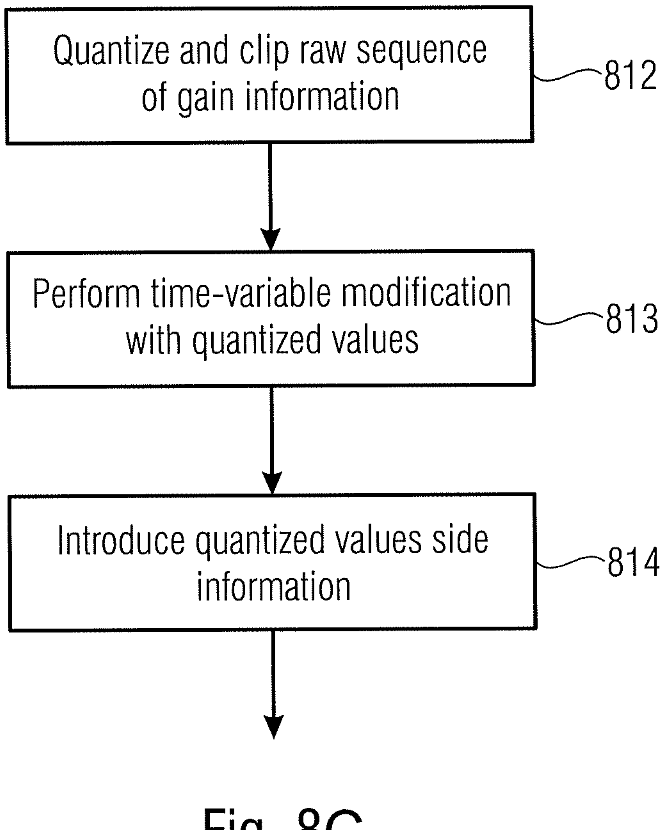
FIG. 8C illustrates a flow chart of procedures performed by the signal analyzer, the high band processor and the output interface of the audio pre-processor.
Figure 8D:
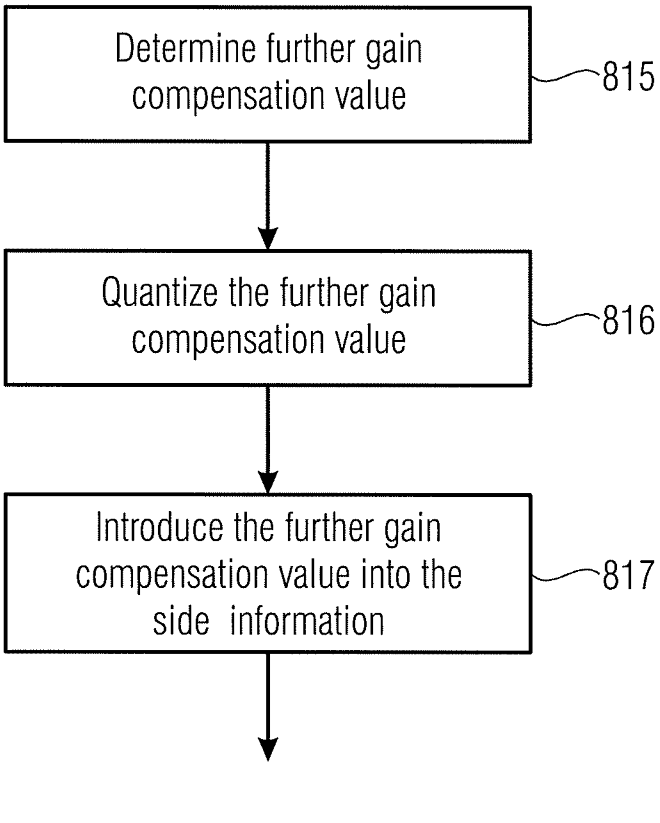
FIG. 8D illustrates a procedure performed by the audio pre-processor of FIG. 7.

As illustrated in FIG. 8C, the signal analyzer is configured to quantize and clip a raw sequence of gain information values to obtain the time-variable high frequency gain information as a sequence of quantized values, and the high band processor 220 is configured to perform the time-variable modification of the high band in accordance with the sequence of quantized values rather than the non-quantized values.

Furthermore, the output interface 250 is configured to introduce the sequence of quantized values into the side information 206 as the time-variable high frequency gain information 204 as illustrated in FIG. 8C at block 814.

Furthermore, the audio pre-processor 200 is configured to determine 815 a further gain compensation value describing a loss of an energy variation introduced by a subsequently connected encoder or decoder, and, additionally, the audio pre-processor 200 quantizes 816 this further gain compensation information and introduces 817 this quantized further gain compensation information into the side information and, additionally, the signal analyzer is advantageouslyconfigured to apply Meta Gain Control in a determination of the time-variable high frequency gain information to gradually reduce or gradually enhance an effect of the high band processor on the audio signal in accordance with additional control data 807.

Advantageously, the band extractor 210 of the audio pre-processor 200 is implemented in more detail as illustrated in FIG. 4, or in FIG. 9C. Therefore, the band extractor 210 is configured to extract the low frequency band using a low pass filter device 111 and to extract a high frequency band by subtracting 113 the low frequency band from the audio signal in exactly the same way as has been discussed previously with respect to the post-processor device.

Furthermore, the band extractor 210, the high band processor 220 and the combiner 230 are configured to operate in overlapping blocks. The combiner 230 additionally comprises an overlap adder for calculating a post-processed portion by adding audio samples of a first block and audio samples of a second block in the block overlap range. Therefore, the overlap adder associated with the combiner 230 of FIG. 7 may be implemented in the same way as the overlap adder for the post-processor illustrated in FIG. 3C at reference numeral 130.

In an embodiment, for the audio pre-processor, the overlap range 320 is between 40% of a block length and 60% of a block length. In other embodiments, a block length is between 0.8 ms and 5.0 ms and/or the modification performed by the high band processor 220 is a multiplicative factor applied to each sample of a block in a time domain so that the result of the whole pre-processing is a signal with a reduced transient nature.

In a further embodiment, a cutoff or corner frequency of the low frequency band is between ⅛ and ⅓ of the maximum frequency range of the audio signal 202 and advantageouslyequal to ⅙ of the maximum frequency of the audio signal.

As illustrated, for example, in FIG. 9C and as has also been discussed with respect to the post-processor in FIG. 4, the band extractor 210 comprises an analysis windower 215 for generating a sequence of blocks of sampling values of the audio signal using an analysis window, wherein these blocks are time-overlapping as illustrated at 321 in FIG. 3B. Furthermore, a discrete Fourier transform processor 216 for generating a sequence of blocks of spectral values is provided and also a subsequently connected low pass shaper 217*a*, 217*b* is provided, for shaping each block of spectral values to obtain a sequence of low pass shaped blocks of spectral values. Furthermore, a discrete Fourier inverse transform processor 218 for generating a sequence of blocks of time domain sampling values is provided and, a synthesis windower 219 is connected to an output of the discrete Fourier inverse transform processor 218 for windowing the sequence of blocks for low pass time domain sampling values using a synthesis window.

Advantageously, the low pass shaper consisting of blocks 217*a*, 217*b* applies the low pass shape ps[f] by multiplying individual FFT lines as illustrated by the multiplier 217*a*. The low pass shape ps[f] is calculated as indicated previously with respect to FIG. 9C.

Additionally, the audio signal itself, i.e., the full band audio signal is also windowed using the audio signal windower 221 to obtain a sequence of windowed blocks of audio signal values, wherein this audio signal windower 221 is synchronized with the analysis windower 215 and/or the synthesis windower 219 so that the sequence of blocks of low pass time domain sampling values is synchronous with the sequence of window blocks of audio signal values.

Furthermore, the analyzer 260 of FIG. 7 is configured to additionally provide the control parameter 807, used to control the strength of the pre-processing between none and full effect, and 500, i.e., the beta_factor as a further side information, where the high band processor 220 is configured to apply the modification also under consideration of the additional control parameter 807, wherein the time resolution of the beta_factor parameter is lower than a time resolution of the time-varying high frequency gain information or the additional control parameter is stationary for a specific audio piece. As mentioned before, the probability-like control parameter from MGC is used to squeeze the gains towards 1 before quantization, and it is not explicitly transmitted as side information.

Furthermore, the combiner 230 is configured to perform a sample-wise addition of corresponding blocks of the sequence of blocks of low pass time domain sampling values and the sequence of modified, i.e., processed blocks of high pass time domain sampling values to obtain a sequence of blocks of combination signal values as illustrated, for the post-processor side, in FIG. 3C.

FIG. 9A illustrates an audio encoding apparatus for encoding an audio signal comprising the audio pre-processor 200 as discussed before that is configured to generate the output signal 252 having the time-variable high frequency gain information as side information. Furthermore, a core encoder 900 is provided for generating a core encoded signal 902 and a core side information 904. Additionally, the audio encoding apparatus comprises an output interface 910 for generating an encoded signal 912 comprising the core encoded signal 902, the core side information 904 and the time-variable high frequency gain information as additional side information 106.

Figure 10A:
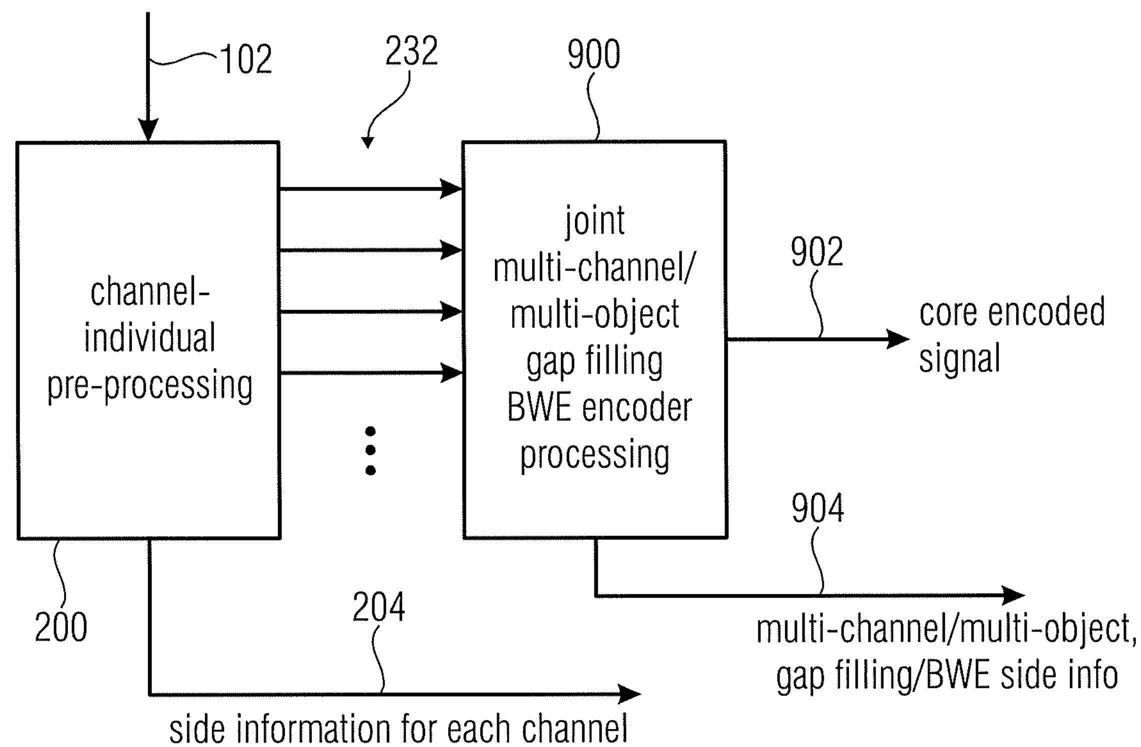
FIG. 10A illustrates an audio encoding apparatus with a multi-channel/multi-object functionality.

Advantageously, the audio pre-processor 200 performs a pre-processing of each channel or each object separately as illustrated in FIG. 10A. In this case, the audio signal is a multichannel or a multi-object signal. In a further embodiment, illustrated in FIG. 5C, the audio pre-processor 200 performs a pre-processing of each SAOC transport channel or each High Order Ambisonics (HOA) transport channel separately as illustrated in FIG. 10A. In this case, the audio signal is a spatial audio object transport channel or a High Order Ambisonics transport channel.

Contrary thereto, the core encoder 900 is configured to apply a joint multichannel encoder processing or a joint multi-object encoder processing or an encoder gap filling or an encoder bandwidth extension processing on the pre-processed channels 232.

Thus, typically, the core encoded signal 902 has less channels than were introduced into the joint multichannel/multi-object core encoder 900, since the core encoder 900 typically comprises a kind of a downmix operation.

An audio decoding apparatus is illustrated in FIG. 9B. The audio decoding apparatus has an audio input interface 920 for receiving the encoded audio signal 912 comprising a core encoded signal 902, core side information 904 and the time-variable high frequency gain information 104 as additional side information 106. Furthermore, the audio decoding apparatus comprises a core decoder 930 for decoding the core encoded signal 902 using the core side information 904 to obtain the decoded core signal 102. Additionally, the audio decoding apparatus has the post-processor 100 for post-processing the decoded core signal 102 using the time-variable high frequency gain information 104.

Figure 10B:
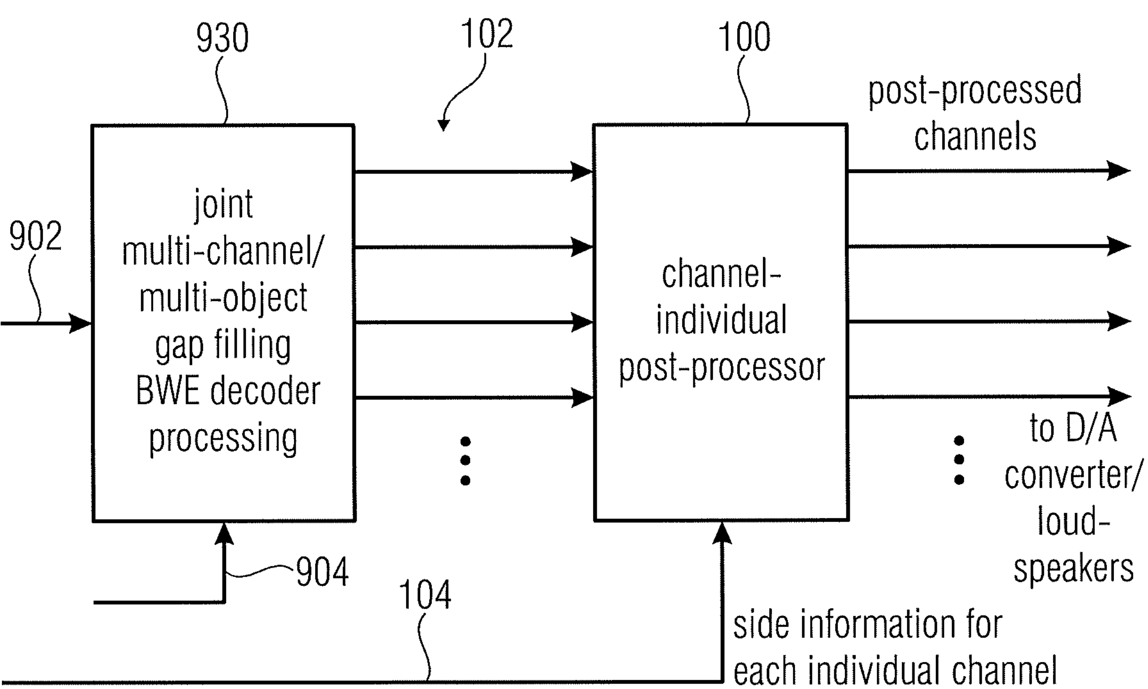
FIG. 10B illustrates an audio decoding apparatus with a multi-channel/multi object functionality.
Figure 10C:
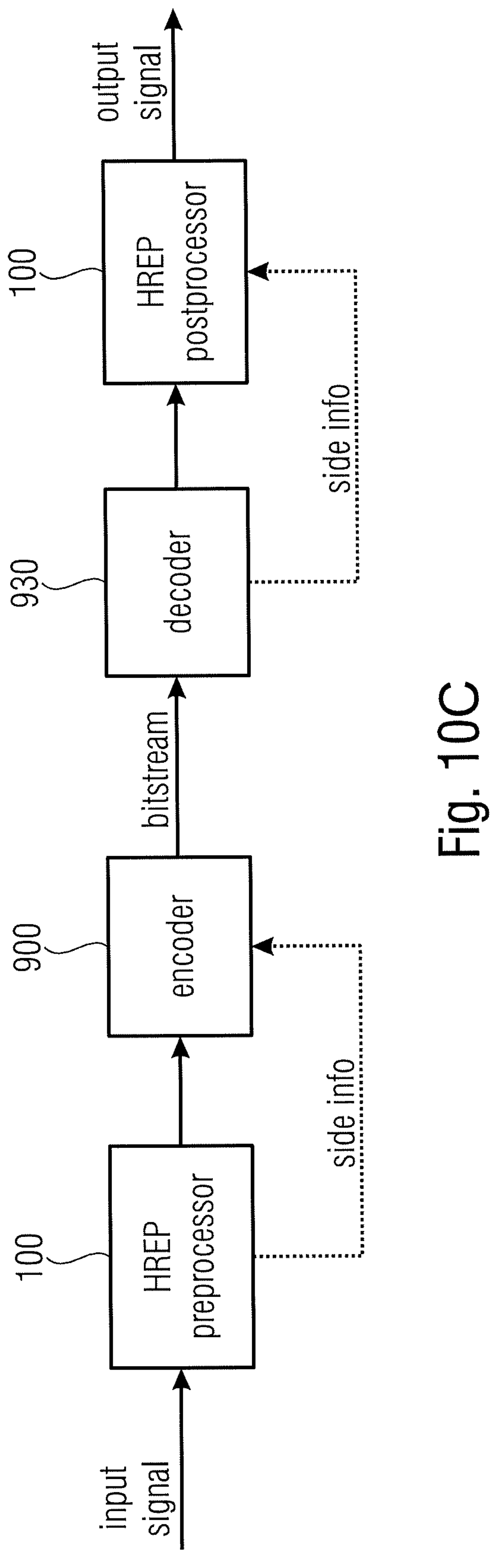
FIG. 10C illustrates a further implementation of an embedding of the pre-processor and the post-processor into an encoding/decoding chain.
Figure 11:
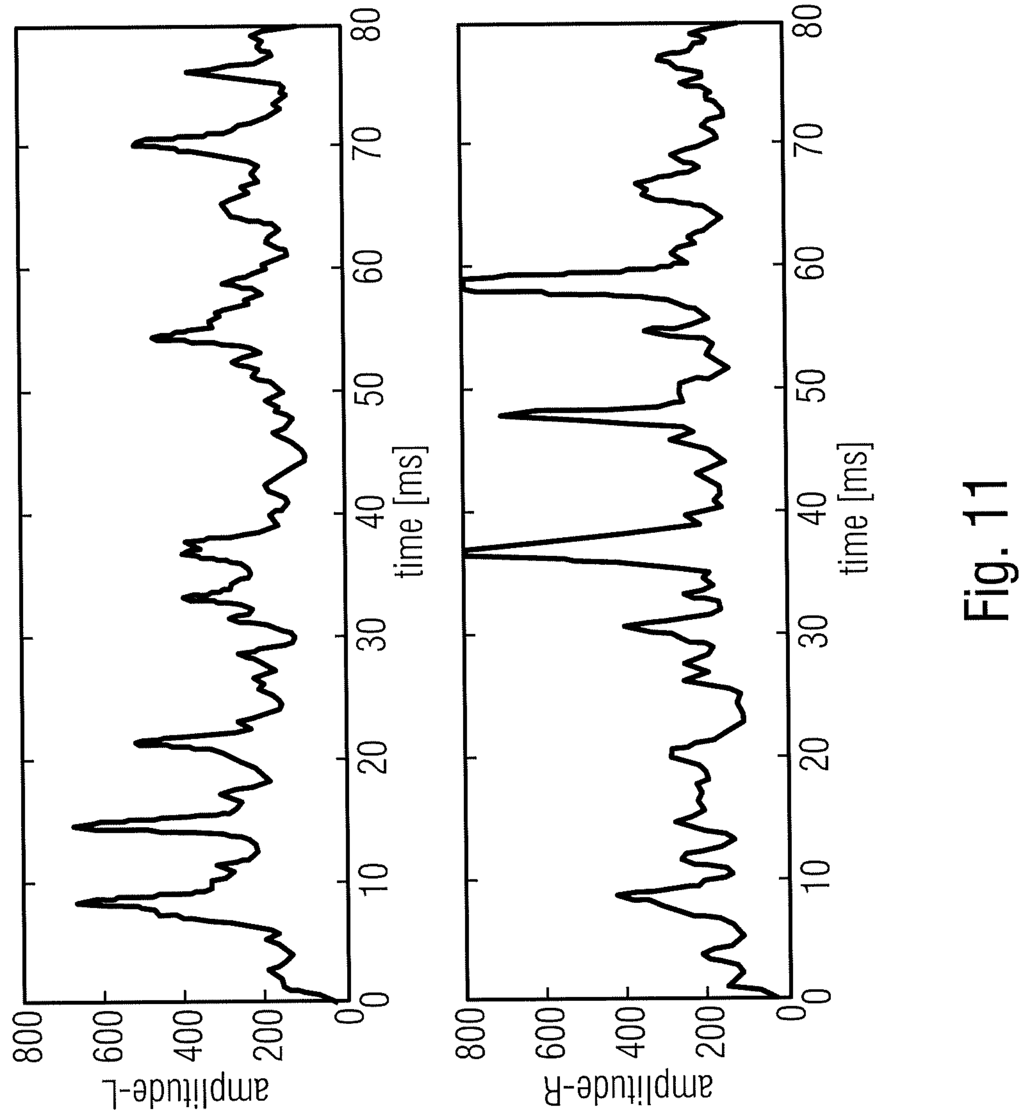
FIG. 11 illustrates a high frequency temporal envelope of a stereo applause signal.
Figure 12:
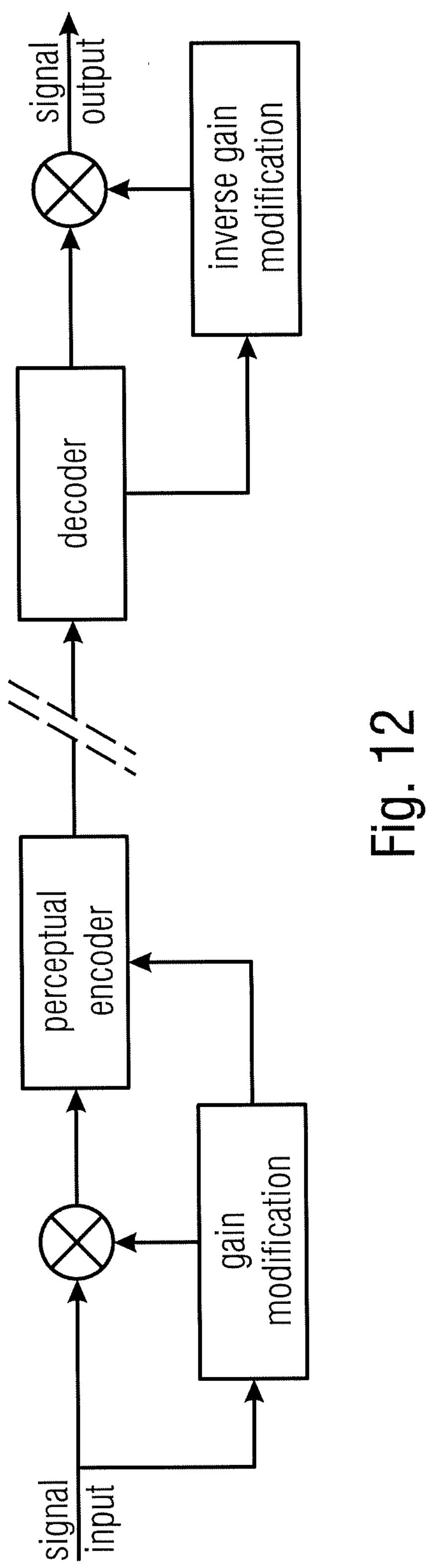
FIG. 12 illustrates a functionality of a gain modification processing.
Figure 13A:
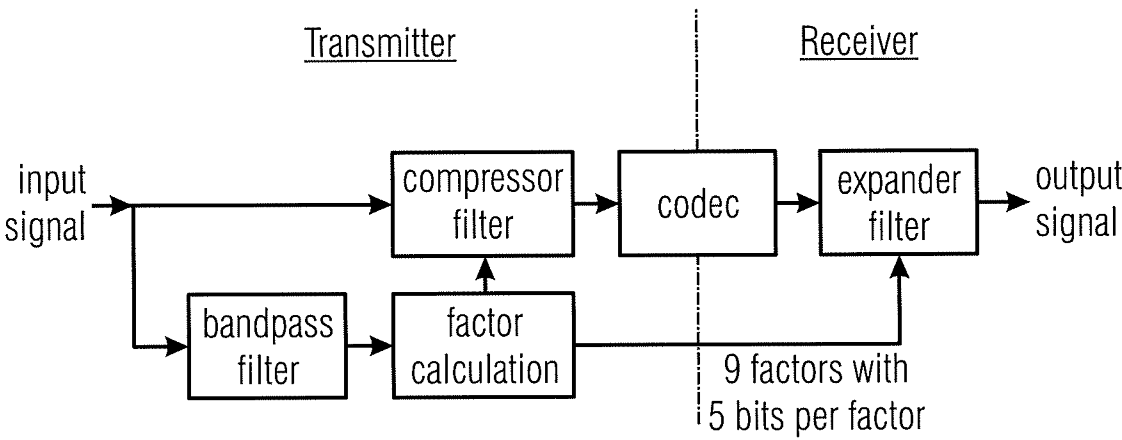
FIG. 13A illustrates a filter-based gain control processing.
Figure 13B:
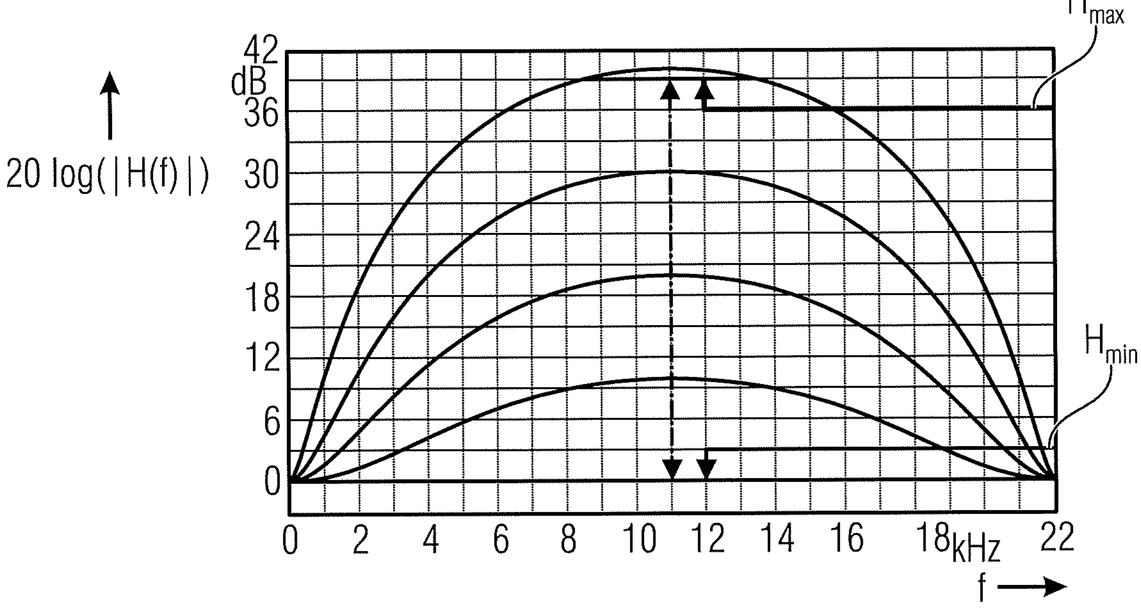
FIG. 13B illustrates different filter functionalities for the corresponding filter of FIG. 13A.
Figure 14:
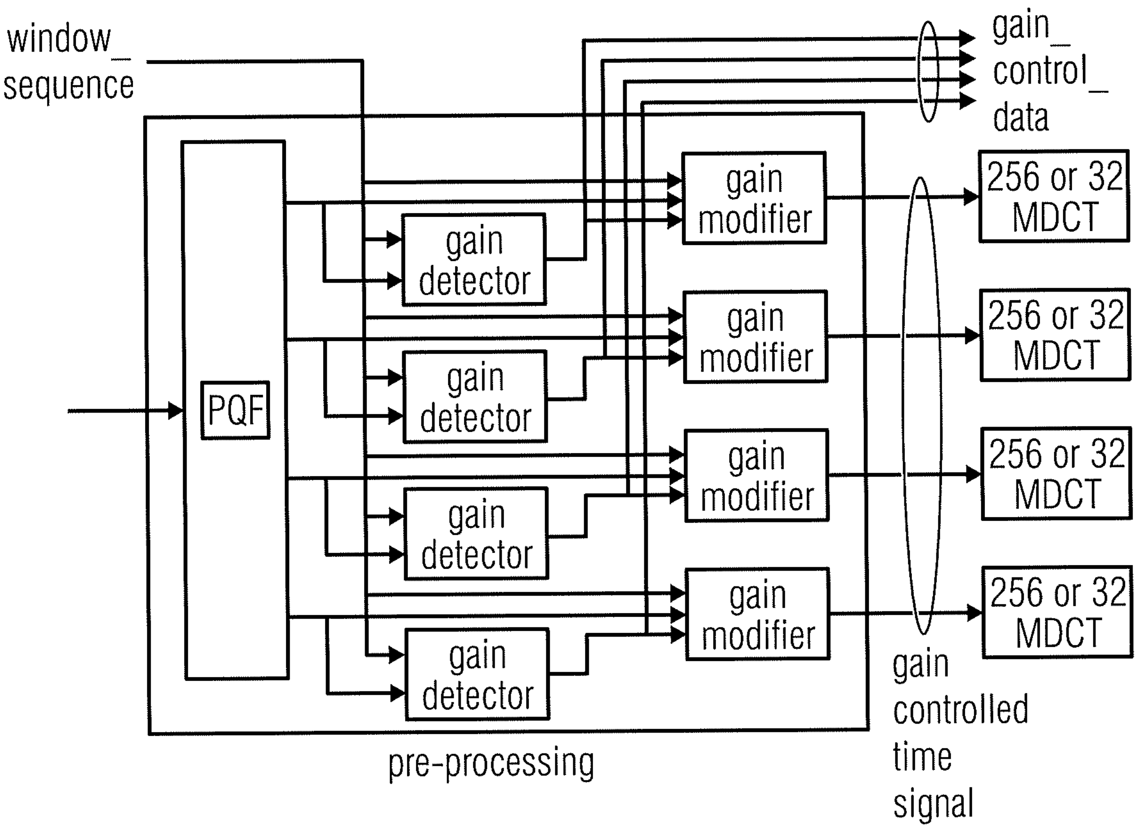
FIG. 14 illustrates a gain control with hybrid filter bank.

Advantageously, and as illustrated in FIG. 10B, the core decoder 930 is configured to apply a multichannel decoder processing or a multi-object decoder processing or a bandwidth extension decoder processing or a gap-filling decoder processing for generating decoded channels of a multichannel signal 102 or decoded objects of a multi-object signal 102. Thus, in other words, the joint decoder processor 930 typically comprises some kind of upmix in order to generate, from a lower number of channels in the encoded audio signal 902, a higher number of individual objects/channels. These individual channels/objects are input into a channel-individual post-processing by the audio post-processor 100 using the individual time-variable high frequency gain information for each channel or each object as illustrated at 104 in FIG. 10B. The channel-individual post-processor 100 outputs post-processed channels that can be output to a digital/analog converter and subsequently connected loudspeakers or that can be output to some kind of further processing or storage or any other suitable procedure for processing audio objects or audio channels.

FIG. 100 illustrates a situation similar to what has been illustrated in FIG. 9A or 9B, i.e., a full chain comprising of a high resolution envelope processing pre-processor 100 connected to an encoder 900 for generating a bitstream and the bitstream is decoded by the decoder 930 and the decoder output is post-processed by the high resolution envelope processor post-processor 100 to generate the final output signal.

FIG. 16 and FIGS. 17A to 17H illustrate listening test results for a 5.1 channel loudspeaker listening (128 kbps). Additionally, results for a stereo headphone listening at medium (48 kbps) and high (128 kbps) quality are provided. FIG. 16*a* summarizes the listening test setups. The results are illustrated in FIGS. 17A to 17H.

Figure 17A:
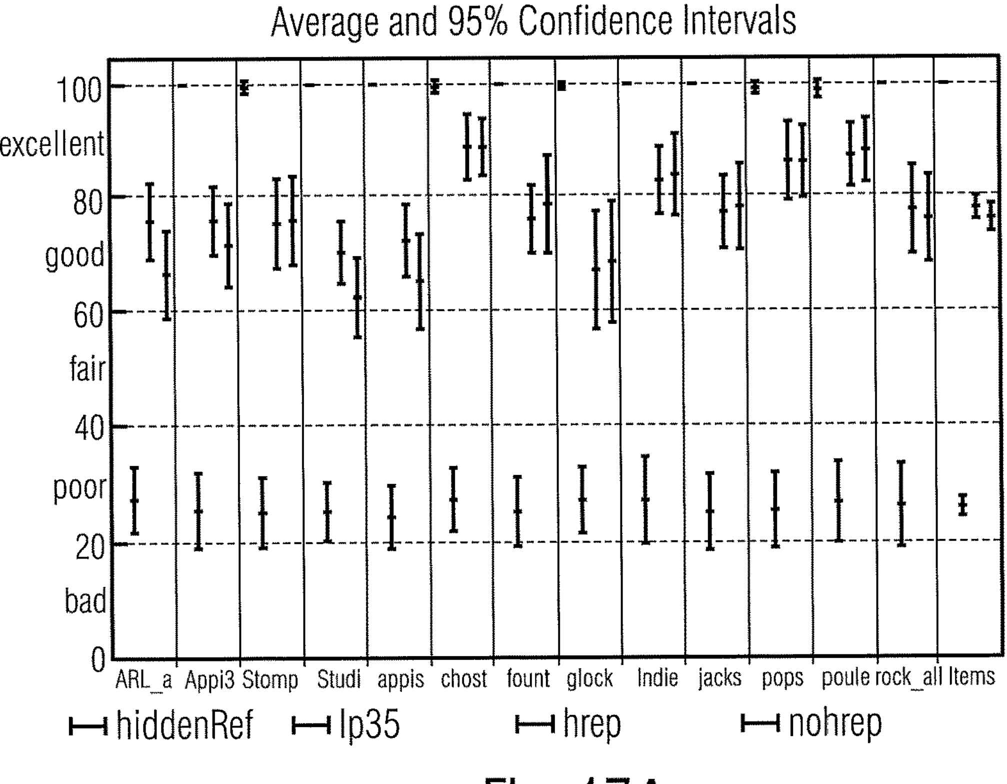
FIG. 17A illustrates absolute MUSHRA scores for 128 kbps 5.1ch test.

In FIG. 17A, the perceptual quality is in the "good" to "excellent" range. It is noted that applause-like signals are among the lowest-scoring items in the range "good".

Figure 17B:
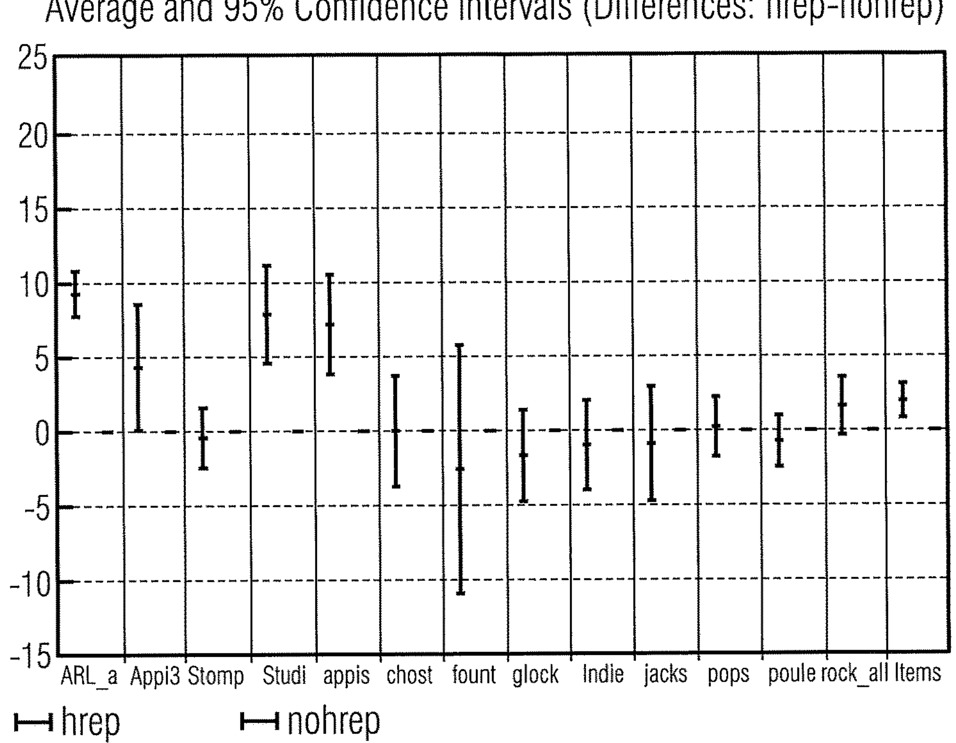
FIG. 17B illustrates different MUSHRA scores for 128 kbps 5.1ch test.

FIG. 17B illustrates that all applause items exhibit a significant improvement, whereas no significant change in perceptual quality is observed for the non-applause items. None of the items is significantly degraded.

Figure 17C:
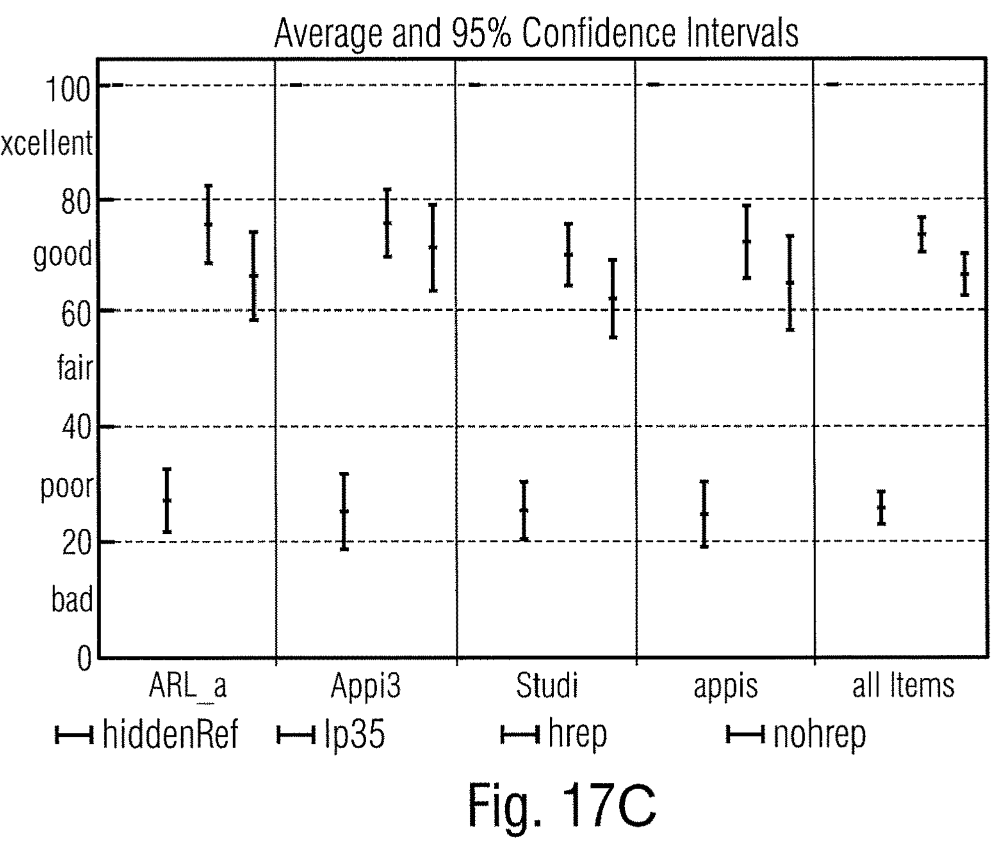
FIG. 17C illustrates absolute MUSHRA scores for 128 kbps 5.1ch test applause signals.
Figure 17D:
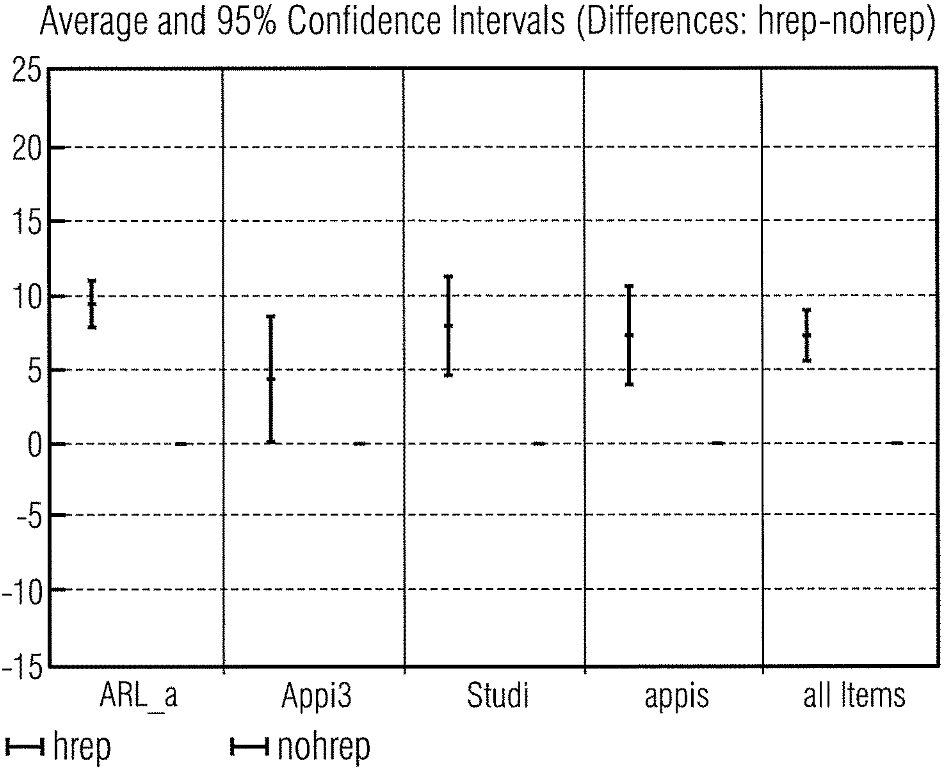
FIG. 17D illustrates different MUSHRA scores for 128 kbps 5.1ch test applause signals.

Regarding FIGS. 17C and 17D, it is outlined that the absolute perceptual quality is in the "good" range. In the differences, overall, there is a significant gain of seven points. Individual quality gains range between 4 and 9 points, all being significant.

Figure 17E:
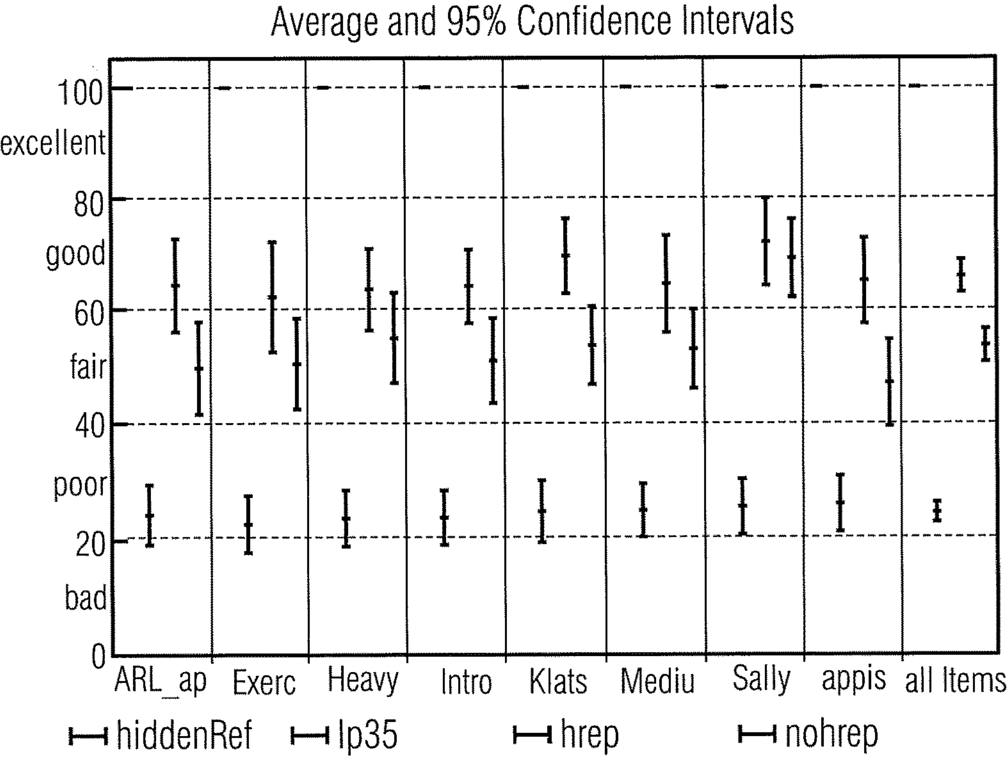
FIG. 17E illustrates absolute MUSHRA scores for 48 kbps stereo test.
Figure 17F:
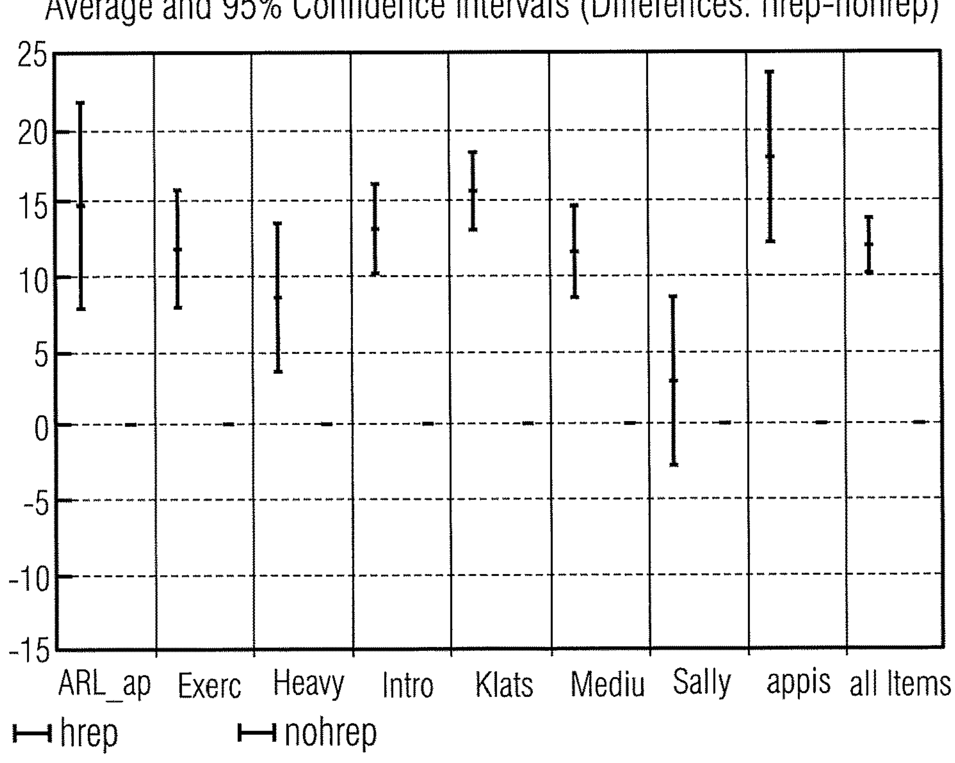
FIG. 17F illustrates different MUSHRA scores for 48 kbps stereo test.

In FIG. 17E, all signals of the test set are applause signals. The perceptual quality is in the "fair" to "good" range. Consistently, the "HREP" conditions score higher than the "NOHREP" condition. In FIG. 17F, it is visible that, for all items except one, "HREP" scores significantly better than "NOHREP". Improvements ranging from 3 to 17 points are observed. Overall, there is a significant average gain of 12 points. None of the items is significantly degraded.

Regarding FIGS. 17G and 17H, it is visible that, in the absolute scores, all signals score in the range "excellent". In the differences scores it can be seen that, even though perceptual quality is near transparent, for six out of eight signals there is a significant improvement of three to nine points overall amounting to a mean of five MUSHRA points. None of the items are significantly degraded.

The results clearly show that the HREP technology of the embodiments is of significant merit for the coding of applause-like signals in a wide range of bit rates/absolute qualities. Moreover, it is shown that there is no impairment whatsoever on non-applause signals. HREP is a tool for improved perceptual coding of signals that predominantly consist of many dense transient events, such as applause, rain sounds, etc. The benefits of applying HREP are two-fold: HREP relaxes the bit rate demand imposed on the encoder by reducing short-time dynamics of the input signal; additionally, HREP ensures proper envelope restoration in the decoder's (up-)mixing stage, which is all the more important if parametric multichannel coding techniques have been applied within the codec. Subjective tests have shown an improvement of around 12 MUSHRA points by HREP processing at 48 kbps stereo and 7 MUSHRA points at 128 kbps 5.1 channels.

Figure 5B:
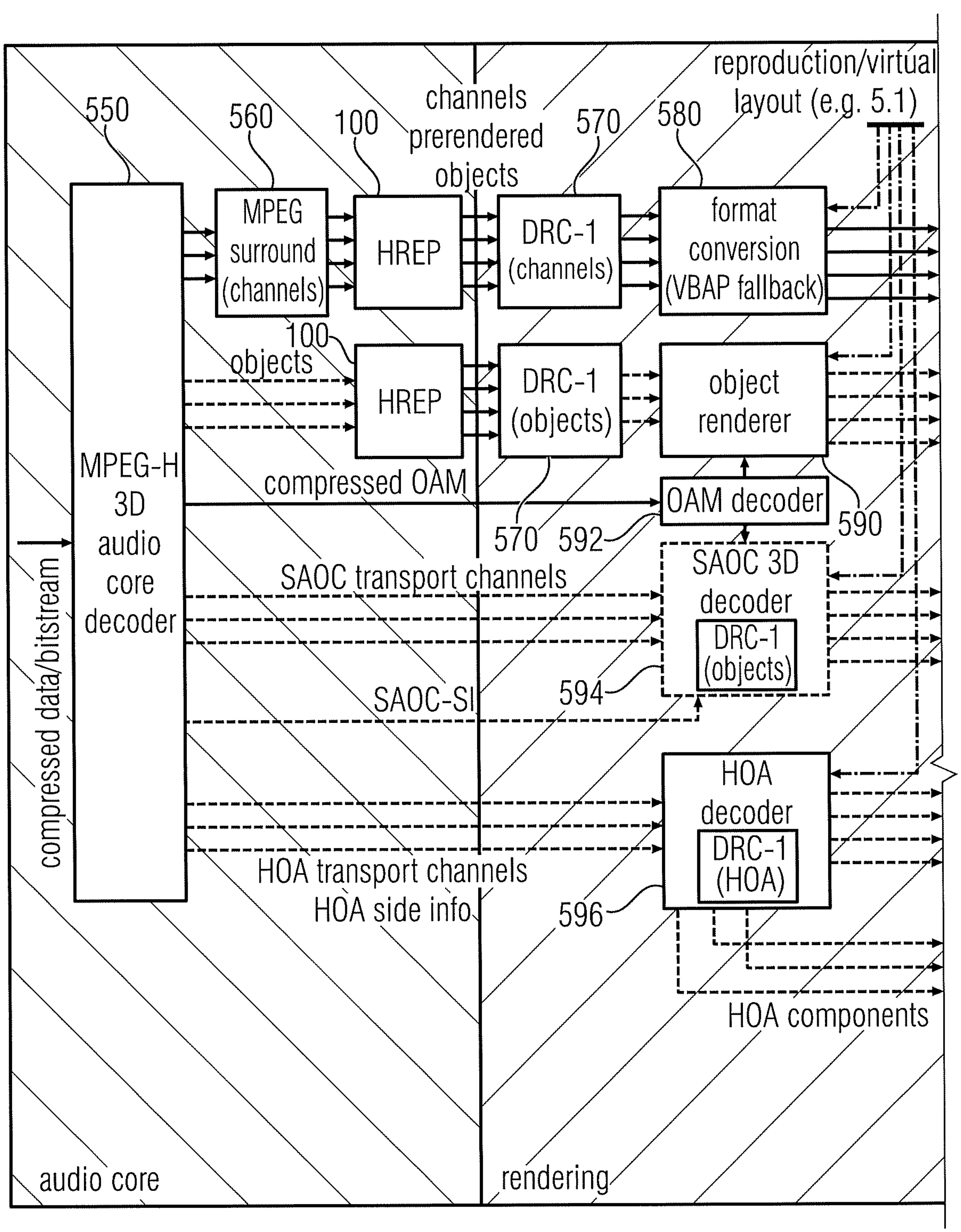
FIGS. 5B and 5C illustrates an embedding of the audio post-processor (HREP) in the framework of an MPEG-H 3D audio decoder.

Subsequently, reference is made to FIG. 5B illustrating the implementation of the post-processing on the one hand or the pre-processing on the other hand within an MPEG-H 3D audio encoder/decoder framework. Specifically, FIG. 5B illustrates the HREP post-processor 100 as implemented within an MPEG-H 3D audio decoder. Specifically, the inventive post-processor is indicated at 100 in FIG. 5B.

It is visible that the HREP decoder is connected to an output of the 3D audio core decoder illustrated at 550. Additionally, between element 550 and block 100 in the upper portion, an MPEG surround element is illustrated that, typically performs an MPEG surround-implemented upmix from base channels at the input of block 560 to obtain more output channels at the output of block 560.

Furthermore, FIG. 5B illustrates other elements in addition to the audio core portion. These are, in the audio rendering portion, a drc_1 570 for channels on the one hand and objects on the other hand. Furthermore, a former conversion block 580, an object renderer 590, an object metadata decoder 592, an SAOC 3D decoder 594 and a High Order Ambisonics (HOA) decoder 596 are provided.

All these elements feed a resampler 582 and the resampler feeds its output data into a mixer 584. The mixer either forwards its output channels into a loudspeaker feed 586 or a headphone feed 588, which represent elements in the "end of chain" and which represent an additional post-processing subsequent to the mixer 584 output.

Figure 5C:
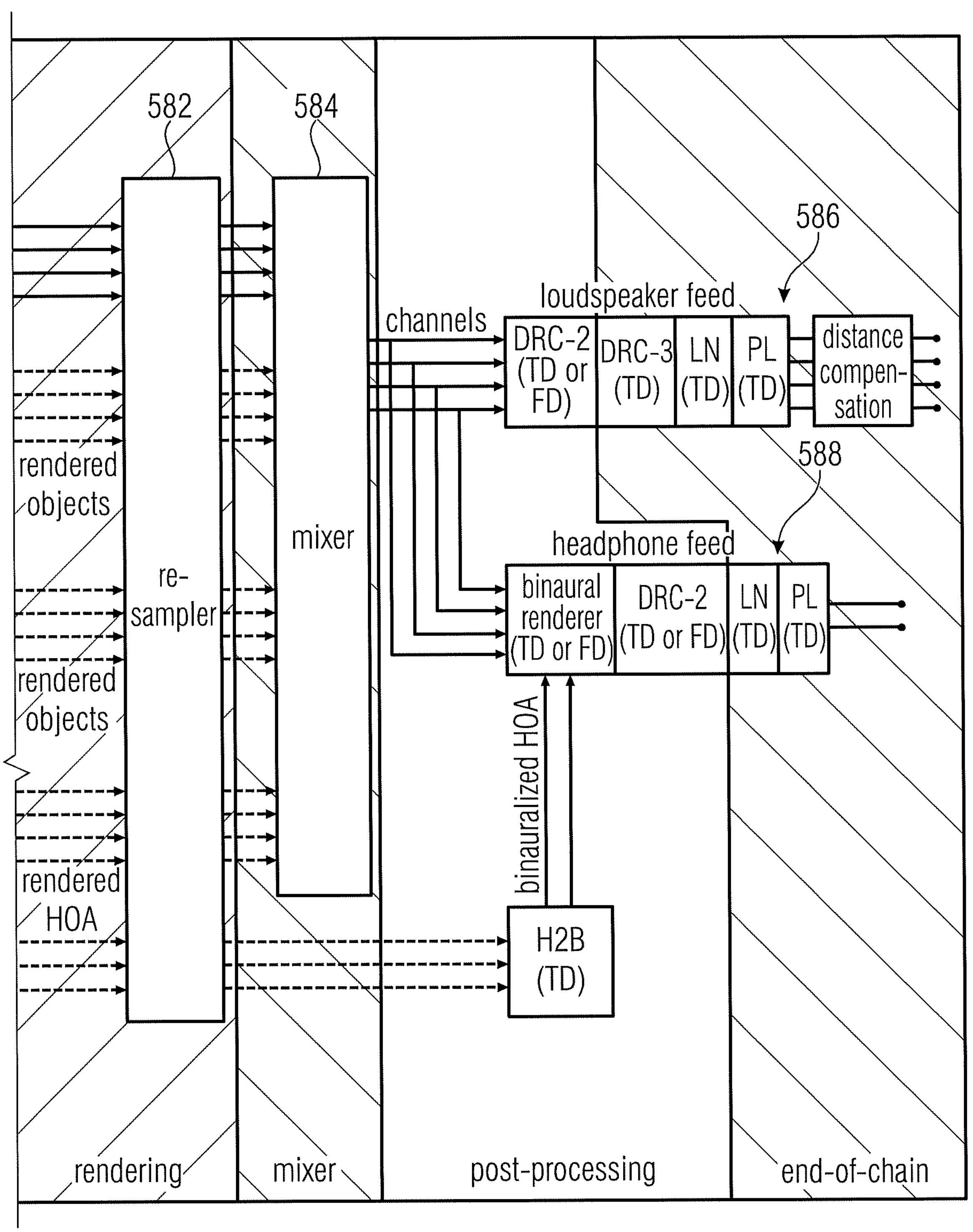
Figure 5D:
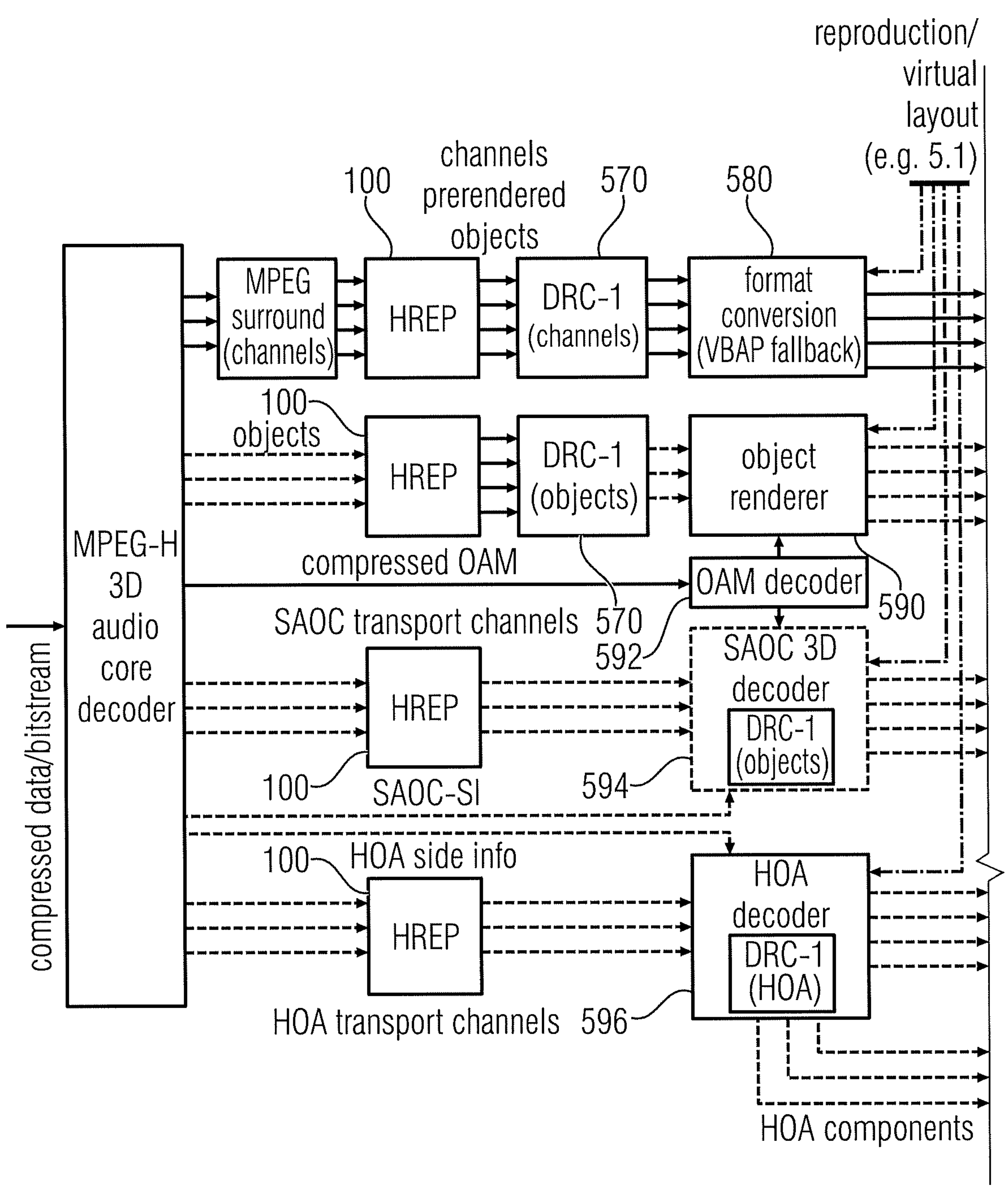
FIGS. 5D and 5E illustrates a further embedding of the audio post-processor (HREP) in the framework of an MPEG-H 3D audio decoder.
Figures 5E, 5G, 5H:
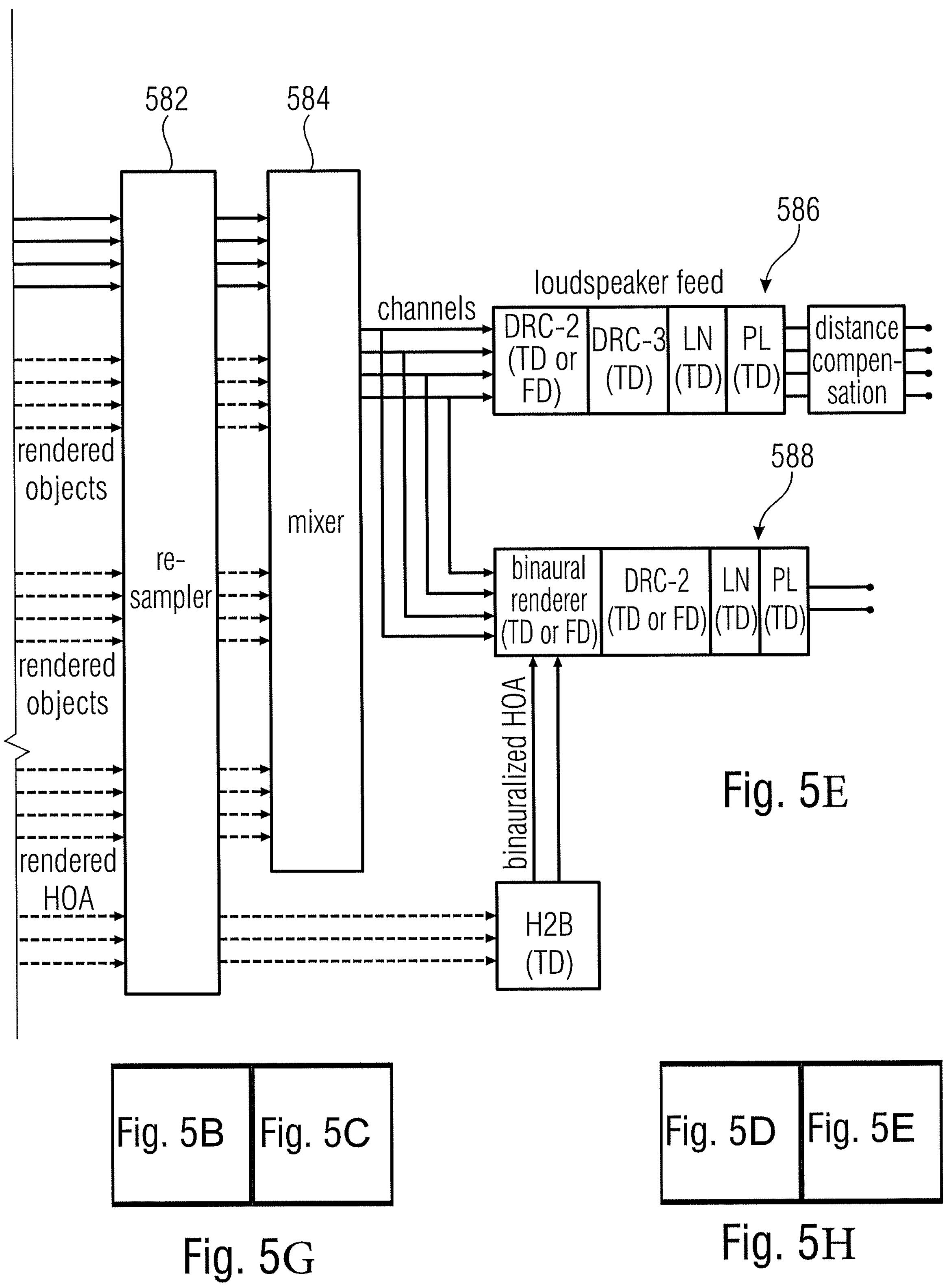
FIG. 5G illustrates how 5B and 5C fit together to show the first embedding of the audio post-processor (HREP) in the framework of an MPEG-H 3D audio decoder.
FIG. 5H illustrates how 5D and 5E fit together to show another embedding of the audio post-processor (HREP) in the framework of an MPEG-H 3D audio decoder.

FIG. 5C illustrates a further embedding of the audio post-processor (HREP) in the framework of an MPEG-H 3D audio decoder. In contrast to FIG. 5*b*, the HREP processing is also applied to the SAOC transport channels and/or to the HOA transport channels. The other functionalities in FIG. 5C are similar to those in FIG. 5B.

It is to be noted that attached claims related to the band extractor apply for the band extractor in the audio post-processor and the audio pre-processor as well even when a claim is only provided for a post-processor in one of the post-processor or the pre-processor. The same is valid for the high band processor and the combiner.

Particular reference is made to the further embodiments illustrated in the Annex and in the Annex A.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The inventive encoded audio signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

The apparatus described herein may be implemented using a hardware apparatus, or using a computer, or using a combination of a hardware apparatus and a computer.

The methods described herein may be performed using a hardware apparatus, or using a computer, or using a combination of a hardware apparatus and a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

Annex

Description of a Further Embodiment of HREP in MPEG-H 3D Audio

High Resolution Envelope Processing (HREP) is a tool for improved perceptual coding of signals that predominantly consist of many dense transient events, such as applause, rain drop sounds, etc. These signals have traditionally been very difficult to code for MPEG audio codecs, particularly at low bitrates. Subjective tests have shown a significant improvement of around 12 MUSHRA points by HREP processing at 48 kbps stereo.

Executive Summary

The HREP tool provides improved coding performance for signals that contain densely spaced transient events, such as applause signals as they are an important part of live recordings. Similarly, raindrops sound or other sounds like fireworks can show such characteristics. Unfortunately, this class of sounds presents difficulties to existing audio codecs, especially when coded at low bitrates and/or with parametric coding tools.

FIG. 100 depicts the signal flow in an HREP equipped codec. At the encoder side, the tool works as a preprocessor that temporally flattens the signal for high frequencies while generating a small amount of side information (1-4 kbps for stereo signals). At the decoder side, the tool works as a postprocessor that temporally shapes the signal for high frequencies, making use of the side information. The benefits of applying HREP are two-fold: HREP relaxes the bitrate demand imposed on the encoder by reducing short time dynamics of the input signal; additionally, HREP ensures proper envelope restauration in the decoder's (up-) mixing stage, which is all the more important if parametric multi-channel coding techniques have been applied within the codec.

FIG. 100: Overview of signal flow in an HREP equipped codec.

The HREP tool works for all input channel configurations (mono, stereo, multi-channel including 3D) and also for audio objects.

In the core experiment, we present MUSHRA listening test results, which show the merit of HREP for coding applause signals. Significant improvement in perceptual quality is demonstrated for the following test cases 7 MUSHRA points average improvement for 5.1 channel at 128 kbit/s 12 MUSHRA points average improvement for stereo 48 kbit/s 5 MUSHRA points average improvement for stereo 128 kbit/s Exemplary, through assessing the perceptual quality for 5.1ch signals employing the full well-known MPEG Surround test set, we prove that the quality of non-applause signals is not impaired by HREP.

Detailed Description of HREP

FIG. 100 depicts the signal flow in an HREP equipped codec. At the encoder side, the tool works as a preprocessor with high temporal resolution before the actual perceptual audio codec by analyzing the input signal, attenuating and thus temporally flattening the high frequency part of transient events, and generating a small amount of side information (1-4 kbps for stereo signals). An applause classifier may guide the encoder decision whether or not to activate HREP. At the decoder side, the tool works as a postprocessor after the audio codec by boosting and thus temporally shaping the high frequency part of transient events, making use of the side information that was generated during encoding.

FIG. 9C: Detailed HREP signal flow in the encoder.

FIG. 9C displays the signal flow inside the HREP processor within the encoder. The preprocessing is applied by splitting the input signal into a low pass (LP) part and a high pass (HP) part. This is accomplished by using FFT to compute the LP part, Given the LP part, the HP part is obtained by subtraction in time domain. A time-dependent scalar gain is applied to the HP part, which is added back to the LP part to create the preprocessed output.

The side information comprises low pass (LP) shape information and scalar gains that are estimated within an HREP analysis block (not depicted). The HREP analysis block may contain additional mechanisms that can gracefully lessen the effect of HREP processing on signal content ("non-applause signals") where HREP is not fully applicable. Thus, the requirements on applause detection accuracy are considerably relaxed.

FIG. 5A: Detailed HREP signal flow in the decoder.

The decoder side processing is outlined in Fig. The side information on HP shape information and scalar gains are parsed from the bit stream (not depicted) and applied to the signal resembling a decoder post-processing inverse to that of the encoder pre-processing. The post-processing is applied by again splitting the signal into a low pass (LP) part and a high pass (HP) part. This is accomplished by using FFT to compute the LP part, Given the LP part, the HP part is obtained by subtraction in time domain. A scalar gain dependent on transmitted side information is applied to the HP part, which is added back to the LP part to create the preprocessed output.

All HREP side information is signaled in an extension payload and embedded backward compatibly within the MPEG-H 3DAudio bit stream.

Specification Text

The WD changes, the proposed bit stream syntax, semantics and a detailed description of the decoding process can be found in the Annex A of the document as a diff-text.

Complexity

The computational complexity of the HREP processing is dominated by the calculation of the DFT/IDFT pairs that implement the LP/HP splitting of the signal. For each audio frame comprising 1024 time domain values, 16 pairs of 128-point real valued DFT/IDFTs have to be calculated.

For inclusion into the low complexity (LC) profile, we propose the following restrictions Limitation of active HREP channels/objects Limitation to the maximum transmitted gain factors g(k) that are non-trivial (trivial gain factors of 0 dB alleviate the need for an associated DFT/IDFT pair)

Calculation of the DFT/iDFT in an efficient split-radix 2 sparse topology

Evidence of Merit

Listening Tests

As an evidence of merit, listening test results will be presented for 5.1 channel loudspeaker listening (128 kbps). Additionally, results for stereo headphone listening at medium (48 kbps) and high (128 kbps) quality are provided. FIG. 16 summarizes the listening test setups.

FIG. 16—Listening tests overview.

Results 128 kbps 5.1ch

Error! Reference source not found. shows the absolute MUSHRA scores of the 128 kbps 5.1ch test. Perceptual quality is in the "good" to "excellent" range. Note that applause-like signals are among the lowest-scoring items in the range "good".

FIG. 17A: Absolute MUSHRA scores for 128 kbps 5.1ch test.

FIG. 17*b* depicts the difference MUSHRA scores of the 128 kbps 5.1ch test. All applause items exhibit a significant improvement, whereas no significant change in perceptual quality is observed for the non-applause items. None of the items is significantly degraded.

FIG. 17B: Difference MUSHRA scores for 128 kbps 5.1ch test.

FIG. 17C depicts the absolute MUSHRA scores for all applause items contained in the test set and FIG. 17D depicts the difference MUSHRA scores for all applause items contained in the test set. Absolute perceptual quality is in the "good" range. In the differences, overall, there is a significant gain of 7 points. Individual quality gains range between 4 and 9 points, all being significant.

FIG. 17C: Absolute MUSHRA scores for 128 kbps 5.1ch test applause signals.

FIG. 17D: Difference MUSHRA scores for 128 kbps 5.1ch test applause signals.

48 Kbps Stereo

FIG. 17E shows the absolute MUSHRA scores of the 48 kbps stereo test. Here, all signals of the set are applause signals. Perceptual quality is in the "fair" to "good" range. Consistently, the "hrep" condition scores higher than the "nohrep" condition. FIG. 17F depicts the difference MUSHRA scores. For all items except one, "hrep" scores significantly better than "nohrep". Improvements ranging from 3 to 17 points are observed. Overall, there is a significant average gain of 12 points. None of the items is significantly degraded.

FIG. 17E: Absolute MUSHRA scores for 48 kbps stereo test.

FIG. 17F: Difference MUSHRA scores for 48 kbps stereo test.

128 Kbps Stereo

FIG. 17G and FIG. 17H show the absolute and the difference MUSHRA scores of the 128 kbps stereo test, respectively. In the absolute scores, all signals score in the range "excellent". In the differences scores it can be seen that, even though perceptual quality is near transparent, for 6 out of 8 signals there is a significant improvement of 3 to 9 points, overall amounting to a mean of 5 MUSHRA points. None of the items is significantly degraded.

FIG. 17G: Absolute MUSHRA scores for 128 kbps stereo test.

FIG. 17H: Difference MUSHRA scores for 128 kbps stereo test.

The results clearly show that the HREP technology of the CE proposal is of significant merit for the coding of applause-like signals in a large range of bitrates/absolute qualities. Moreover, it is proven that there is no impairment whatsoever on non-applause signals.

Conclusion

HPREP is a tool for improved perceptual coding of signals that predominantly consist of many dense transient events, such as applause, rain drop sounds, etc. The benefits of applying HREP are two-fold: HREP relaxes the bitrate demand imposed on the encoder by reducing short time dynamics of the input signal; additionally, HREP ensures proper envelope restoration in the decoders (up)mixing stage, which is all the more important if parametric multi-channel coding techniques have been applied within the codec. Subjective tests have shown an improvement of around 12 MUSHRA points by HREP processing at 48 kbps stereo, and 7 MUSHRA points at 128 kbps 5.1ch.

Annex A

Embodiment of HREP within MPEG-H 3D Audio

Subsequently, data modifications for changes involved for HREP relative to ISO/IEC 23008-3:2015 and ISO/IEC 23008-3:2015/EAM3 documents are given.

Add the following line to Table 1, "MPEG-H 3DA functional blocks and internal processing domain. $f_{s,core}$ denotes the core decoder output sampling rate, $f_{s,out}$ denotes the decoder output sampling rate.", in Section 10.2:

TABLE 1

MPEG-H 3DA functional blocks and internal processing domain. $f_{s,\ core}$ denotes the core decoder output sampling rate, $f_{s,\ out}$ denotes the decoder output sampling rate.

| Processing Context | Functional Block | | Processing Domain | Delay Samples [1/$f_{s,\ core}$] or [1/$f_{s,\ out}$] | Contribution to Maximum Delay High Profile Samples [1/$f_{s,\ out}$] | Contribution to Maximum Delay Low Complexity Profile Samples [1/$f_{s,\ out}$] |
|---|---|---|---|---|---|---|
| Audio Core | HREP | | TD, Core frame length = 1024 | 64 | | 64 * $RSR_{max}$ |
| | | QMF-Synthesis and QMF-Analysis pair and alignment to 64 sample grid | FD TD FD | 64 + 257 + 320 + 63 | (64 + 257 + 320 + 63) * $RSR_{max}$ | |

Add the following Case to Table 13, "Syntax of mpegh3daExtElementConfig( )", in Section 5.2.2.3:

TABLE 13

Syntax of mpegh3daExtElementConfig( )

```
...
    case ID_EXT_ELE_HREP:
        HREPConfig(current_signal_group);
        break;
...
```

Add the following value definition to Table 50, "Value of usacExtElementType", in Section 5.3.4:

TABLE 50

| Value of usacExtElementType | |
|---|---|
| ID_EXT_ELE_HREP | 12 |
| /* reserved for ISO use */ | 13-127 |

Add the following interpretation to Table 51, "Interpretation of data blocks for extension payload decoding", in Section 5.3.4:

TABLE 51

| Interpretation of data blocks for extension payload decoding | |
|---|---|
| ID_EXT_ELE_HREP | HREPFrame(outputFrameLength, current_signal_group) |

Add new subclause at the end of 5.2.2 and add the following Table:

5.2.2.X Extension Element Configurations

TABLE 2

Syntax of HREPConfig( )

| Syntax | No. of bits | Mnemonic |
|---|---|---|
| HREPConfig(current__signal__group) | | |
| { | | |
| signal__type = signalGroupType[current__signal__group]; | | |
| signal__count = bsNumberOfSignals[current__signal__group] + 1; | | |
| if (signal__type == SignalGroupTypeChannels) { | | |
| channel__layout = audioChannelLayout[current__signal__group]; | | |
| } | | |
| extendedGainRange; | 1 | uimsbf |
| extendedBetaFactorPrecision; | 1 | uimsbf |
| for (sig = 0; sig < signal__count; sig++) { | NOTE 1 | |
| if ((signal__type == SignalGroupTypeChannels) && isLFEChannel(channel__layout, sig)) { | | |
| isHREPActive[sig] = 0; | | |
| } else { | | |
| isHREPActive[sig]; | 1 | uimsbf |
| } | | |
| if (isHREPActive[sig]) { | | |
| if (sig == 0) { | NOTE 2 | |
| lastFFTLine[0]; | 4 | uimsbf |
| transitionWidthLines[0]; | 4 | uimsbf |
| defaultBetaFactorIdx[0]; | nBitsBeta | uimsbf |
| } else { | NOTE 3 | |
| if (useCommonSettings) { | 1 | uimsbf |
| lastFFTLine[sig] = lastFFTLine[0]; | | |
| transitionWidthLines[sig] = transitionWidthLines[0]; | | |
| defaultBetaFactorIdx[sig] = defaultBetaFactorIdx[0]; | | |
| } else { | | |
| lastFFTLine[sig]; | 4 | uimsbf |
| transitionWidthLines[sig]; | 4 | uimsbf |
| defaultBetaFactorIdx[sig]; | nBitsBeta | uimsbf |
| } | | |
| } | | |
| } | | |
| } | | |
| } | | |

NOTE 1:
The helper function isLFEChannel(channel__layout, sig) returns 1 if the channel on position sig in channel__layout is a LFE channel or 0 otherwise.
NOTE 3:
nBitsBeta = 3 + extendedBetaFactorPrecision.

At the end of 5.2.2.3 add the following Tables:

TABLE 3

Syntax of HREPFrame( )

| Syntax | No. of bits | Mnemonic |
|---|---|---|
| HREPFrame(outputFrameLength, current__signal__group) | | |
| { | | |
| gain__count = outputFrameLength / 64; | | |
| signal__count = bsNumberOfSignals[current__signal__group] + 1; | | |
| useRawCoding; | 1 | uimsbf |
| if (useRawCoding) { | | |
| for (pos = 0; pos < gain__count; pos++) { | | |
| for (sig = 0; sig < signal__count; sig++) { | NOTE 1 | |
| if (isHREPActive[sig] == 0) continue; | | |
| gainIdx[pos][sig]; | nBitsGain | uimsbf |
| } | | |
| } | | |
| } else { | | |
| HREP__decode__ac__data(gain__count, signal__count); | | |

TABLE 3-continued

Syntax of HREPFrame( )

| Syntax | No. of bits | Mnemonic |
| --- | --- | --- |
| } | | |
| for (sig = 0; sig < signal__count; sig++) { | | |
| if (isHREPActive[sig] == 0) continue; | | |
| all__zero = 1; /* all gains are zero for the current channel */ | | |
| for (pos = 0; pos < gain__count; pos++) { | | |
| if (gainIdx[pos][sig] != GAIN__INDEX__0dB) { | | |
| all__zero = 0; | | |
| break; | | |
| } | | |
| } | | |
| if (all__zero == 0) { | | |
| useDefaultBetaFactorIdx; | 1 | uimsbf |
| if (useDefaultBetaFactorIdx) { | | |
| betaFactorIdx[sig] = defaultBetaFactorIdx[sig]; | | |
| } else { | | |
| betaFactorIdx[sig]; | nBitsBeta | uimsbf |
| } | | |
| } | | |
| } | | |
| } | | |

NOTE 1:
nBitsGain = 3 + extendedGainRainge.

The helper function HREP_decode_ac_data(gain_count, signal_count) describes the reading of the gain values into the array gainIdx using the following USAC low-level arithmetic coding functions:

```
arith__decode(*ari__state, cum__freq, cfl),
arith__start__decoding(*ari__state),
arith__done__decoding(*ari__state).
Two additional helper functions are introduced,
ari__decode__bit__with__prob(*ari__state, count__0, count__total),
which decodes one bit with p0 = count__0/total__count and = 1 − p0, and
ari__decode__bit(*ari__state),
which decodes one bit without modeling, with p0 = 0.5 and p1 = 0.5.
ari__decode__bit__with__prob(*ari__state, count__0, count__total)
{
    prob__scale = 1 << 14;
    tbl[0] = probScale − (count__0 * prob__scale) / count__total;
    tbl[1] = 0;
    res = arith__decode(ari__state, tbl, 2);
    return res;
}
ari__decode__bit(*ari__state)
{
    prob__scale = 1 << 14;
    tbl[0] = prob__scale >> 1;
    tbl[1] = 0;
    res = arith__decode(ari__state, tbl, 2);
    return res;
}
HREP__decode__ac__data(gain__count, signal__count)
{
    cnt__mask[2] = {1, 1};
    cnt__sign[2] = {1, 1};
    cnt__neg[2] = {1,1};
    cnt__pos[2] = {1,1};
    arith__start__decoding(&ari__state);
    for (pos = 0; pos < gain__count; pos++) {
        for (sig = 0; sig < signal__count; sig++) {
            if (!isHREPActive[sig]) {
                continue;
            }
            mask__bit = ari__decode__bit__with__prob(&ari__state, cnt__mask[0],
cnt__mask[0] + cnt__mask[1]);
            cnt__mask[mask__bit]++;
            if (mask__bit) {
                sign__bit = ari__decode__bit__with__prob(&ari__state, cnt__sign[0], cnt__sign[0]
```

-continued

```
+ cnt_sign[1]);
                    cnt_sign[sign_bit] += 2;
                    if (sign_bit) {
                        large_bit = ari_decode_bit_with_prob(&ari_state, cnt_neg[0],
cnt_neg[0] + cnt_neg[1]);
                        cnt_neg[large_bit] += 2;
                        last_bit = ari_decode_bit(&ari_state);
                        gainIdx[pos][sig] = -2 * large_bit - 2 + last_bit;
                    } else {
                        large_bit = ari_decode_bit_with_prob(&ari_state, cnt_pos[0],
cnt_pos[0] + cnt_pos[1]);
                        cnt_pos[large_bit] += 2;
                        if (large_bit) {
                            gainIdx[pos][sig] = 3;
                        } else {
                            last_bit = ari_decode_bit(&ari_state);
                            gainIdx[pos][sig] = 2 - last_bit;
                        }
                    }
                } else {
                    gainIdx[pos][sig] = 0;
                }
                if (extendedGainRange) {
                    prob_scale = 1 << 14;
                    esc_cnt = prob_scale / 5;
                    tbl_esc[5] = {prob_scale - esc_cnt, prob_scale - 2 * esc_cnt, prob_scale
- 3 * esc_cnt, prob_scale - 4 * esc_cnt, 0};
                    sym = gainIdx[pos][sig];
                    if (sym <= -4) {
                        esc = arith_decode(ari_state, tbl_esc, 5);
                        sym = -4 - esc;
                    } else if (sym >= 3) {
                        esc = arith_decode(ari_state, tbl_esc, 5);
                        sym = 3 + esc;
                    }
                    gainIdx[pos][sig] = sym;
                }
                gainIdx[pos][sig] += GAIN_INDEX_0dB;
            }
        }
    arith_done_decoding(&ari_state);
}
```

Add the following new subclauses "5.5.X High Resolution Envelope Processing (HREP) Tool" at the end of subclause 5.5:

5.5.X High Resolution Envelope Processing (HREP) Tool 5.5.X.1 Tool Description

The HREP tool provides improved coding performance for signals that contain densely spaced transient events, such as applause signals as they are an important part of live recordings. Similarly, raindrops sound or other sounds like fireworks can show such characteristics. Unfortunately, this class of sounds presents difficulties to existing audio codecs, especially when coded at low bitrates and/or with parametric coding tools.

FIG. 5*b* or 5*c* depicts the signal flow in an HREP equipped codec. At the encoder side, the tool works as a pre-processor that temporally flattens the signal for high frequencies while generating a small amount of side information (1-4 kbps for stereo signals). At the decoder side, the tool works as a post-processor that temporally shapes the signal for high frequencies, making use of the side information. The benefits of applying HREP are two-fold: HREP relaxes the bit rate demand imposed on the encoder by reducing short time dynamics of the input signal; additionally, HREP ensures proper envelope restauration in the decoder's (up-)mixing stage, which is all the more important if parametric multichannel coding techniques have been applied within the codec. The HREP tool works for all input channel configurations (mono, stereo, multi-channel including 3D) and also for audio objects.

5.5.X.2 Data and Help Elements

| | |
|---|---|
| current_signal_group | The current_signal_group parameter is based on the Signals3d( ) syntax element and the mpegh3daDecoderConfig( ) syntax element. |
| signal_type | The type of the current signal group, used to differentiate between channel signals and object, HOA, and SAOC signals. |
| signal_count | The number of signals in the current signal group. |
| channel_layout | In case the current signal group has channel signals, it contains the properties of speakers for each channel, used to identify LFE speakers. |
| extendedGainRange | Indicates whether the gain indexes use 3 bits (8 values) or 4 bits (16 values), as computed by nBitsGain. |
| extendedBetaFactorPrecision | Indicates whether the beta factor indexes use 3 bits or 4 bits, as computed by nBitsBeta. |

-continued

| | |
|---|---|
| isHREPActive[sig] | Indicates whether the tool is active for the signal on index sig in the current signal group. |
| lastFFTLine[sig] | The position of the last non-zero line used in the low-pass procedure implemented using FFT. |
| transitionWidthLines[sig] | The width in lines of the transition region used in the low-pass procedure implemented using FFT. |
| defaultBetaFactorIdx[sig] | The default beta factor index used to modify the gains in the gain compensation procedure. |
| outputFrameLength | The equivalent number of samples per frame, using the original sampling frequency, as defined in the USAC standard. |
| gain_count | The number of gains per signal in one frame. |
| useRawCoding | Indicates whether the gain indexes are coded raw, using nBitsGain each, or they are coded using arithmetic coding. |
| gainIdx[pos][sig] | The gain index corresponding to the block on position pos of the signal on position sig in the current signal group. If extendedGainRange = 0, the possible values are in the range {0, . . . , 7}, and if extendedGainRange = 1, the possible values are in the range {0, . . . , 15}. |
| GAIN_INDEX_0dB | The gain index offset corresponding to 0 dB, with a value of 4 being used if extendedGainRange = 0, and with a value of 8 being used if extendedGainRange = 1. The gain indexes are transmitted as unsigned values by adding GAIN_INDEX_0dB to their original signed data ranges. |
| all_zero | Indicates whether all the gain indexes in one frame for the current signal are having the value GAIN_INDEX_0dB. |
| useDefaultBetaFactorIdx | Indicates whether the beta factor index for the current signal has the default value specified by defaultBetaFactor[sig]. |
| betaFactorIdx[sig] | The beta factor index used to modify the gains in the gain compensation procedure. |

5.5.X.2.1 Limitations for Low Complexity Profile

If the total number of signals counted over all signal groups is at most 6 there are no limitations.

Otherwise, if the total number of signals where HREP is active, indicated by the isHREPActive[sig] syntax element in HREPConfig( ), and counted over all signal groups is at most 4, there are no further limitations.

Otherwise, the total number of signals where HREP is active, indicated by the isHREPActive[sig] syntax element in HREPConfig( ), and counted over all signal groups, shall be limited to at most 8.

Additionally, for each frame, the total number of gain indexes which are different than GAIN_INDEX_0 dB, counted for the signals where HREP is active and over all signal groups, shall be at most 4×gain_count. For the blocks which have a gain index equal with GAIN_INDEX_0 dB, the FFT, the interpolation correction, and the IFFT shall be skipped. In this case, the input block shall be multiplied with the square of the sine window and used directly in the overlap-add procedure.

5.5.X.3 Decoding Process 5.5.X.3.1 General

In the syntax element mpegh3daExtElementConfig( ) the field usacExtElementPayloadFrag shall be zero in the case of an ID_EXT_ELE_HREP element. The HREP tool is applicable only to signal groups of type SignalGroupTypeChannels and SignalGroupTypeObject, as defined by SignalGroupType[grp] in the Signals3d( ) syntax element. Therefore, the ID_EXT_ELE_HREP elements shall be present only for the signal groups of type SignalGroupTypeChannels and SignalGroupTypeObject.

The block size and correspondingly the FFT size used is N=128.

The entire processing is done independently on each signal in the current signal group. Therefore, to simplify notation, the decoding process is described only for one signal on position sig.

FIG. 5*a*: Block Diagram of the High Resolution Envelope Processing (HREP) Tool at Decoding Side 5.5.X.3.2 Decoding of Quantized Beta Factors The following lookup tables for converting beta factor index betaFactorIdx[sig] to beta factor beta_factor should be used, depending on the value of extended Beta FactorPrecision.

```
tab_beta_factor_dequant_coarse[8] = {
    0.000f, 0.035f, 0.070f, 0.120f, 0.170f, 0.220f, 0.270f, 0.320f
}
tab_beta_factor_dequant_precise[16] = {
    0.000f, 0.035f, 0.070f, 0.095f, 0.120f, 0.145f, 0.170f, 0.195f,
    0.220f, 0.245f, 0.270f, 0.295f, 0.320f, 0.345f, 0.370f, 0.395f
}
If extendedBetaFactorPrecision = 0, the conversion is computed as
beta_factor = tab_beta_factor_dequant_coarse[betaFactorIndex[sig]]
If extendedBetaFactorPrecision = 1, the conversion is computed as
beta_factor = tab_beta_factor_dequant_precise[betaFactorIndex[sig]]
```

5.5.X.3.3 Decoding of Quantized Gains

One frame is processed as gain_count blocks consisting of N samples each, which are half-overlapping. The scalar gains for each block are derived, based on the value of extendedGainRange.

$$g[k] = 2^{\frac{gainIdx[k][sig]-GAIN\_INDEX\_0dB}{4}}, \text{ for } 0 \le k < \text{gain\_count}$$

5.5.X.3.4 Computation of the LP Part and the HP Part

The input signal s is split into blocks of size N, which are half-overlapping, producing input blocks ib[k][i]=s[k×N/2+i], where k is the block index and i is the sample position in the block k. A window w[i] is applied to ib[k], in particular the sine window, defined as $$w[i] = \sin\frac{\pi(i+0.5)}{N}, \text{ for } 0 \le i < N,$$

and after also applying FFT, the complex coefficients c[k][f] are obtained as $$c[k][f] = FFT(w[i] \times ib[k]), \text{ for } 0 \le f \le \frac{N}{2}.$$

On the encoder side, in order to obtain the LP part, we apply an element-wise multiplication of c[k] with the processing shape ps[f], which consists of the following:

$$\text{ps}[f] = \begin{cases} 1, \text{ for } 0 \le f < \text{lp\_size} \\ 1 - \frac{f - \text{lp\_size} + 1}{\text{tr\_size} + 1}, \text{ for lp\_size} \le f < \text{lp\_size} + \text{tr\_size} \\ 0, \text{ for lp\_size} + \text{tr\_size} \le f \le \frac{N}{2} \end{cases}$$

The lp_size=lastFFTLine[sig]+1−transitionWidthLines[sig] parameter represents the width in FFT lines of the low-pass region, and the tr_size=transitionWidthLines[sig] parameter represents the width in FFT lines of the transition region.

On the decoder side, in order to get perfect reconstruction in the transition region, an adaptive reconstruction shape rs[f] in the transition region has to be used, instead of the processing shape ps[f] used at the encoder side, depending on the processing shape ps[f] and g[k] as $$rs[f] = 1 - (1 - \text{ps}[f]) \times \frac{g[k]}{1 + (g[k] - 1) \times (1 - \text{ps}[f])}$$

The LP block lpb[k] is obtained by applying IFFT and windowing again as $$\text{lpb}[k][i] = w[i] \times \text{IFFT}(rs[f] \times c[k][f]), \text{ for } 0 < i < N,$$

The HP block hpb[k] is then obtained by simple subtraction in time domain as $$\text{hpb}[k][i] = \text{in}[k][i] \times w^2[i] - \text{lpb}[k][i], \text{ for } 0 \le i < N.$$

5.5.X.3.5 Computation of the Interpolation Correction

The gains g[k−1] and g[k] applied on the encoder side to blocks on positions k−1 and k are implicitly interpolated due to the windowing and overlap-add operations. In order to achieve perfect reconstruction in the HP part above the transition region, an interpolation correction factor is needed as $$corr[j] = 1 + \left(\frac{g[k-1]}{g[k]} + \frac{g[k]}{g[k-1]} - 2\right) \times w^2[j] \times (1 - w^2[j]), \quad \text{for } 0 \le j < \frac{N}{2}.$$

$$corr\left[j + \frac{N}{2}\right] = 1 + \left(\frac{g[k]}{g[k+1]} + \frac{g[k+1]}{g[k]} - 2\right) \times w^2[j] \times (1 - w^2[j]), \quad \text{for } 0 \le j < \frac{N}{2}.$$

5.5.X.3.6 Computation of the Compensated Gains

The core encoder and decoder introduce additional attenuation of transient events, which is compensated by adjusting the gains g[k] using the previously computed beta_factor as $$\text{gc}[k] = (1 + \text{beta\_factor}) g[k] - \text{beta\_factor}$$

5.5.X.3.7 Computation of the Output Signal

Based on gc[k] and corr[i], the value of the output block ob[k] is computed as $$ob[k][i] = lpb[k][i] + \frac{1}{gc[k]} \times \frac{1}{corr[i]} \times hpb[k][i], \text{ for } 0 \le i < N$$

Finally, the output signal is computed using the output blocks using overlap-add as $$o\left[k \times \frac{N}{2} + j\right] = ob[k-1]\left[j + \frac{N}{2}\right] + ob[k][j], \text{ for } 0 \le j < \frac{N}{2}$$

$$o\left[(k+1) \times \frac{N}{2} + j\right] = ob[k]\left[j + \frac{N}{2}\right] + ob[k+1][j], \text{ for } 0 \le j < \frac{N}{2}$$

5.5.X.4 Encoder Description (Informative)

FIG. 9*c*: Block Diagram of the High Resolution Envelope Processing (HREP) Tool at Encoding Side 5.5.X.4.1 Computation of the Gains and of the Beta Factor At the pre-processing side, the HP part of block k, assumed to contain a transient event, is adjusted using the scalar gain g[k] in order to make it more similar to the background in its neighborhood. The energy of the HP part of block k will be denoted by hp_e[k] and the average energy of the HP background in the neighborhood of block k will be denoted by hp_bg_e[k].

We define the parameter $\alpha \in [0,1]$, which controls the amount of adjustment as $$g_{float}[k] = \begin{cases} \frac{\alpha \times \text{hp\_bg\_e}[k] + (1-\alpha) \times \text{hp\_e}[k]}{\text{hp\_e}[k]}, \text{ when hp\_e}[k] \ge T_{quiet} \\ 1, \text{ otherwise} \end{cases},$$

The value of $g_{float}$[k] is quantized and clipped to the range allowed by the chosen value of the extendedGainRange configuration option to produce the gain index gainIdx[k][sig] as $$g_{idx} = \lfloor \log_2(4 \times g_{float}[k]) + 0.5 \rfloor + \text{GAIN\_INDEX\_0 dB},$$

$$\text{gainIdx}[k][\text{sig}] = \min(\max(0, g_{idx}), 2 \times \text{GAIN\_INDEX\_0 dB} - 1).$$

The value g[k] used for the processing is the quantized value, defined at the decoder side as $$g[k] = 2^{\frac{gainIdx[k][sig] - GAIN\_INDEX\_0dB}{4}}.$$

When $\alpha$ is 0, the gain has value $g_{float}$[k]=1, therefore no adjustment is made, and when $\alpha$ is 1, the gain has value $g_{float}$[k]=hp_bg_e[k]/hp_e[k], therefore the adjusted energy is made to coincide with the average energy of the background. We can rewrite the above relation as $$g_{float}[k] \times \text{hp\_}e[k] = \text{hp\_bg\_}e[k] + (1-\alpha) \times (\text{hp\_}e[k] - \text{hp\_bg\_}e[k]),$$

indicating that the variation of the adjusted energy $g_{float}[k]\times$hp_e[k] around the corresponding average energy of the background hp_bg_e[k] is reduced with a factor of (1−α). In the proposed system, α=0.75 is used, thus the variation of the HP energy of each block around the corresponding average energy of the background is reduced to 25% of the original.

The core encoder and decoder introduce additional attenuation of transient events, which is approximately modeled by introducing an extra attenuation step, using the parameter β∈[0, 1] depending on the core encoder configuration and the signal characteristics of the frame, as $$gc_{float}[k]=\frac{\beta\times \text{hp\_bg\_e}[k]+(1-\beta)\times[g_{float}[k]\times \text{hp\_e}[k]]}{\text{hp\_e}[k]}$$

indicating that, after passing through the core encoder and decoder, the variation of the decoded energy $gc_{float}[k]\times$hp_e[k] around the corresponding average energy of the background hp_bg_e[k] is further reduced with an additional factor of (1−β).

Using just g[k], α, and β, it is possible to compute an estimate of gc[k] at the decoder side as $$gc[k]=\left(1+\frac{\beta\times(1-\alpha)}{\alpha}\right)\times g[k]-\frac{\beta\times(1-\alpha)}{\alpha}$$

The parameter $$\text{beta\_factor}=\frac{\beta\times(1-\alpha)}{\alpha}$$

is quantized to betaFactorIdx[sig] and transmitted as side information for each frame. The compensated gain gc[k] can be computed using beta_factor as $$gc[k]=(1+\text{beta\_factor})\times g[k]-\text{beta\_factor}$$

5.5.X.4.2 Computation of the LP Part and the HP Part

The processing is identical to the corresponding one at the decoder side defined earlier, except that the processing shape ps[f] is used instead of the adaptive reconstruction shape rs[f] in the computation of the LP block lpb[k], which is obtained by applying IFFT and windowing again as $$lpb[k][i]=w[i]\times \text{IFFT}(ps[f]\times c[k][f]),\ \text{for } 0<i<N.$$

5.5.X.4.3 Computation of the Output Signal

Based on g[k], the value of the output block ob[k] is computed as $$ob[k][i]=lpb[k][i]+g[k]\times hpb[k][i],\ \text{for } 0\le i<N.$$

Identical to the decoder side, the output signal is computed using the output blocks using overlap-add as $$o\left[k\times\frac{N}{2}+j\right]=ob[k-1]\left[j+\frac{N}{2}\right]+ob[k][j],\ \text{for } 0\le j<\frac{N}{2},$$

$$o\left[(k+1)\times\frac{N}{2}+j\right]=ob[k]\left[j+\frac{N}{2}\right]+ob[k+1][j],\ \text{for } 0\le j<\frac{N}{2}.$$

5.5.X.4.4 Encoding of Gains Using Arithmetic Coding

The helper function HREP_encode_ac_data(gain_count, signal_count) describes the writing of the gain values from the array gainIdx using the following USAC low-level arithmetic coding functions:

```
arith_encode(*ari_state, symbol, cum_freq),
arith_encoder_open(*ari_state),
arith_encoder_flush(*ari_state).
Two additional helper functions are introduced,
ari_encode_bit_with_prob(*ari_state, bit_value, count_0, count_total),
which encodes the one bit bit_value with p0 = count_0/total_count and p1 = 1 −
p0, and
ari_encode_bit(*ari_state, bit_value),
which encodes the one bit bit_value without modeling, with p0 = 0.5 and p1 = 0.5.
ari_encode_bit_with_prob(*ari_state, bit_value, count_0, count_total)
{
    prob_scale = 1 << 14;
    tbl[0] = prob_scale − (count_0 * prob_scale) / count_total;
    tbl[1] = 0;
    arith_encode(ari_state, bit_value, tbl);
}
ari_encode_bit(*ari_state, bit_value)
{
    prob_scale = 1 << 14;
    tbl[0] = prob_scale >> 1;
    tbl[1] = 0;
    ari_encode(ari_state, bit_value, tbl);
}
HREP_encode_ac_data(gain_count, signal_count)
{
    cnt_mask[2] = {1, 1};
    cnt_sign[2] = {1, 1};
    cnt_neg[2] = {1, 1};
    cnt_pos[2] = {1, 1};
    arith_encoder_open(&ari_state);
    for (pos = 0; pos < gain_count; pos++) {
        for (sig = 0; sig < signal_count; sig++) {
            if (!isHREPActive[sig]) {
                continue;
            }
```

-continued

```
            sym = gainIdx[pos][sig] − GAIN_INDEX_0dB;
            if (extendedGainRange) {
                sym_ori = sym;
                sym = max(min(sym_ori, GAIN_INDEX_0dB / 2 − 1), −GAIN_INDEX_0dB
/2);
            }
            mask_bit = (sym != 0);
            arith_encode_bit_with_prob(ari_state, mask_bit, cnt_mask[0], cnt_mask[0]
+ cnt_mask[1]);
            cnt_mask[mask_bit]++;
            if (mask_bit) {
                sign_bit = (sym < 0);
                arith_encode_bit_with_prob(ari_state, sign_bit, cnt_sign[0], cnt_sign[0] +
cnt_sign[1]);
                cnt_sign[sign_bit] += 2;
                if (sign_bit) {
                    large_bit = (sym < −2);
                    arith_encode_bit_with_prob(ari_state,     large_bit,     cnt_neg[0],
cnt_neg[0] + cnt_neg[1]);
                    cnt_neg[large_bit] += 2;
                    last_bit = sym & 1;
                    arith_encode_bit(ari_state, last_bit);
                } else {
                    large_bit = (sym > 2);
                    arith_encode_bit_with_prob(ari_state,     large_bit,     cnt_pos[0],
cnt_pos[0] + cnt_pos[1]);
                    cnt_pos[large_bit] += 2;
                    if (large_bit == 0) {
                        last_bit = sym & 1;
                        ari_encode_bit(ari_state, last_bit);
                    }
                }
            }
            if (extendedGainRange) {
                prob_scale = 1 << 14;
                esc_cnt = prob_scale / 5;
                tbl_esc[5] = {prob_scale − esc_cnt, prob_scale − 2 * esc_cnt, prob_scale
− 3 * esc_cnt, prob_scale − 4 * esc_cnt, 0};
                if (sym_ori <= −4) {
                    esc = −4 − sym_ori;
                    arith_encode(ari_state, esc, tbl_esc);
                } else if (sym_ori >= 3) {
                    esc = sym_ori − 3;
                    arith_encode(ari_state, esc, tbl_esc);
                }
        }
    }
    arith_encode_flush(ari_state);
}
```

The invention claimed is:

1. An audio post-processor for post-processing an audio signal comprising a time-variable high frequency gain information representing a side information of the audio signal, comprising:

a band extractor configured for extracting a high frequency band of the audio signal to obtain an extracted high frequency band comprising a block of high pass time domain values and configured for extracting a low frequency band of the block of time domain values of the audio signal to obtain an extracted low frequency band comprising a block of low pass time domain values;

a high band processor configured for performing a time-variable amplification of only the extracted high frequency band in accordance with the time-variable high frequency gain information to acquire a processed high frequency band, wherein the high band processor is configured to apply the time-variable amplification to each time domain value of the block of high pass time domain values using the high frequency gain information to obtain a block of modified high pass time domain values as the processed high frequency band; and a combiner configured for performing a sample-wise addition of the block of modified high pass time domain values and the block of low pass time domain values unmodified by the time-variable high frequency gain information, wherein the audio signal comprises an additional control parameter as a further side information, wherein the high band processor is configured to apply the time-variable amplification also under consideration of the additional control parameter, wherein a time resolution of the additional control parameter is lower than a time resolution of the time-varying frequency gain information.

2. The audio post-processor of claim 1, in which the band extractor is configured to extract the low frequency band using a low pass filter device and to extract the high frequency band by subtracting the extracted low frequency band from the block of time domain values of the audio signal.

3. The audio post-processor of claim 1, wherein the audio signal comprises a sequence of blocks of time domain values, the sequence of blocks comprising the block of time domain values and a further later block of time domain values, wherein the time-variable high frequency gain information is provided for the sequence of blocks of time domain values of the audio signal, wherein the block of time domain values has associated therewith a first gain information and a the further later block of time domain values of the audio signal has a different second gain information, wherein the band extractor is configured to extract, from the further later block of time domain values, a further block of low pass time domain values and a further block of high pass time domain values, and wherein the high band processor is configured to modify, in the applying the time-variable amplification, the block of high pass time domain values using the first gain information to acquire the processed block of high pass time domain values and to modify the further block of high pass time domain values using the second gain information to acquire a further processed block of high pass time domain values, and wherein the combiner is configured to combine the further later block of time domain values and the further processed block of high pass time domain values.

4. The audio post-processor of claim 1, wherein the band extractor and the high band processor and the combiner are configured to operate in overlapping blocks, and wherein the audio post-processor further comprises an overlap-adder configured for calculating time domain values of a post-processed portion by adding time domain values of a first combined block obtained by the sample-wise addition of the block of modified high pass time domain values and the block of low pass time domain values and time domain samples of a second combined block in a block overlap range.

5. An audio decoding apparatus, comprising:

an input interface configured for receiving an encoded audio signal comprising a core encoded signal, core side information and a time-variable high frequency gain information representing an additional side information;

a core decoder configured for decoding the core encoded signal using the core side information to acquire a decoded core signal; and a post-processor configured for post-processing the decoded core signal using the time-variable high frequency gain information, the post-processor comprising: a band extractor configured for extracting a high frequency band of a block of time domain values of the audio signal to obtain an extracted high frequency band comprising a block of high pass time domain values and configured for extracting a low frequency band of the block of time domain values of the audio signal to obtain an extracted low frequency band comprising a block of low pass time domain values;

a high band processor configured for performing a time-variable amplification of only the extracted high frequency band in accordance with the time-variable high frequency gain information to acquire a processed high frequency band, wherein the high band processor is configured to apply the time-variable amplification to each time domain value of the block of high pass time domain values using the high frequency gain information to obtain a block of modified high pass time domain values as the processed high frequency band; and a combiner configured for performing a sample-wise addition of the block of modified high pass time domain values and the block of low pass time domain values unmodified by the time-variable high frequency gain information, wherein the encoded audio signal comprises an additional control parameter as a further side information, wherein the high band processor is configured to apply the time-variable amplification also under consideration of the additional control parameter, wherein a time resolution of the additional control parameter is lower than a time resolution of the time-varying high frequency gain information.

6. A method of post-processing an audio signal comprising a time-variable high frequency gain information representing a side information of the audio signal, comprising:

extracting a high frequency band of a block of time domain values of the audio signal to obtain an extracted high frequency band comprising a block of high pass time domain values and extracting a low frequency band of the block of time domain values of the audio signal to obtain an extracted low frequency band comprising a block of low pass time domain values;

performing a time-variable amplification of only the extracted high frequency band in accordance with the time-variable high frequency gain information to acquire a processed high frequency band, wherein the performing the time-variable amplification comprises applying the time-variable amplification to each time domain value of the block of high pass time domain values using the high frequency gain information to obtain a block of modified high pass time domain values as the processed high frequency band; and performing a sample-wise addition of the block of modified high pass time domain values and the block of low pass time domain values unmodified by the time-variable high frequency gain information, wherein the audio signal comprises an additional control parameter as a further side information, wherein the performing a time-variable amplification comprises applying the time-variable amplification also under consideration of the additional control parameter, where in a time resolution of the additional control parameter is lower than a time resolution of the time-varying high frequency gain information.

7. A method of audio decoding, comprising:

receiving an encoded audio signal comprising a core encoded signal, core side information and a time-variable high frequency gain information representing an additional side information of the core encoded signal;

decoding the core encoded signal using the core side information to acquire a decoded core signal; and post-processing the decoded core signal using the time-variable high frequency gain information representing the additional side information with a method of post-processing the method of post-processing comprising: extracting a high frequency band of a block of time domain values of the decoded core signal to obtain an extracted high frequency band comprising a block of high pass time domain values and extracting a high frequency band of the block of time domain values of the audio signal to obtain an extracted low frequency band of the comprising a block of low pass time domain values; performing a time-variable amplification of only the extracted high frequency in accordance with the time-variable high frequency gain information to acquire a processed high frequency band, wherein the performing the time-variable amplification comprises applying the time-variable amplification to each time domain value of the block of high pass time domain values using the high frequency gain information to obtain a block of modified high pass time domain values as the processed high frequency band; and performing a sample-wise addition of the block of modified high pass time domain values and the block of low pass time domain values unmodified by the time-variable high frequency gain information, wherein the encoded audio signal comprises an additional control parameter as a further side information, wherein the performing a time-variable amplification comprises applying the time-variable amplification also under consideration of the additional control parameter, wherein a time resolution of the additional control parameter is lower than a time resolution of the time-varying high frequency gain.

8. A non-transitory digital storage medium having a computer program stored thereon to perform, when said computer program is run by a computer, a method of post-processing an audio signal comprising a time-variable high frequency gain information representing side information of the audio signal, comprising:

extracting a high frequency band of a block of time domain values of the audio signal to obtain an extracted high frequency band comprising a block of high pass time domain values and extracting a low frequency band of the block of time domain values of the audio signal to obtain an extracted low frequency band comprising a block of low pass time domain values;

performing a time-variable amplification of only the extracted high frequency band in accordance with the time-variable high frequency gain to acquire a processed high frequency band, wherein the performing the time-variable amplification comprises applying the time-variable amplification to each time domain value of the block of high pass time domain values using the high frequency gain information to obtain a block of modified high pass time domain values as the processed high frequency band; and performing a sample-wise addition of the block of modified high pass time domain values and the block of low pass time domain values unmodified by the time-variable high frequency gain information, wherein the audio signal comprises an additional control parameter as a further side information, wherein the performing a time-variable amplification comprises applying the time-variable amplification also under consideration of the additional control parameter, wherein a time resolution of the additional control parameter is lower than a time resolution of the time-varying high frequency gain information.

9. A non-transitory digital storage medium having a computer program stored thereon to perform, when said computer program is run by a computer, a method of audio decoding, the method of audio decoding comprising:

receiving an encoded audio signal comprising a core encoded signal, core side information and a time-variable high frequency gain information representing additional side information of the core encoded signal;

decoding the core encoded signal using the core side information to acquire a decoded core signal; and post-processing the decoded core signal using the time-variable high frequency gain information in accordance with a method of post-processing the method of post-processing comprising: extracting a high frequency band of a block of time domain values of the audio signal to obtain an extracted high frequency band comprising a block of high pass time domain values and extracting a low frequency band of the block of time domain values of the audio signal to obtain an extracted low frequency band comprising a block of low pass time domain values; performing a time-variable amplification of only the extracted high frequency band in accordance with the time-variable high frequency gain information to acquire a processed high frequency band, wherein the performing the time-variable amplification comprises applying the time-variable amplification to each time domain value of the block of high pass time domain values using the high frequency gain information to obtain a block of modified high pass time domain values as the processed high frequency band; and performing a sample-wise addition of the block of low pass time domain values and the block of low pass time domain values unmodified by the time variable high frequency gain information, wherein the encoded audio signal comprises an additional control parameter as a further side information, wherein the performing a time-variable amplification comprises applying the time-variable amplification also under consideration of the additional control parameter, wherein a time resolution of the additional control parameter is lower than a time resolution of the time-varying high frequency gain information.

* * * * *